United States Patent
Cui et al.

(10) Patent No.: US 10,580,783 B2
(45) Date of Patent: Mar. 3, 2020

(54) MULTI-TIER THREE-DIMENSIONAL MEMORY DEVICE CONTAINING DIFFERENTIAL ETCH RATE FIELD OXIDES AND METHOD OF MAKING THE SAME

(71) Applicant: SANDISK TECHNOLOGIES LLC, Plano, TX (US)

(72) Inventors: Zhixin Cui, Yokkaichi (JP); Hiroshi Minakata, Yokkaichi (JP); Keigo Kitazawa, Yokkaichi (JP); Yoshiyuki Okura, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/909,073

(22) Filed: Mar. 1, 2018

(65) Prior Publication Data
US 2019/0273088 A1  Sep. 5, 2019

(51) Int. Cl.
*H01L 27/11556* (2017.01)
*H01L 27/11529* (2017.01)
(Continued)

(52) U.S. Cl.
CPC .... *H01L 27/11556* (2013.01); *H01L 23/5283* (2013.01); *H01L 27/11519* (2013.01);
(Continued)

(58) Field of Classification Search
CPC ......... H01L 27/11524; H01L 27/11529; H01L 27/11551–1156; H01L 27/11578–11582;
(Continued)

(56) References Cited

U.S. PATENT DOCUMENTS

| 5,716,890 A | * | 2/1998 | Yao | .................. | H01L 21/02129 257/634 |
| 6,531,728 B2 | | 3/2003 | DeBoer et al. | | |

(Continued)

OTHER PUBLICATIONS

S.K. Ghandhi, VLSI Fabrication Principles, 1994, John Wiley & Sons, Inc, 2nd Edition, pp. 530-532 (Year: 1994).*

(Continued)

*Primary Examiner* — Nelson Garces
(74) *Attorney, Agent, or Firm* — The Marbury Law Group PLLC

(57) ABSTRACT

A three-dimensional memory device includes a first-tier structure containing a first alternating stack of first insulating layers and first electrically conductive layers that has first stepped surfaces, and a first retro-stepped dielectric material portion contacting the first stepped surfaces of the first alternating stack, and a second-tier structure containing a second alternating stack of second insulating layers and second electrically conductive layers that has second stepped surfaces, and a second retro-stepped dielectric material portion contacting the second stepped surfaces of the second alternating stack. The first retro-stepped dielectric material portion has a higher etch rate than the second retro-stepped dielectric material portion. Memory stack structures vertically extend through the first alternating stack and the second alternating stack. Each of the memory stack structures includes a memory film and a vertical semiconductor channel.

16 Claims, 37 Drawing Sheets

(51) Int. Cl.
  *H01L 27/11573* (2017.01)
  *H01L 23/528* (2006.01)
  *H01L 27/11582* (2017.01)
  *H01L 27/11519* (2017.01)
  *H01L 27/11565* (2017.01)
  *H01L 29/788* (2006.01)

(52) U.S. Cl.
  CPC .. *H01L 27/11529* (2013.01); *H01L 27/11565* (2013.01); *H01L 27/11573* (2013.01); *H01L 27/11582* (2013.01); *H01L 29/7883* (2013.01)

(58) Field of Classification Search
  CPC ........... H01L 23/5283; H01L 27/11519; H01L 27/11565; H01L 27/11573; H01L 29/7883
  See application file for complete search history.

(56) References Cited

U.S. PATENT DOCUMENTS

| | | | |
|---|---|---|---|
| 6,958,263 | B2 | 10/2005 | Bhattacharyya |
| 6,972,223 | B2 | 12/2005 | Weimer et al. |
| 7,294,567 | B2 | 11/2007 | Rudeck |
| 7,791,955 | B2 | 9/2010 | Ratnakumar et al. |
| 7,835,184 | B2 | 11/2010 | Ratnakumar et al. |
| 7,858,972 | B2 | 12/2010 | Tokunaga et al. |
| 7,883,958 | B2 | 2/2011 | Park |
| 7,999,330 | B2 | 8/2011 | Hu |
| 8,143,146 | B2 | 3/2012 | Kiyotoshi |
| 8,203,142 | B2 | 6/2012 | Tokunaga et al. |
| 8,309,958 | B2 | 11/2012 | Hirota et al. |
| 8,664,631 | B2 | 3/2014 | Hirota et al. |
| 8,686,488 | B2 | 4/2014 | Kondo et al. |
| 8,817,512 | B2 | 8/2014 | Kono |
| 9,019,767 | B2 | 4/2015 | Aritome et al. |
| 9,036,400 | B2 | 5/2015 | Lu |
| 9,047,937 | B2 | 6/2015 | Kang et al. |
| 9,053,977 | B2 | 6/2015 | Choi et al. |
| 9,076,865 | B2 | 7/2015 | Lee et al. |
| 9,117,700 | B2 | 8/2015 | Oh et al. |
| 9,236,392 | B1 | 1/2016 | Izmi et al. |
| 9,286,988 | B2 | 3/2016 | Aritome et al. |
| 9,362,299 | B2 | 6/2016 | Choi et al. |
| 9,368,219 | B1 | 6/2016 | Aritome et al. |
| 9,401,309 | B2 | 7/2016 | Izumi et al. |
| 9,412,753 | B2 | 8/2016 | Izumi et al. |
| 9,449,983 | B2 | 9/2016 | Yada et al. |
| 9,524,901 | B2 | 12/2016 | Izumi et al. |
| 9,601,502 | B2 | 3/2017 | Sano et al. |
| 9,735,156 | B1 | 8/2017 | Cha |
| 9,780,170 | B2 | 10/2017 | Ota et al. |
| 9,837,431 | B2 | 12/2017 | Nishikawa et al. |
| 9,876,027 | B2 | 1/2018 | Yada et al. |
| 9,905,664 | B2 | 2/2018 | Namkoong et al. |
| 2001/0038111 | A1 | 11/2001 | DeBoer et al. |
| 2002/0016038 | A1 | 2/2002 | Jung et al. |
| 2002/0043681 | A1 | 4/2002 | Tsu et al. |
| 2002/0074656 | A1 | 6/2002 | Ujiie et al. |
| 2002/0114179 | A1 | 8/2002 | Hsu et al. |
| 2002/0132397 | A1 | 9/2002 | Weimer et al. |
| 2003/0008451 | A1 | 1/2003 | Hsu et al. |
| 2003/0054623 | A1 | 3/2003 | Weimer et al. |
| 2003/0170954 | A1 | 9/2003 | Rudeck |
| 2004/0084716 | A1 | 5/2004 | Hung et al. |
| 2004/0094810 | A1 | 5/2004 | Maldei et al. |
| 2004/0121536 | A1 | 6/2004 | Hung et al. |
| 2004/0124453 | A1 | 7/2004 | Kim et al. |
| 2004/0129670 | A1 | 7/2004 | Kweon et al. |
| 2004/0156233 | A1 | 8/2004 | Bhattacharyya |
| 2004/0262655 | A1 | 12/2004 | Kweon |
| 2005/0006683 | A1 | 1/2005 | Kim et al. |
| 2005/0047251 | A1 | 3/2005 | Bhattacharyya |
| 2005/0124095 | A1 | 6/2005 | Liaw |
| 2005/0130352 | A1 | 6/2005 | Maldei et al. |
| 2005/0263763 | A1 | 12/2005 | Bhattacharyya |
| 2006/0014307 | A1 | 1/2006 | Kweon |
| 2006/0051911 | A1 | 3/2006 | Gu et al. |
| 2006/0292786 | A1 | 12/2006 | Hu |
| 2007/0173018 | A1 | 7/2007 | Aritome |
| 2008/0079046 | A1 | 4/2008 | Ozaki |
| 2008/0083830 | A1 | 4/2008 | Tokunaga et al. |
| 2008/0157127 | A1 | 7/2008 | Bertin et al. |
| 2008/0157257 | A1 | 7/2008 | Bertin et al. |
| 2008/0160734 | A1 | 7/2008 | Bertin et al. |
| 2008/0170429 | A1 | 7/2008 | Bertin et al. |
| 2008/0225601 | A1 | 9/2008 | Ratnakumar et al. |
| 2008/0237690 | A1 | 10/2008 | Anezaki et al. |
| 2008/0273392 | A1 | 11/2008 | Ratnakumar et al. |
| 2008/0273401 | A1 | 11/2008 | Ratnakumar et al. |
| 2009/0014772 | A1 | 1/2009 | Ratnakumar et al. |
| 2009/0184389 | A1 | 7/2009 | Bertin et al. |
| 2009/0194839 | A1 | 8/2009 | Bertin et al. |
| 2009/0256211 | A1 | 10/2009 | Booth, Jr. et al. |
| 2009/0294751 | A1 | 12/2009 | Kiyotoshi |
| 2010/0108974 | A1 | 5/2010 | Park |
| 2011/0031544 | A1 | 2/2011 | Ozaki |
| 2011/0089475 | A1 | 4/2011 | Tokunaga et al. |
| 2011/0227025 | A1 | 9/2011 | Hirota et al. |
| 2012/0108022 | A1 | 5/2012 | Anezaki et al. |
| 2012/0213009 | A1 | 8/2012 | Aritome et al. |
| 2012/0235107 | A1 | 9/2012 | Hirota et al. |
| 2012/0320651 | A1 | 12/2012 | Kono |
| 2013/0075683 | A1 | 3/2013 | Fowler et al. |
| 2013/0107602 | A1 | 5/2013 | Oh et al. |
| 2013/0113033 | A1 | 5/2013 | Choi et al. |
| 2013/0128653 | A1 | 5/2013 | Kang et al. |
| 2013/0240970 | A1 | 9/2013 | Kondo et al. |
| 2013/0270568 | A1 | 10/2013 | Rabkin et al. |
| 2014/0054539 | A1 | 2/2014 | Lu |
| 2014/0056080 | A1 | 2/2014 | Lee et al. |
| 2014/0363980 | A1 | 12/2014 | Kawamata et al. |
| 2015/0011094 | A1 | 1/2015 | Narishige et al. |
| 2015/0024587 | A1 | 1/2015 | Kim et al. |
| 2015/0155290 | A1 | 6/2015 | Takekida et al. |
| 2015/0206591 | A1 | 7/2015 | Aritome et al. |
| 2015/0236037 | A1 | 8/2015 | Choi et al. |
| 2015/0287710 | A1 | 10/2015 | Yun et al. |
| 2015/0318380 | A1 | 11/2015 | Rabkin et al. |
| 2015/0340376 | A1 | 11/2015 | Park et al. |
| 2016/0049423 | A1 | 2/2016 | Yoo et al. |
| 2016/0071861 | A1 | 3/2016 | Serov et al. |
| 2016/0111436 | A1 | 4/2016 | Ding et al. |
| 2016/0111441 | A1 | 4/2016 | Park et al. |
| 2016/0155511 | A1 | 6/2016 | Aritome et al. |
| 2016/0172369 | A1 | 6/2016 | Hu et al. |
| 2016/0293618 | A1 | 10/2016 | Namkoong et al. |
| 2016/0293625 | A1 | 10/2016 | Kang et al. |
| 2016/0307917 | A1 | 10/2016 | Yada et al. |
| 2016/0315095 | A1 | 10/2016 | Sel et al. |
| 2016/0322381 | A1* | 11/2016 | Liu .................. H01L 27/11573 |
| 2016/0336067 | A1 | 11/2016 | Bertin et al. |
| 2016/0343799 | A1 | 11/2016 | Yi et al. |
| 2016/0351577 | A1 | 12/2016 | Sun |
| 2016/0365453 | A1 | 12/2016 | Kim et al. |
| 2017/0012051 | A1 | 1/2017 | Lee et al. |
| 2017/0040416 | A1 | 2/2017 | Ota et al. |
| 2017/0077128 | A1 | 3/2017 | Uchiyama |
| 2017/0125597 | A1 | 5/2017 | Kim et al. |
| 2017/0148800 | A1 | 5/2017 | Nishikawa et al. |
| 2017/0148805 | A1 | 5/2017 | Nishikawa et al. |
| 2017/0148808 | A1 | 5/2017 | Nishikawa et al. |
| 2017/0213823 | A1 | 7/2017 | Cha |
| 2017/0256558 | A1 | 9/2017 | Zhang et al. |
| 2017/0278859 | A1 | 9/2017 | Sharangpani et al. |
| 2017/0278936 | A1 | 9/2017 | Namkoong et al. |
| 2018/0025779 | A1 | 1/2018 | Bertin et al. |

OTHER PUBLICATIONS

U.S. Appl. No. 15/638,672, filed Jun. 30, 2017, Sandisk Technologies LLC.
U.S. Appl. No. 15/863,205, filed Jan. 5, 2018, Sandisk Technologies LLC.

(56) References Cited

OTHER PUBLICATIONS

Gualandris, G. et al., "Some Etch Properties of Doped and Undoped Silicon Oxide Films Formed by Atmospheric Pressure and Plasma-Activated Chemical Vapor Deposition," Journal of Vacuum Science & Technology B: Microelectronics Processing and Phenomenak, vol. 3, No. 6, pp. 1604-1608 (1985).

\* cited by examiner

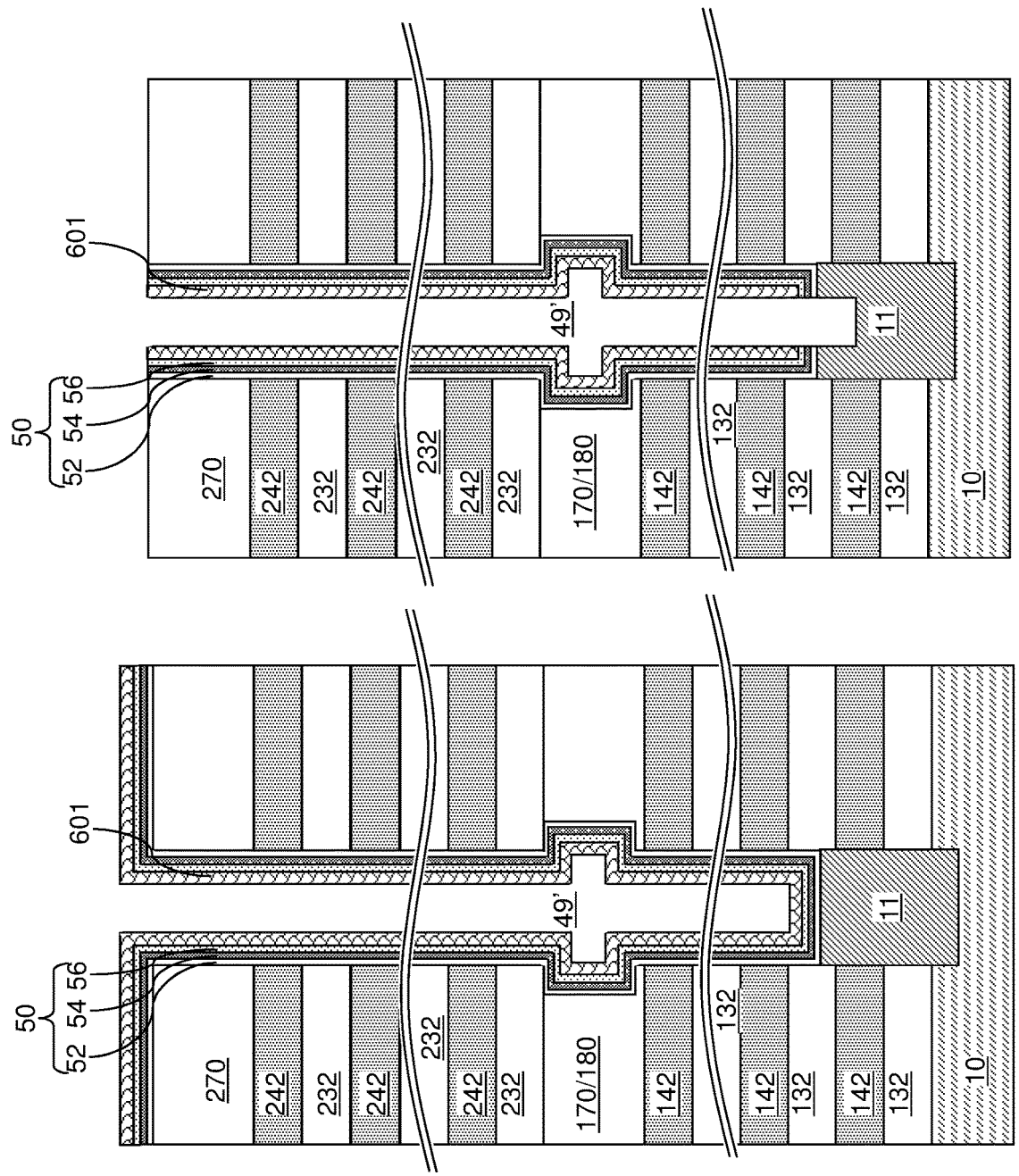

MULTI-TIER THREE-DIMENSIONAL MEMORY DEVICE CONTAINING DIFFERENTIAL ETCH RATE FIELD OXIDES AND METHOD OF MAKING THE SAME

FIELD

The present disclosure relates generally to the field of semiconductor devices and specifically to a three-dimensional memory device containing differential etch rate field oxides in a multi-tier three-dimensional memory device, and methods of making the same.

BACKGROUND

Recently, ultra-high-density storage devices employing three-dimensional (3D) memory stack structures have been proposed. Such memory stack structures can employ an architecture known as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel.

SUMMARY

According to an aspect of the present disclosure, a three-dimensional memory device comprises a first alternating stack of first insulating layers and first electrically conductive layers that has first stepped surfaces, and a first retro-stepped dielectric material portion contacting the first stepped surfaces of the first alternating stack, and a second-tier structure containing a second alternating stack of second insulating layers and second electrically conductive layers that has second stepped surfaces, and a second retro-stepped dielectric material portion contacting the second stepped surfaces of the second alternating stack. The first retro-stepped dielectric material portion has a higher etch rate than the second retro-stepped dielectric material portion. Memory stack structures vertically extend through the first alternating stack and the second alternating stack. Each of the memory stack structures includes a memory film and a vertical semiconductor channel.

According to another aspect of the present disclosure, a method of forming a three-dimensional memory device, comprises forming a first alternating stack of first insulating layers and first spacer material layers over a substrate, wherein the first spacer material layers are formed as, or are subsequently replaced with, first electrically conductive layers, forming first stepped surfaces by patterning the first alternating stack, forming a first retro-stepped dielectric material portion on the first stepped surfaces of the first alternating stack, forming a second alternating stack of second insulating layers and second spacer material layers over the first alternating stack, wherein the second spacer material layers are formed as, or are subsequently replaced with, second electrically conductive layers, forming second stepped surfaces by patterning the second alternating stack, forming a second retro-stepped dielectric material portion on the second stepped surfaces of the second alternating stack, forming memory stack structures through the first alternating stack and the second alternating stack, wherein each of the memory stack structures comprises a memory film and a vertical semiconductor channel, forming contact via cavities through the first and second retro-stepped dielectric material portions using a reactive ion etch process that provides a higher average etch rate through the first retro-stepped dielectric material portion than through the second retro-stepped dielectric material portion, and forming contact via structures in the contact via cavities through the first and second retro-stepped dielectric material portions and on a respective one of the first and second electrically conductive layers.

BRIEF DESCRIPTION OF THE DRAWINGS

FIGS. 9A-9H are sequential vertical cross-sectional views of an inter-tier memory opening during formation of a pillar channel portion, a memory stack structure, a dielectric core, and a drain region according to the first embodiment of the present disclosure.

DETAILED DESCRIPTION

Figure 1:
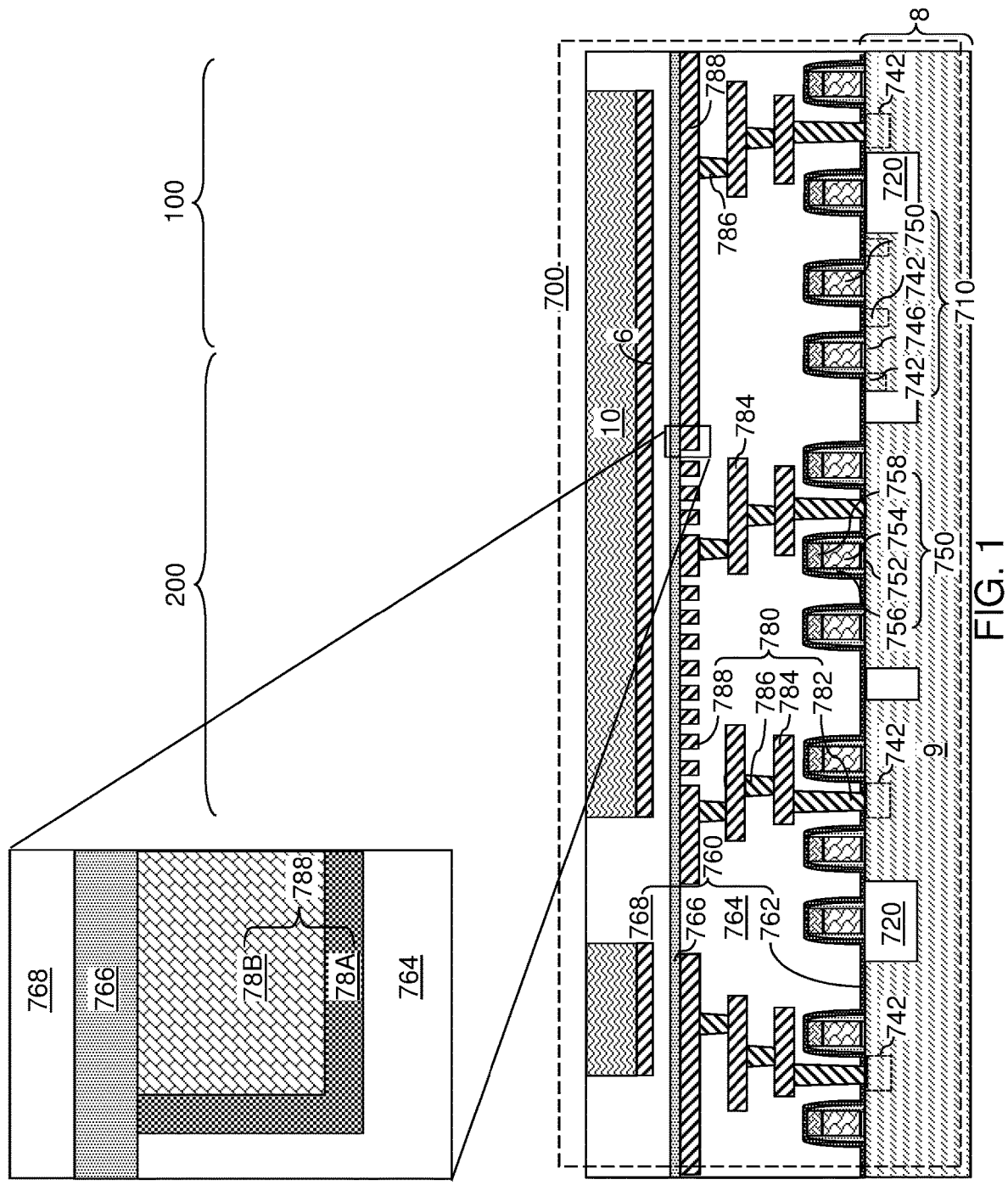
FIG. 1 is a vertical cross-sectional view of a first exemplary structure after formation of semiconductor devices, lower level dielectric layers including a silicon nitride layer, lower metal interconnect structures, and a planar semiconductor material layer on a semiconductor substrate according to a first embodiment of the present disclosure.

In a multi-tier three-dimensional memory device, a alternating stack of the insulating layers and the spacer material layers can be formed in multiple stages in which a respective subset of the insulating layers and the spacer material layers are deposited, patterned to form respective stepped surfaces, and planarized with a respective field oxide material portion to provide a planar top surface for subsequently forming an overlying subset of the insulating layers and the spacer material layers. Each combination of a subset of the insulating layers and the spacer material layers and a field oxide material portion located a same level constitutes a tier structure. Formation of the alternating stack of the insulating layers and the spacer material layers as a multi-tier structure increases can increase the total number of the electrically conductive layers in a three-dimensional memory device, and thus, can increase the total number of word lines and the areal device density of the three-dimensional memory device. However, an increase in the total number of the electrically conductive layers poses a new challenge in formation of contact via structures to the electrically conductive layers. In order to contain the total processing cost and process time during manufacture of a three-dimensional memory device, it is desirable to form all contact via structures to the electrically conductive layers in a single via etch process and a single via fill process. The increase in the total number of the electrically conductive layers within the alternating stack increases the depth variations in the via cavities during the via etch process. Correspondingly, the probability of an etch-through to an underlying level resulting in an inter-level electrical short and/or the probability of an incomplete via etch process resulting in an electrical open between an electrically conductive layer and a contact via structure increases with the increase in the total number of the electrically conductive layers in an alternating stack.

A process and structure of embodiments of the present disclosure decrease the probability of electrical shorts and/or electrical opens that arise from an increase in the total number of electrically conductive layers within the alternating stack by employing differential etch rate field oxide materials in different tier structures within a multi-tier structure. As discussed above, the present disclosure is directed to a three-dimensional memory device containing differential etch rate field oxides in a multi-tier three-dimensional memory device and methods of making the same, the various aspects of which are described herein in detail. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-memory-level" element refers to an element that vertically extends through a memory level.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and can be fabricated employing the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Referring to FIG. 1, a first exemplary structure according to the first embodiment of the present disclosure is illustrated. The first exemplary structure includes a semiconductor substrate 8, and semiconductor devices 710 formed thereupon. The semiconductor substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices. The semiconductor devices 710 can include, for example, field effect transistors including respective transistor active regions 742 (i.e., source regions and drain regions), channel regions 746 and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which is herein referred to as lower level dielectric layers 760. The lower level dielectric layers 760 constitute a dielectric layer stack in which each lower level dielectric layer 760 overlies or underlies other lower level dielectric layers 760. The lower level dielectric layers 760 can include, for example, a dielectric liner 762 such as a silicon nitride liner that blocks diffusion of mobile ions and/or apply appropriate stress to underlying structures, at least one first dielectric material layer 764 that overlies the dielectric liner 762, a silicon nitride layer (e.g., hydrogen diffusion barrier) 766 that overlies the dielectric material layer 764, and at least one second dielectric layer 768.

The dielectric layer stack including the lower level dielectric layers 760 functions as a matrix for lower metal interconnect structures 780 that provide electrical wiring among the various nodes of the semiconductor devices and landing pads for through-memory-level contact via structures to be subsequently formed. The lower metal interconnect structures 780 are embedded within the dielectric layer stack of the lower level dielectric layers 760, and comprise a lower metal line structure located under and optionally contacting a bottom surface of the silicon nitride layer 766.

For example, the lower metal interconnect structures 780 can be embedded within the at least one first dielectric material layer 764. The at least one first dielectric material layer 764 may be a plurality of dielectric material layers in which various elements of the lower metal interconnect structures 780 are sequentially embedded. Each dielectric material layer among the at least one first dielectric material layer 764 may include any of doped silicate glass, undoped silicate glass, organosilicate glass, silicon nitride, silicon oxynitride, and dielectric metal oxides (such as aluminum oxide). In one embodiment, the at least one first dielectric material layer 764 can comprise, or consist essentially of, dielectric material layers having dielectric constants that do not exceed the dielectric constant of undoped silicate glass (silicon oxide) of 3.9.

The lower metal interconnect structures 780 can include various device contact via structures 782 (e.g., source and drain electrodes which contact the respective source and drain nodes of the device or gate electrode contacts), intermediate lower metal line structures 784, lower metal via structures 786, and topmost lower metal line structures 788 that are configured to function as landing pads for through-memory-level contact via structures to be subsequently formed. In this case, the at least one first dielectric material layer 764 may be a plurality of dielectric material layers that are formed level by level while incorporating components of the lower metal interconnect structures 780 within each respective level. For example, single damascene processes may be employed to form the lower metal interconnect structures 780, and each level of the lower metal via structures 786 may be embedded within a respective via level dielectric material layer and each level of the lower level metal line structures (784, 788) may be embedded within a respective line level dielectric material layer. Alternatively, a dual damascene process may be employed to form integrated line and via structures, each of which includes a lower metal line structure and at least one lower metal via structure.

The topmost lower metal line structures 788 can be formed within a topmost dielectric material layer of the at least one first dielectric material layer 764 (which can be a plurality of dielectric material layers). Each of the lower metal interconnect structures 780 can include a metallic nitride liner 78A and a metal fill portion 78B. Each metallic nitride liner 78A can include a conductive metallic nitride material such as TiN, TaN, and/or WN. Each metal fill portion 78B can include an elemental metal (such as Cu, W, Al, Co, Ru) or an intermetallic alloy of at least two metals. Top surfaces of the topmost lower metal line structures 788 and the topmost surface of the at least one first dielectric material layer 764 may be planarized by a planarization process, such as chemical mechanical planarization. In this case, the top surfaces of the topmost lower metal line structures 788 and the topmost surface of the at least one first dielectric material layer 764 may be within a horizontal plane that is parallel to the top surface of the substrate 8.

The silicon nitride layer 766 can be formed directly on the top surfaces of the topmost lower metal line structures 788 and the topmost surface of the at least one first dielectric material layer 764. Alternatively, a portion of the first dielectric material layer 764 can be located on the top surfaces of the topmost lower metal line structures 788 below the silicon nitride layer 766. In one embodiment, the silicon nitride layer 766 is a substantially stoichiometric silicon nitride layer which has a composition of $Si_3N_4$. A silicon nitride material formed by thermal decomposition of a silicon nitride precursor is preferred for the purpose of blocking hydrogen diffusion. In one embodiment, the silicon nitride layer 766 can be deposited by a low pressure chemical vapor deposition (LPCVD) employing dichlorosilane ($SiH_2Cl_2$) and ammonia ($NH_3$) as precursor gases. The temperature of the LPCVD process may be in a range from 750 degrees Celsius to 825 degrees Celsius, although lesser and greater deposition temperatures can also be employed. The sum of the partial pressures of dichlorosilane and ammonia may be in a range from 50 mTorr to 500 mTorr, although lesser and greater pressures can also be employed. The thickness of the silicon nitride layer 766 is selected such that the silicon nitride layer 766 functions as a sufficiently robust hydrogen diffusion barrier for subsequent thermal processes. For example, the thickness of the silicon nitride layer 766 can be in a range from 6 nm to 100 nm, although lesser and greater thicknesses may also be employed.

The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass. In one embodiment, the at least one first second material layer 768 can comprise, or consist essentially of, dielectric material layers having dielectric constants that do not exceed the dielectric constant of undoped silicate glass (silicon oxide) of 3.9.

An optional layer of a metallic material and a layer of a semiconductor material can be deposited over, or within patterned recesses of, the at least one second dielectric material layer 768, and is lithographically patterned to provide an optional planar conductive material layer 6 and a planar semiconductor material layer 10. The optional planar conductive material layer 6, if present, provides a high conductivity conduction path for electrical current that flows into, or out of, the planar semiconductor material layer 10. The optional planar conductive material layer 6 includes a conductive material such as a metal or a heavily doped semiconductor material. The optional planar conductive material layer 6, for example, may include a tungsten layer having a thickness in a range from 3 nm to 100 nm, although lesser and greater thicknesses can also be employed. A metal nitride layer (not shown) may be provided as a diffusion barrier layer on top of the planar conductive material layer 6. Layer 6 may function as a special source line in the completed device. Alternatively, layer 6 may comprise an etch stop layer and may comprise any suitable conductive, semiconductor or insulating layer.

The planar semiconductor material layer 10 can include horizontal semiconductor channels and/or source regions for a three-dimensional array of memory devices to be subsequently formed. The optional planar conductive material layer 6 can include a metallic compound material such as a conductive metallic nitride (e.g., TiN) and/or a metal (e.g., W). The thickness of the optional planar conductive material layer 6 may be in a range from 5 nm to 100 nm, although lesser and greater thicknesses can also be employed. The planar semiconductor material layer 10 includes a polycrystalline semiconductor material such as polysilicon or a polycrystalline silicon-germanium alloy. The thickness of the planar semiconductor material layer 10 may be in a range from 30 nm to 300 nm, although lesser and greater thicknesses can also be employed.

The planar semiconductor material layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the planar semiconductor material layer 10 can include a polycrystalline semiconductor material (such as polysilicon), or an amorphous semiconductor material (such as amorphous silicon) that is converted into a polycrystalline semiconductor material in a subsequent processing step (such as an anneal step). The planar semiconductor material layer 10 can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 9). In one embodiment, the planar semiconductor material layer 10 or portions thereof can be doped with electrical dopants, which may be p-type dopants or n-type dopants. The conductivity type of the dopants in the planar semiconductor material layer 10 is herein referred to as a first conductivity type.

The optional planar conductive material layer 6 and the planar semiconductor material layer 10 may be patterned to provide openings in areas in which through-memory-level contact via structures and through-memory-level contact via structures are to be subsequently formed. In one embodiment, the openings in the optional planar conductive material layer 6 and the planar semiconductor material layer 10 can be formed within the area of a memory array region 100, in which a three-dimensional memory array including memory stack structures is to be subsequently formed. Further, additional openings in the optional planar conductive material layer 6 and the planar semiconductor material layer 10 can be formed within the area of a contact region 200 in which contact via structures contacting word line electrically conductive layers are to be subsequently formed.

The region of the semiconductor devices 710 and the combination of the lower level dielectric layers 760 and the lower metal interconnect structures 780 is herein referred to an underlying peripheral device region 700, which is located underneath a memory-level assembly to be subsequently formed and includes peripheral devices for the memory-level assembly. The lower metal interconnect structures 780 are embedded in the lower level dielectric layers 760.

The lower metal interconnect structures 780 can be electrically shorted to active nodes (e.g., transistor active regions 742 or gate electrodes 750) of the semiconductor devices 710 (e.g., CMOS devices), and are located at the level of the lower level dielectric layers 760. Only a subset of the active nodes is illustrated in FIG. 1 for clarity. Through-memory-level contact via structures (not shown in FIG. 1) can be subsequently formed directly on the lower metal interconnect structures 780 to provide electrical connection to memory devices to be subsequently formed. In one embodiment, the pattern of the lower metal interconnect structures 780 can be selected such that the topmost lower metal line structures 788 (which are a subset of the lower metal interconnect structures 780 located at the topmost portion of the lower metal interconnect structures 780) can provide landing pad structures for the through-memory-level contact via structures to be subsequently formed.

Figure 2:
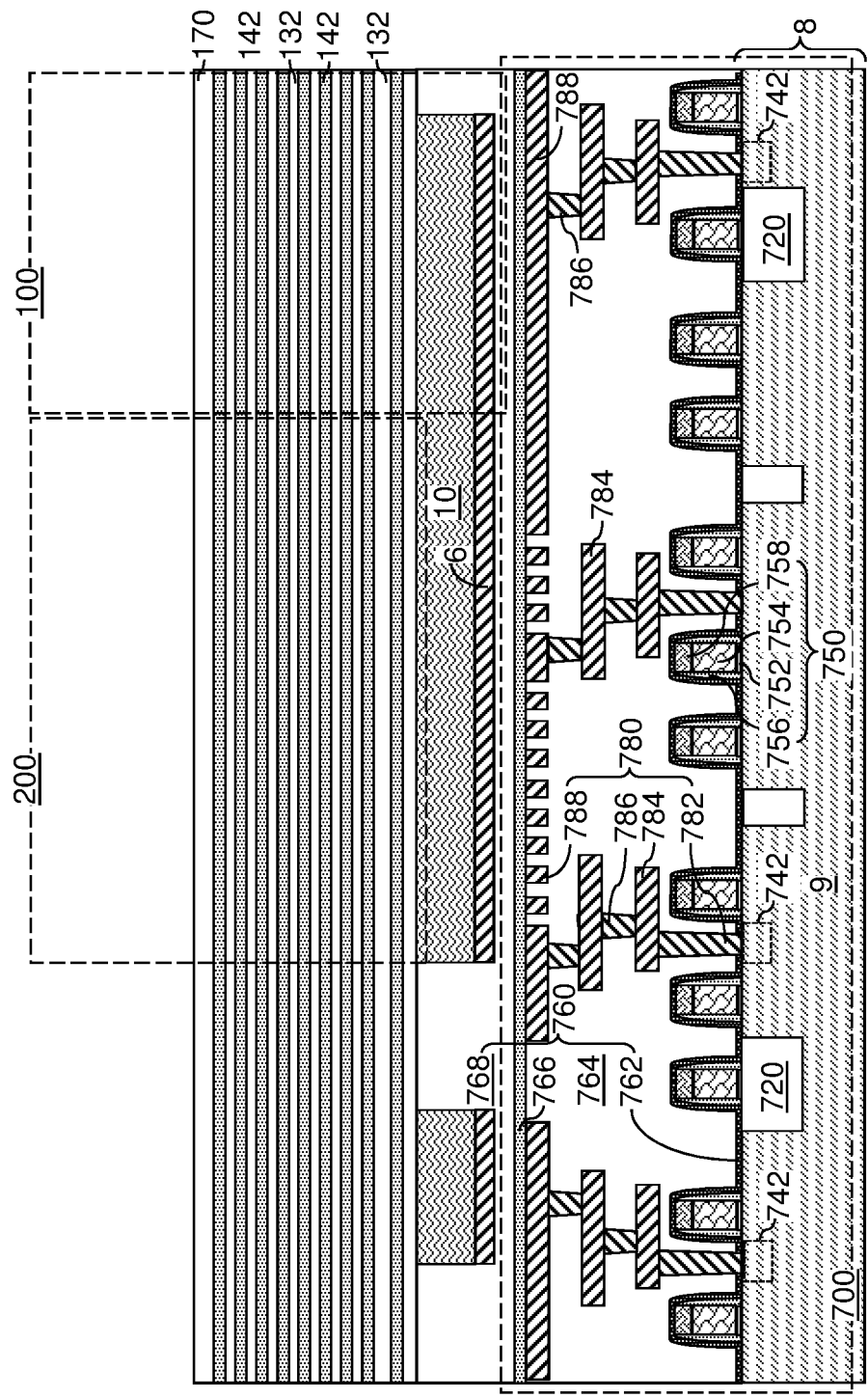
FIG. 2 is a vertical cross-sectional view of the first exemplary structure after formation of a first alternating stack of first insulting layers and first spacer material layers according to the first embodiment of the present disclosure.

Referring to FIG. 2, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first alternating stack. The level of the first alternating stack is herein referred to as a first-tier level, and the level of the alternating stack to be subsequently formed immediately above the first-tier level is herein referred to as a second-tier level, etc.

The first alternating stack can include first insulting layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the first insulating cap layer 170 can be in a range from 20 nm to 300 nm, although lesser and greater thicknesses can also be employed.

Figure 3A:
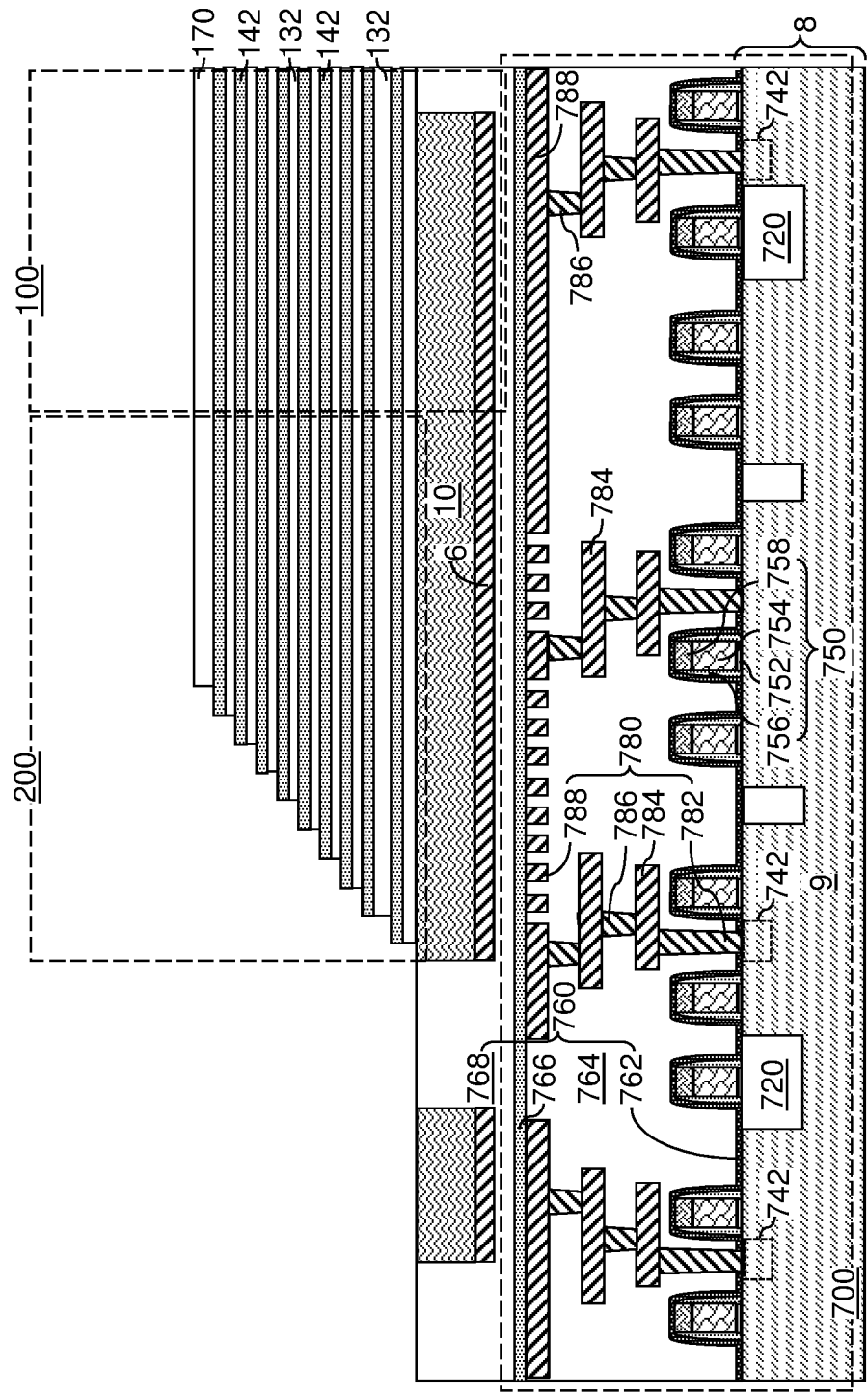
FIGS. 3A-3C are sequential vertical cross-sectional views of the first exemplary structure during patterning of first stepped surfaces on the first alternating stack and formation of a first retro-stepped dielectric material portion according to the first embodiment of the present disclosure.

Referring to FIG. 3A, the first insulating cap layer 170 and the first alternating stack (132, 142) can be patterned to form first stepped surfaces in the word line contact via region 200. The word line contact via region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. The first stepped surfaces continuously extend from a bottommost layer within the first alternating stack (132, 142) to a topmost layer within the first alternating stack (132, 142). The cavity overlying the first stepped surfaces is herein referred to as a first stepped cavity.

Figure 3B:
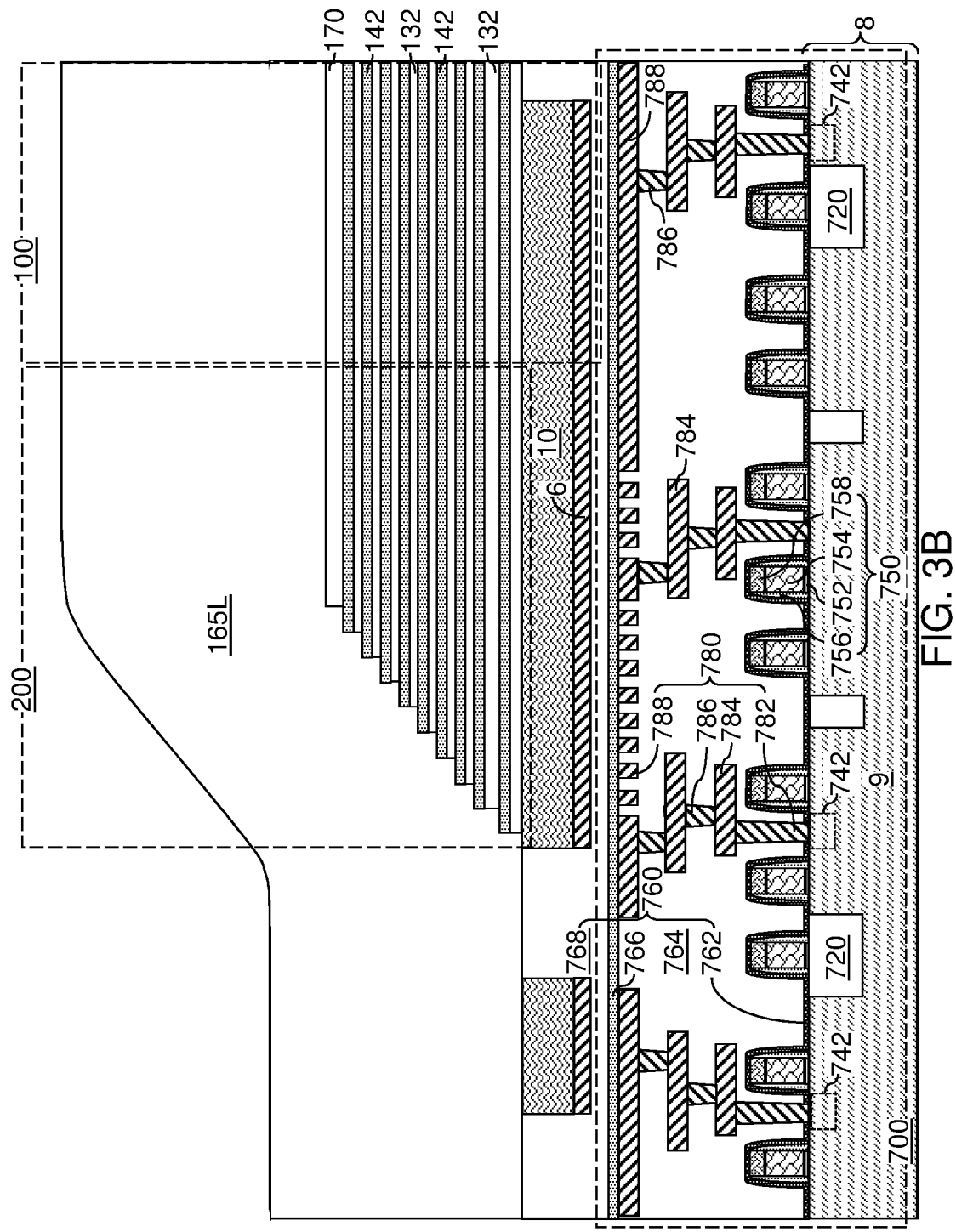

Referring to FIG. 3B, a first silicate glass material can be deposited over the first stepped surfaces, the first insulating cap layer 170 to form a first silicate glass layer 165L. The first silicate glass material is a material that can be etched at a higher rate then a second silicate glass material to be formed subsequently in the second tier over second stepped surfaces. For example, the first silicate glass material can be a doped silicate glass, such as a phosphorus doped silicate glass (i.e., phosphosilicate glass, PSG), while the second silicate glass material can be an undoped silicate glass, i.e., undoped silicon oxide, such as $SiO_2$. In one embodiment, the first silicate glass layer 165L can be etched as a higher rate by a reactive ion etch (RIE) than the second silicate glass layer. Any suitable RIE chemistry that can etch both doped and undoped silicate glass (i.e., doped and undoped silicon oxide) at different rates can be used, such as $CHF_3/O_2$, $CF_4/H_2$, or $CF_4/O_2$ plasma RIE etching chemistry can be used. In one embodiment, the first silicate glass material can include $SiO_2$ at a first average $SiO_2$ molar concentration in a range from 80% to 99%, such as from 80% to 95%. In one embodiment, the first average $SiO_2$ molar concentration can be in a range from 90% to 98%. The first silicate glass material can include $P_2O_5$ at a first average $P_2O_5$ molar concentration in a range from 1% to 20%, such as from 5% to 20%. The first silicate glass material can be deposited by plasma enhanced chemical vapor deposition. The duration of the deposition process that deposits the first silicate glass material can be selected such that portions of the first silicate glass layer 165L outside the periphery of the first alternating stack (132, 142) have a top surface that is above the horizontal plane including the top surface of the first insulating cap layer 170.

In one embodiment, the material composition of the first silicate glass layer 165L can be uniform throughout. In this case, the first silicate glass layer 165L can include $P_2O_5$ at the first average $P_2O_5$ molar concentration throughout the first silicate glass layer 165L. Alternatively, the first silicate glass layer 165L can include $P_2O_5$ at a graded molar concentration such that the molar concentration of $P_2O_5$ increases with a distance from the first stepped surfaces of the first alternating stack (132, 142).

Figure 3C:
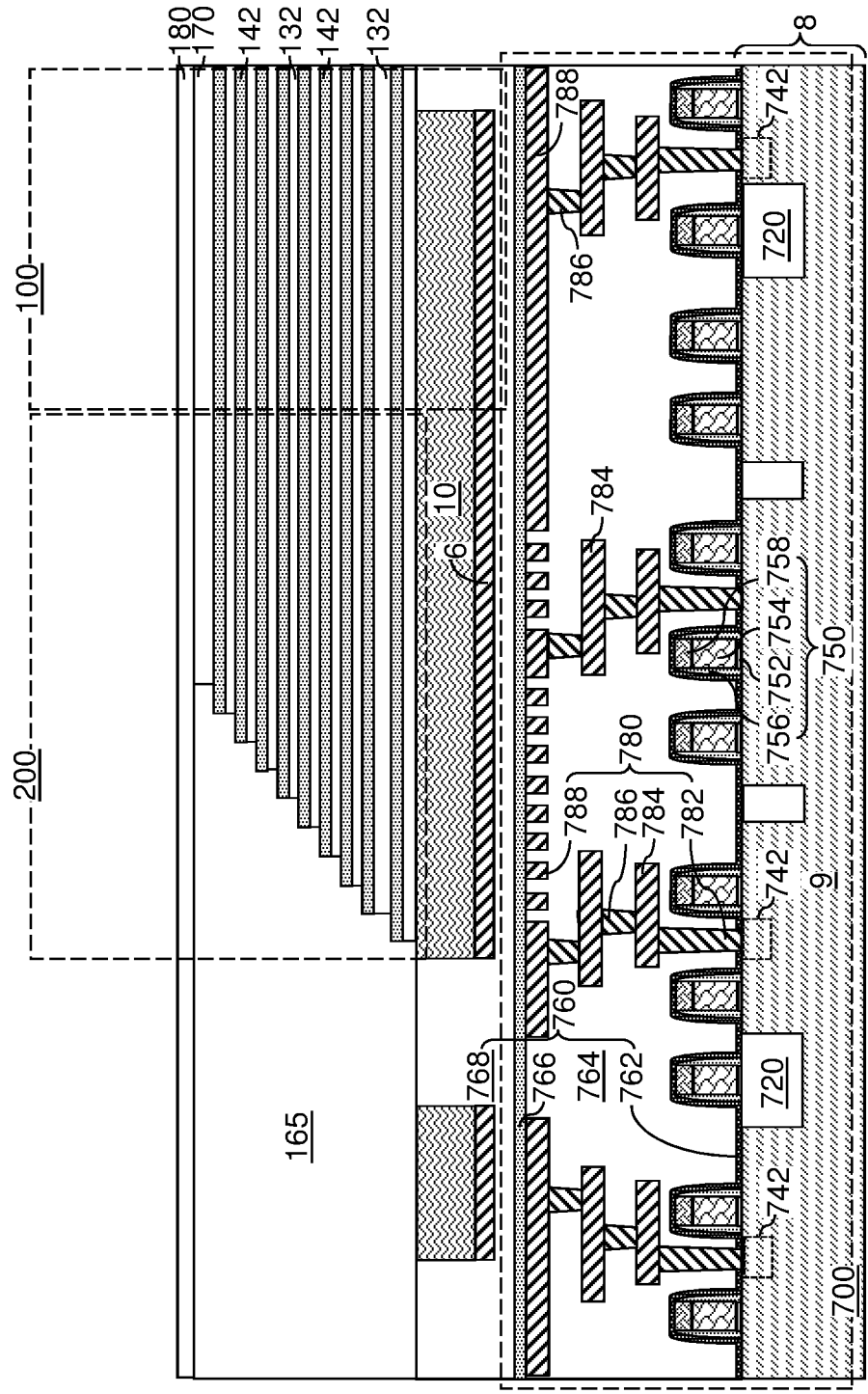

Referring to FIG. 3C, portions of the first silicate glass layer 165L that overlies the first insulating cap layer 170 can be removed by a planarization process such as a chemical mechanical planarization (CMP) process. A continuous remaining portion of the first silicate glass layer 165L overlying the first stepped surfaces and filling the first stepped cavity is herein referred to as a first retro-stepped dielectric material portion 165, which comprises, and can consist of, the first silicate glass material. As used herein, a "retro-stepped" element refers to an element that has stepped surfaces and a horizontal cross-sectional area that increases monotonically as a function of a vertical distance from a top surface of a substrate on which the element is present. The first alternating stack (132, 142) and the first retro-stepped dielectric material portion 165 collectively constitute a first-tier structure, which is an in-process structure that is subsequently modified. The first stepped surfaces contact vertical surfaces and horizontal bottom surfaces of the first retro-stepped dielectric material portion 165. The first retro-stepped dielectric material portion 165 comprises a first silicate glass material that includes $SiO_2$ at a first average $SiO_2$ molar concentration in a range from 80% to 99% and $P_2O_5$ at a first average $P_2O_5$ molar concentration in a range from 1% to 20%. In one embodiment, the first average $P_2O_5$ molar concentration is in a range from 5% to 20%. In one embodiment, the first silicate glass material includes $P_2O_5$ at the first average $P_2O_5$ molar concentration throughout the first retro-stepped dielectric material portion. Alternatively, the first retro-stepped dielectric material portion includes $P_2O_5$ at a graded molar concentration that increases with a distance from the first stepped surfaces of the first alternating stack (132, 142).

An inter-tier dielectric layer 180 may be optionally deposited over the first-tier structure (132, 142, 165, 170). The inter-tier dielectric layer 180 includes a dielectric material such as a silicate glass material. The thickness of the inter-tier dielectric layer 180 can be in a range from 30 nm to 300 nm, although lesser and greater thicknesses can also be employed. In one embodiment, the inter-tier dielectric layer 180 can include a silicate glass that provides a greater etch rate in hydrofluoric acid than undoped silicate glass. For example, the inter-tier dielectric layer 180 can include borosilicate glass.

Figure 4A:
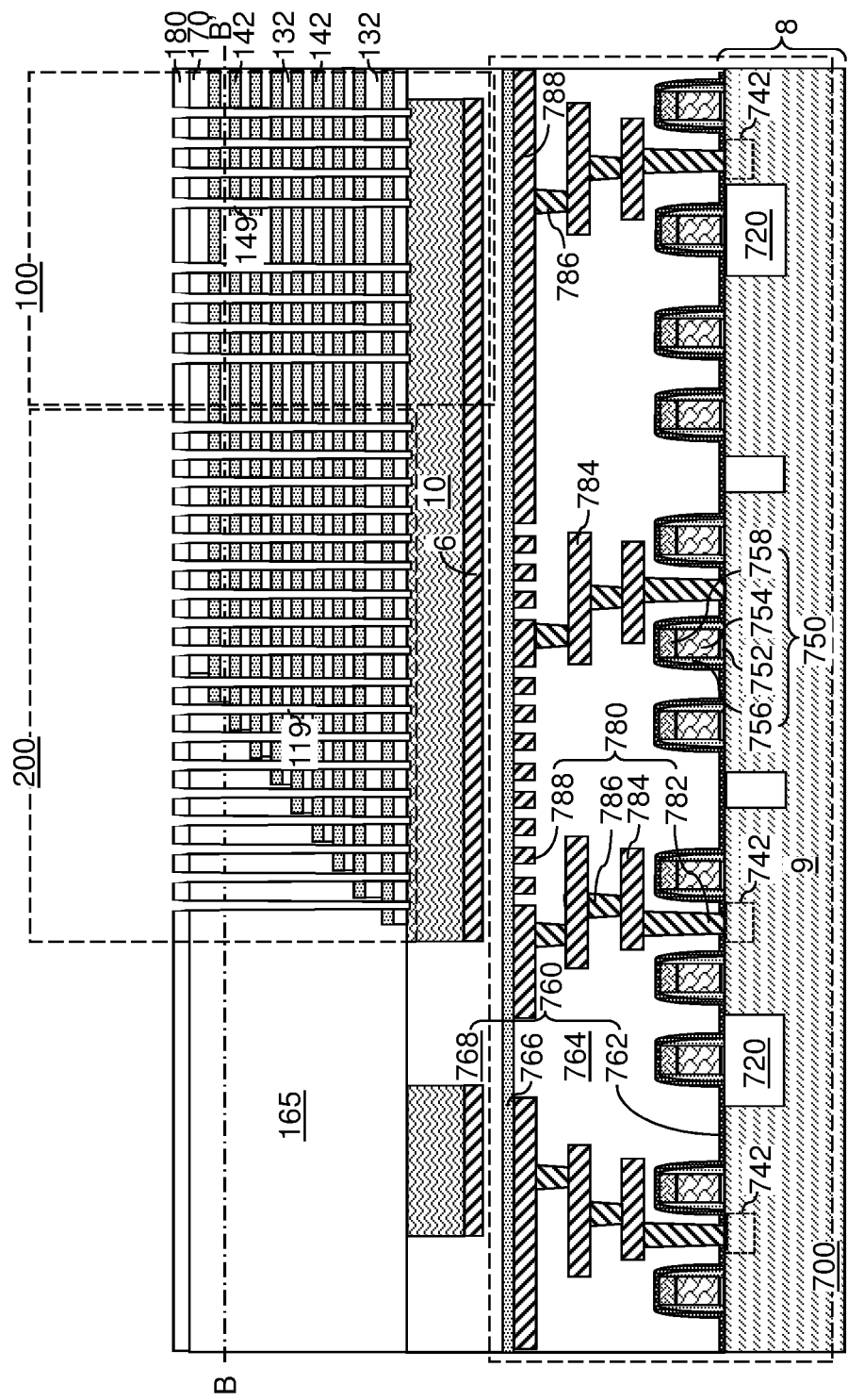
FIG. 4A is a vertical cross-sectional view of the first exemplary structure after formation of first-tier memory openings and first-tier support openings according to the first embodiment of the present disclosure.
Figure 4B:
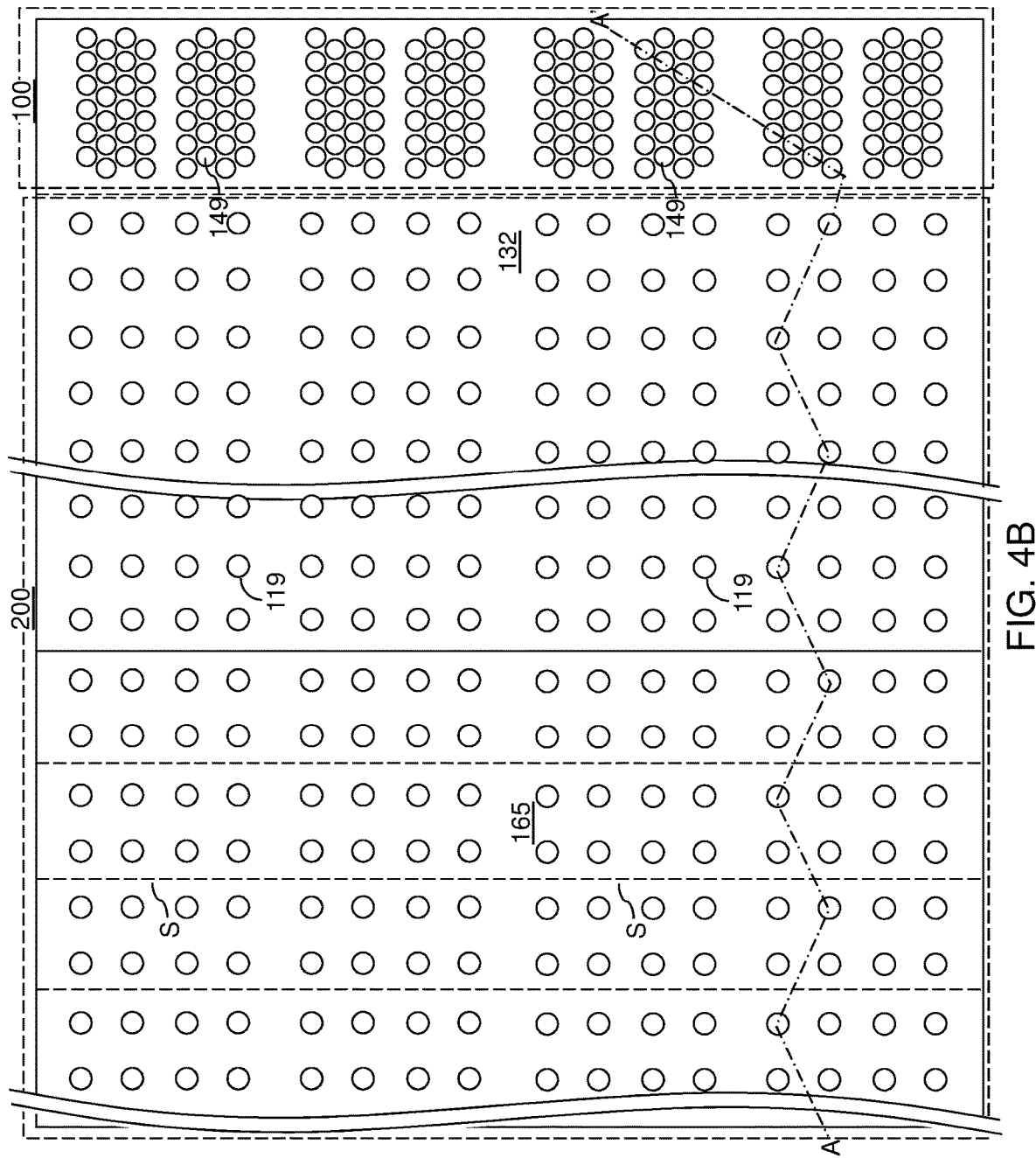
FIG. 4B is a horizontal cross-sectional view of the first exemplary structure along the horizontal plane B-B' in FIG. 4A. The zig-zag vertical plane A-A' corresponds to the plane of the vertical cross-sectional view of FIG. 4A.

Referring to FIGS. 4A and 4B, first-tier memory openings 149 and first-tier support openings 119 can be formed. Locations of steps S in the first alternating stack (132, 142) are illustrated as dotted lines in FIG. 4B. The first-tier memory openings 149 and the first-tier support openings 119 extend through the first alternating stack (132, 142) at least to a top surface of the planar semiconductor material layer 10. The first-tier memory openings 149 can be formed in the memory array region 100 at locations at which memory stack structures including vertical stacks of memory elements are to be subsequently formed. The first-tier support openings 119 can be formed in the word line contact via region 200. For example, a lithographic material stack (not shown) including at least a photoresist layer can be formed over the first insulating cap layer 170 (and the optional inter-tier dielectric layer 180, if present), and can be lithographically patterned to form openings within the lithographic material stack. The pattern in the lithographic material stack can be transferred through the first insulating cap layer 170 (and the optional inter-tier dielectric layer 180), and through the entirety of the first alternating stack (132, 142) by at least one anisotropic etch that employs the patterned lithographic material stack as an etch mask. Portions of the first insulating cap layer 170 (and the optional inter-tier dielectric layer 180), and the first alternating stack (132, 142) underlying the openings in the patterned lithographic material stack are etched to form the first-tier memory openings 149 and the first-tier support openings 119. In other words, the transfer of the pattern in the patterned lithographic material stack through the first insulating cap layer 170 and the first alternating stack (132, 142) forms the first-tier memory openings 149 and the first-tier support openings 119.

In one embodiment, the chemistry of the anisotropic etch process employed to etch through the materials of the first alternating stack (132, 142) can alternate to optimize etching of the first and second materials in the first alternating stack (132, 142). The anisotropic etch can be, for example, a series of reactive ion etches or a single etch (e.g., $CF_4/O_2/Ar$ etch). The sidewalls of the first-tier memory openings 149 and the support openings 119 can be substantially vertical, or can be tapered. Subsequently, the patterned lithographic material stack can be subsequently removed, for example, by ashing.

Optionally, the portions of the first-tier memory openings 149 and the first-tier support openings 119 at the level of the inter-tier dielectric layer 180 can be laterally expanded by an isotropic etch. For example, if the inter-tier dielectric layer 180 comprises a dielectric material (such as borosilicate glass) having a greater etch rate than the first insulating layers 132 (that can include undoped silicate glass), an isotropic etch (such as a wet etch employing HF) can be employed to expand the lateral dimensions of the first-tier memory openings at the level of the inter-tier dielectric layer 180. The portions of the first-tier memory openings 149 (and the first-tier support openings 119) located at the level of the inter-tier dielectric layer 180 may be optionally widened to provide a larger landing pad for second-tier memory openings to be subsequently formed through a second alternating stack (to be subsequently formed prior to formation of the second-tier memory openings).

Figure 5:
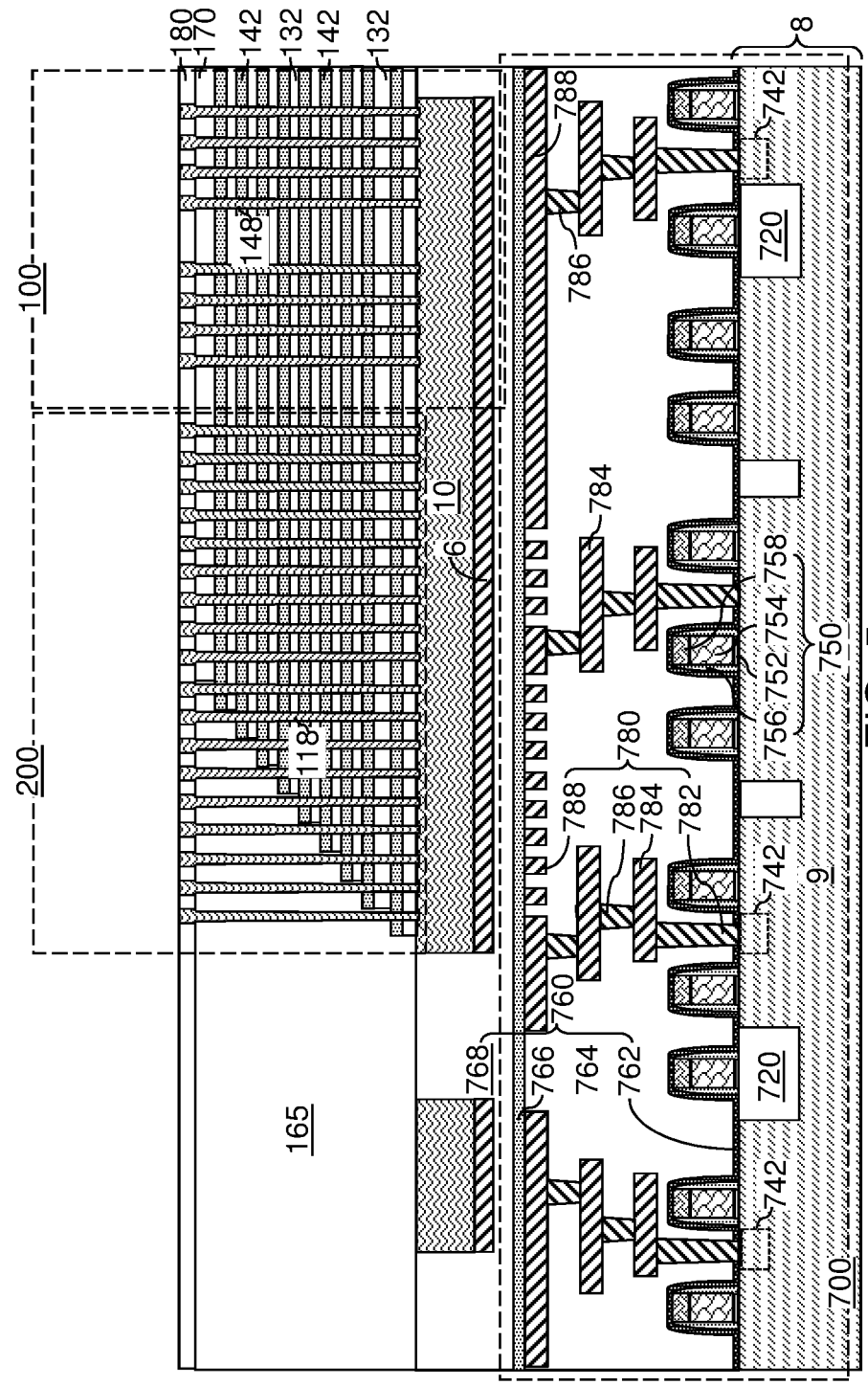
FIG. 5 is a vertical cross-sectional view of the first exemplary structure after formation of sacrificial memory opening fill portions and sacrificial support opening fill portions according to the first embodiment of the present disclosure.

Referring to FIG. 5, sacrificial memory opening fill portions 148 can be formed in the first-tier memory openings 149, and sacrificial support opening fill portions 118 can be formed in the first-tier support openings 119. For example, a sacrificial fill material layer is deposited in the first-tier memory openings 149 and the first-tier support openings 119. The sacrificial fill material layer includes a sacrificial material which can be subsequently removed selective to the materials of the first insulating layers 132 and the first sacrificial material layers 142. In one embodiment, the sacrificial fill material layer can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer having a thickness in a range from 1 nm to 3 nm) may be employed prior to depositing the sacrificial fill material layer. The sacrificial fill material layer may be formed by a non-conformal deposition or a conformal deposition method. In another embodiment, the sacrificial fill material layer can include amorphous silicon or a carbon-containing material (such as amorphous carbon or diamond-like carbon) that can be subsequently removed by ashing.

Portions of the deposited sacrificial material can be removed from above the first insulating cap layer 170 (and the optional inter-tier dielectric layer 180, if present). For example, the sacrificial fill material layer can be recessed to a top surface of the first insulating cap layer 170 (and the optional inter-tier dielectric layer 180) employing a planarization process. The planarization process can include a recess etch, chemical mechanical planarization (CMP), or a combination thereof. The top surface of the first insulating cap layer 170 (and optionally layer 180 if present) can be employed as an etch stop layer or a planarization stop layer. Each remaining portion of the sacrificial material in a first-tier memory opening 149 constitutes a sacrificial memory opening fill portion 148. Each remaining portion of the sacrificial material in a first-tier support opening 119 constitutes a sacrificial support opening fill portion 118. The top surfaces of the sacrificial memory opening fill portions 148 and the sacrificial support opening fill portions 118 can be coplanar with the top surface of the inter-tier dielectric layer 180 (or the first insulating cap layer 170 if the inter-tier dielectric layer 180 is not present). The sacrificial memory opening fill portion 148 and the sacrificial support opening fill portions 118 may, or may not, include cavities therein.

Figure 6A:
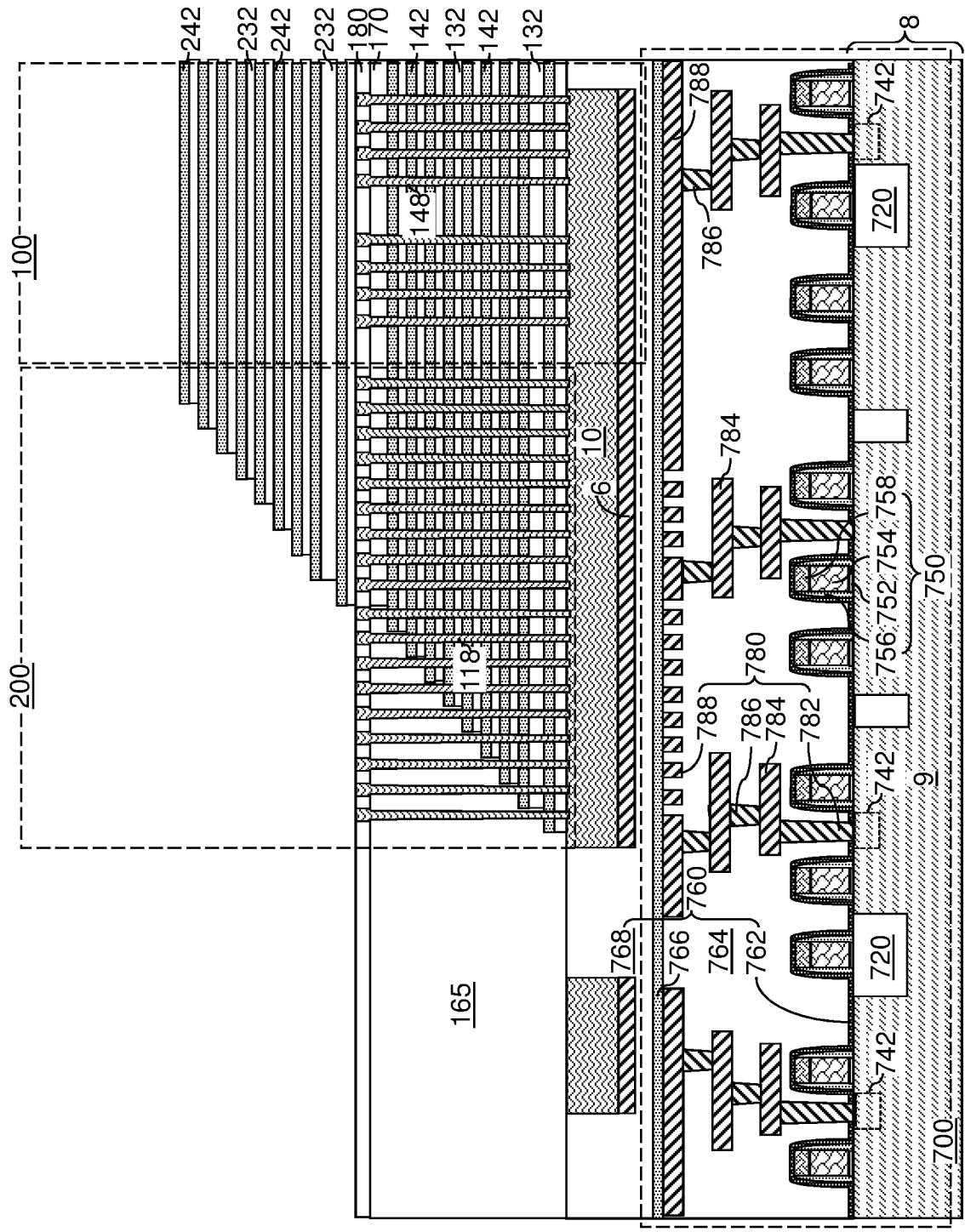
FIGS. 6A-6D are sequential vertical cross-sectional views of the first exemplary structure during formation of a second alternating stack of second insulating layers and second spacer material layers, a second-tier retro-stepped dielectric material portion, and a second insulating cap layer according to the first embodiment of the present disclosure.

Referring to FIG. 6A, a second-tier structure can be formed over the first-tier structure (132, 142, 170, 148, 118). The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Figure 6B:
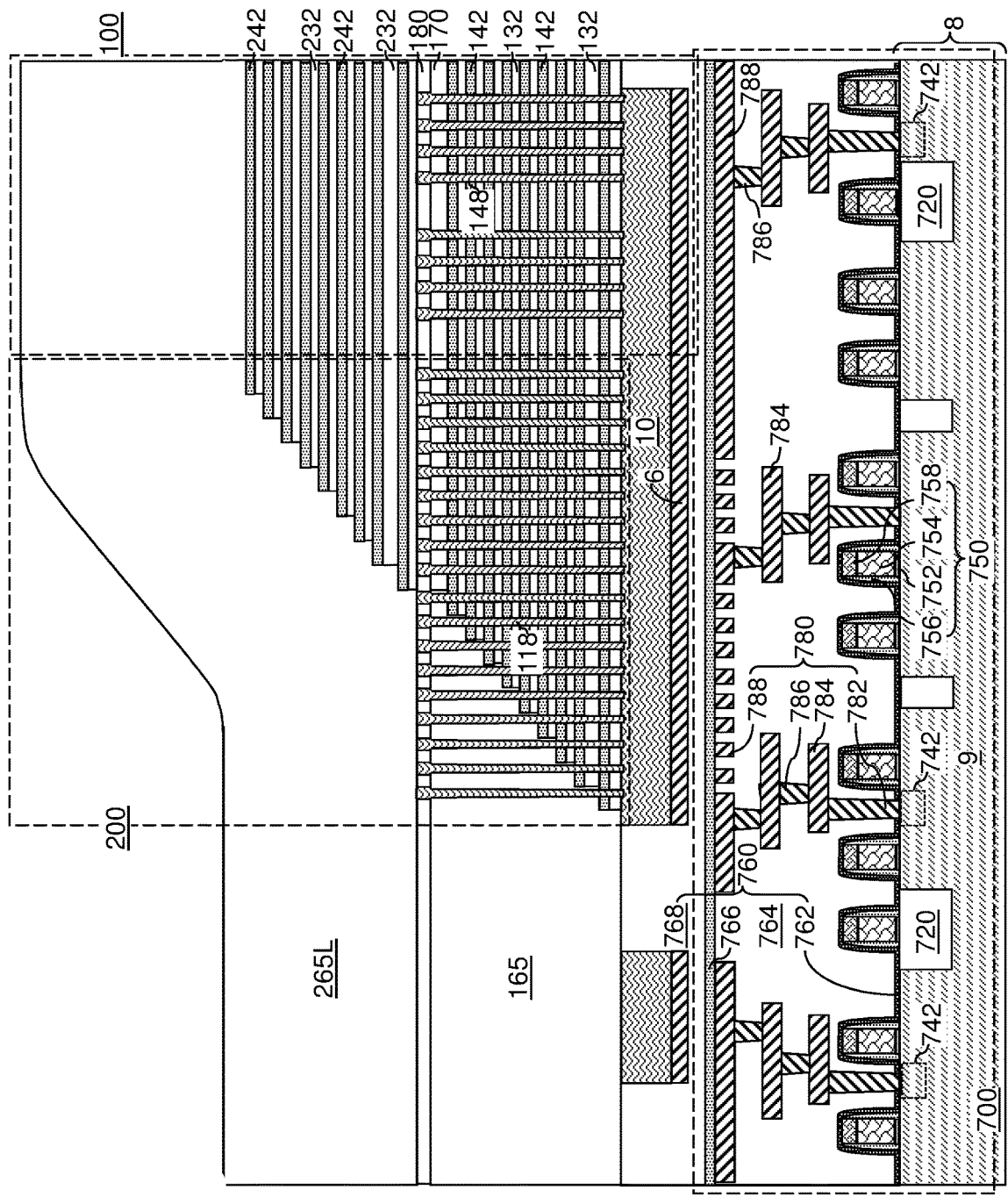

Referring to FIG. 6B, the second alternating stack (232, 242) can be patterned to form second stepped surfaces in the second stepped area within the word line contact via region 200. The second stepped area is more proximal to the memory array region 100 than the first stepped area including the first stepped surfaces is to the memory array region. The second stepped surfaces can be formed, for example, by forming a mask layer with an opening therein, etching a cavity within a topmost second sacrificial material layer 242 and a topmost second insulating layer 232, and iteratively expanding the etched area and vertically recessing the cavity by etching each pair of a first insulating layer 132 and a first sacrificial material layer 142 located directly underneath the bottom surface of the etched cavity within the etched area. The second stepped surfaces continuously extend from a bottommost layer within the second alternating stack (232, 242) to a topmost layer within the first alternating stack (132, 142). The cavity overlying the second stepped surfaces is herein referred to as a first stepped cavity.

Figure 6C:
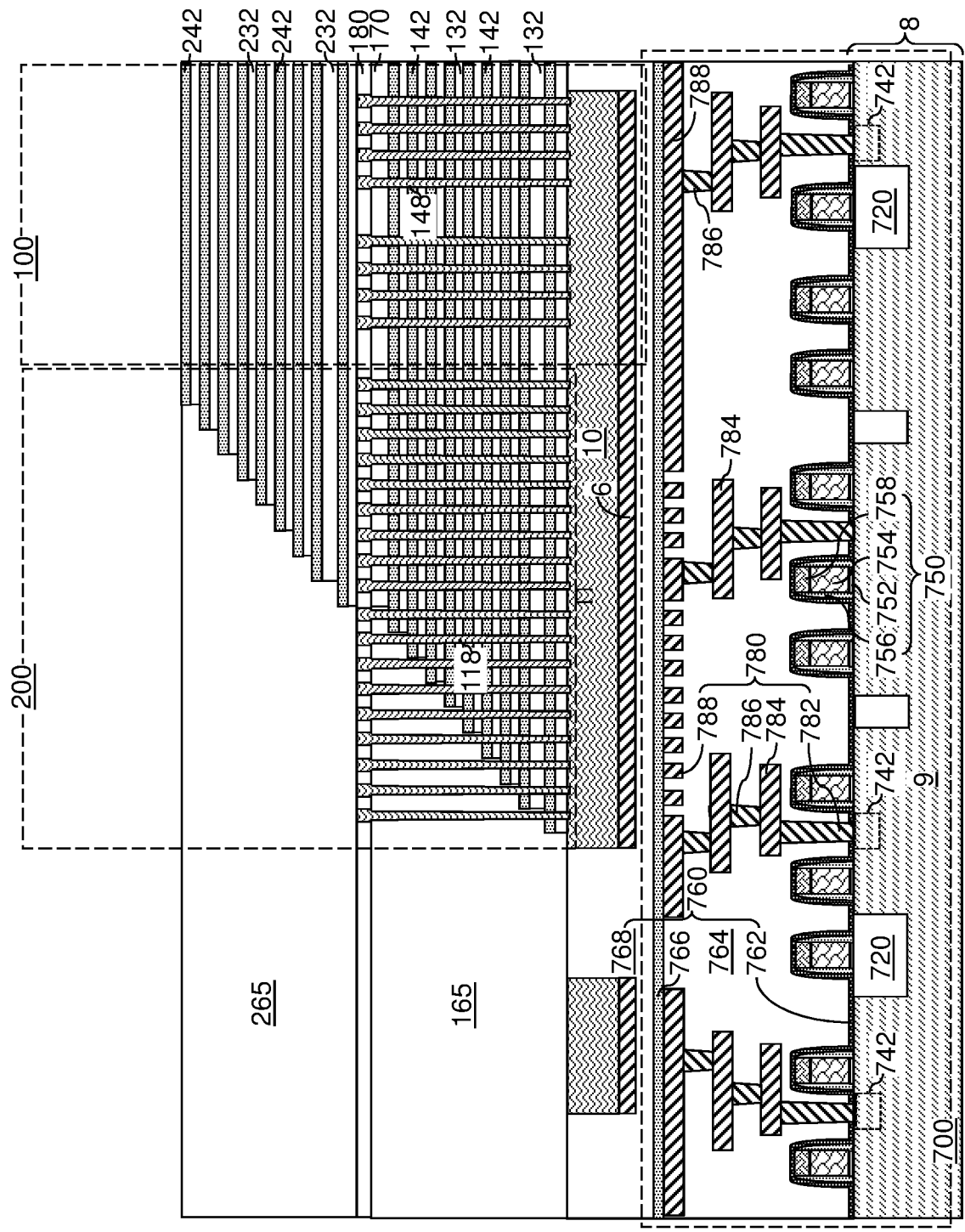

Referring to FIG. 6C, a second silicate glass material can be deposited over the second stepped surfaces to form a second silicate glass layer 265L. In one embodiment, the second silicate glass material includes, and/or can consist of, a second silicate glass material that is free of phosphorus, i.e., free of $P_2O_5$. In this case, the second silicate glass material can comprise an undoped silicate glass portion. In one embodiment, the second silicate glass layer 265L can consist of the undoped silicate glass material, and the undoped silicate glass material contacts the second stepped surfaces of the second alternating stack (232, 242).

In another embodiment, the second silicate glass material can include $P_2O_5$ at a second average $P_2O_5$ molar concentration that is less than the first average $P_2O_5$ molar concentration in the first retro-stepped dielectric material portion 165. In this case, the ratio of the second average $P_2O_5$ molar concentration to the first average $P_2O_5$ molar concentration is less than 0.1. For example, the second average $P_2O_5$ molar concentration can be in a range from 0.001 to 2.0%, such as from 0.01 to 1.0%. The second silicate glass layer 265L can contact the second stepped surfaces, and surface regions of the second silicate glass material that contact the second stepped surfaces of the second alternating stack (232, 242) can be free of $P_2O_5$, or can include $P_2O_5$ at a molar concentration less than 0.1%.

Referring to FIG. 6C, portions of the second silicate glass layer 265L that overlies the second alternating stack (232, 242) can be removed by a planarization process such as a chemical mechanical planarization (CMP) process. A continuous remaining portion of the second silicate glass layer 265L overlying the second stepped surfaces and filling the second stepped cavity is herein referred to as a second retro-stepped dielectric material portion 265, which comprises, and can consist of, the second silicate glass material. The second alternating stack (232, 242) and the second retro-stepped dielectric material portion 265 collectively constitute a second-tier structure, which is an in-process structure that is subsequently modified. The second stepped surfaces continuously extend from a bottommost layer within the second alternating stack (232, 242) to a topmost layer within the second alternating stack (232, 242) and contacts vertical surfaces and horizontal bottom surfaces of the second retro-stepped dielectric material portion 265.

The second retro-stepped dielectric material portion 265 comprises a second silicate glass material that is free of phosphorus, or includes $P_2O_5$ at the second average $P_2O_5$ molar concentration that is less than the first average $P_2O_5$ molar concentration of the first retro-stepped dielectric material portion 165. In one embodiment, the second retro-stepped dielectric material portion 265 consists of an undoped silicate glass portion that contacts the second stepped surfaces of the second alternating stack (232, 242). In another embodiment, the ratio of the second average $P_2O_5$ molar concentration to the first average $P_2O_5$ molar concentration can be less than 0.1. In one embodiment, surface regions of the second retro-stepped dielectric material portion 265 that contact the second stepped surfaces of the second alternating stack can be free of $P_2O_5$, or can include $P_2O_5$ at a molar concentration less than 0.1%.

Figure 6D:
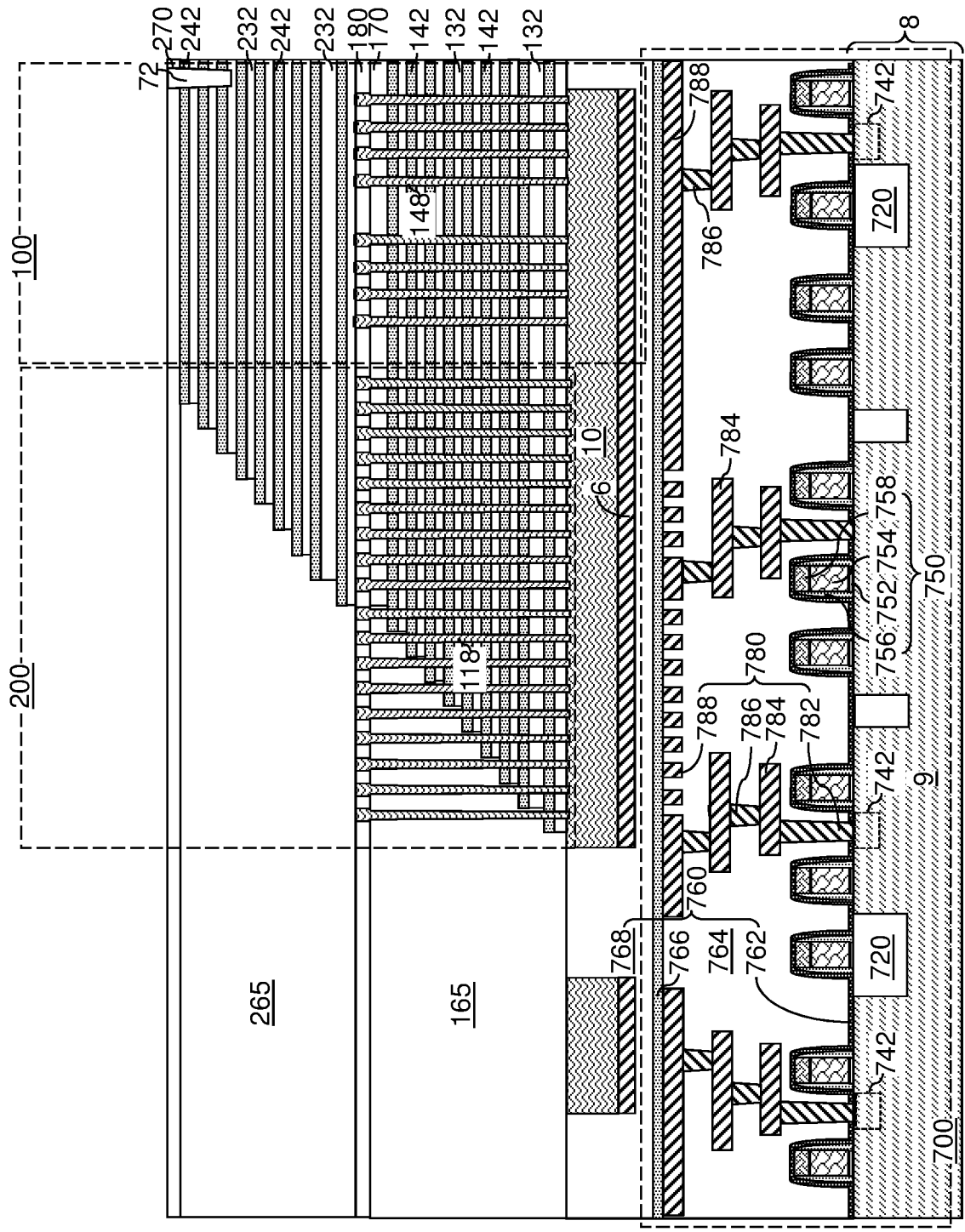

Referring to FIG. 6D, a second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide.

Optionally, drain-select-level shallow trench isolation structures 72 can be formed through a subset of layers in an upper portion of the second alternating stack (232, 242). The second sacrificial material layers 242 that are cut by the select-drain-level shallow trench isolation structures 72 correspond to the levels in which drain-select-level electrically conductive layers are subsequently formed. The drain-select-level shallow trench isolation structures 72 include a dielectric material such as silicon oxide.

Figure 7A:
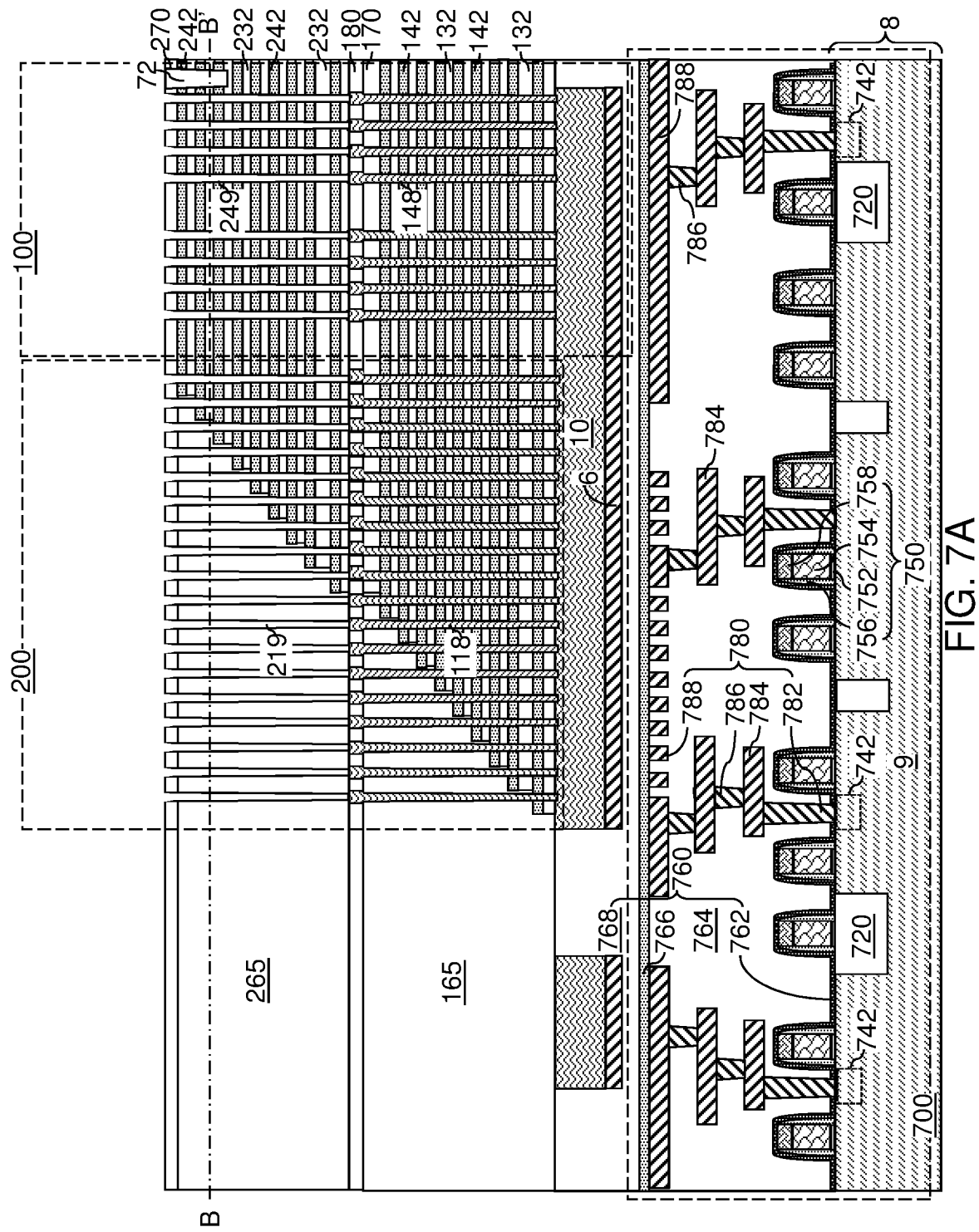
FIG. 7A is a vertical cross-sectional view of the first exemplary structure after formation of second-tier memory openings and second-tier support openings according to the first embodiment of the present disclosure.
Figure 7B:
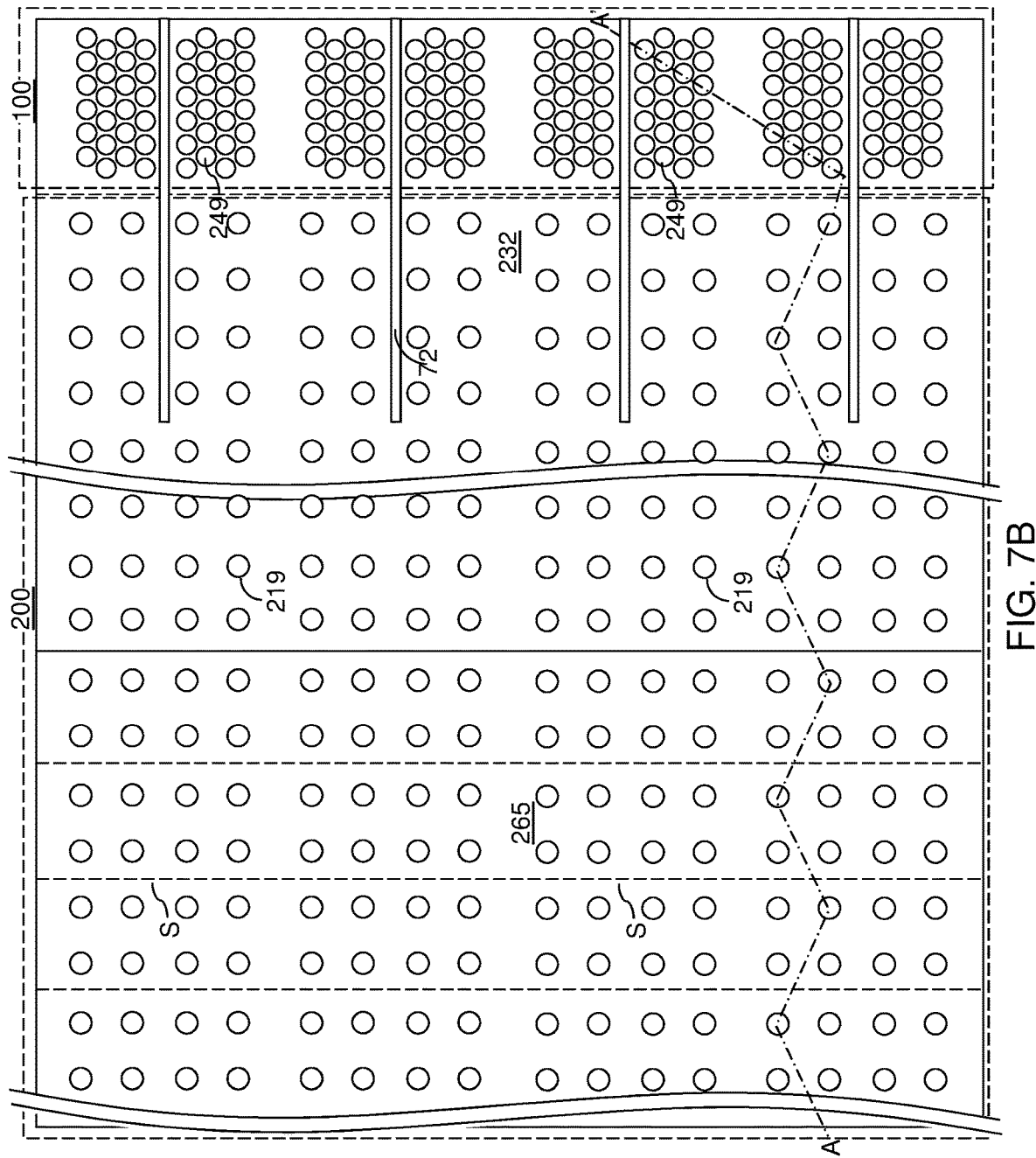
FIG. 7B is a horizontal cross-sectional view of the first exemplary structure along the horizontal plane B-B' in FIG. 7A. The zig-zag vertical plane A-A' corresponds to the plane of the vertical cross-sectional view of FIG. 7A.

Referring to FIGS. 7A and 7B, second-tier memory openings 249 and second tier support openings 219 extending through the second-tier structure (232, 242, 270, 265) are formed in areas overlying the sacrificial memory opening fill portions 148. A photoresist layer can be applied over the second-tier structure (232, 242, 270, 265), and can be lithographically patterned to form a same pattern as the pattern of the sacrificial memory opening fill portions 148 and the sacrificial support opening fill portions 118, i.e., the pattern of the first-tier memory openings 149 and the first-tier support openings 119. Thus, the lithographic mask employed to pattern the first-tier memory openings 149 and the first-tier support openings 119 can be employed to pattern the second-tier memory openings 249 and the second-tier support openings 219. An anisotropic etch can be performed to transfer the pattern of the lithographically patterned photoresist layer through the second-tier structure (232, 242, 270, 265). In one embodiment, the chemistry of the anisotropic etch process employed to etch through the materials of the second alternating stack (232, 242) can alternate to optimize etching of the alternating material layers in the second alternating stack (232, 242). The anisotropic etch can be, for example, a series of reactive ion etches. The patterned lithographic material stack can be removed, for example, by ashing after the anisotropic etch process.

A top surface of an underlying sacrificial memory opening fill portion 148 can be physically exposed at the bottom of each second-tier memory opening 249. A top surface of an underlying sacrificial support opening fill portion 118 can be physically exposed at the bottom of each second-tier support opening 219. After the top surfaces of the sacrificial memory opening fill portions 148 and the sacrificial support opening fill portions 118 are physically exposed, an etch process can be performed, which removes the sacrificial material of the sacrificial memory opening fill portions 148 and the sacrificial support opening fill portions 118 selective to the materials of the second alternating stack (232, 242) and the first alternating stack (132, 142) (e.g., $C_4F_8/O_2$/Ar etch).

Upon removal of the sacrificial memory opening fill portions 148, each vertically adjoining pair of a second-tier memory opening 249 and a first-tier memory opening 149 forms a continuous cavity that extends through the first alternating stack (132, 142) and the second alternating stack (232, 242). Likewise, upon removal of the sacrificial support opening fill portions 118, each vertically adjoining pair of a second-tier support opening 219 and a first-tier support opening 119 forms a continuous cavity that extends through the first alternating stack (132, 142) and the second alternating stack (232, 242). The continuous cavities are herein referred to as memory openings (or inter-tier memory openings) and support openings (or inter-tier support openings), respectively. A top surface of the planar semiconductor material layer 10 can be physically exposed at the bottom of each memory opening and at the bottom of each support openings. Locations of steps S in the first alternating stack (132, 142) and the second alternating stack (232, 242) are illustrated as dotted lines.

Figure 8:
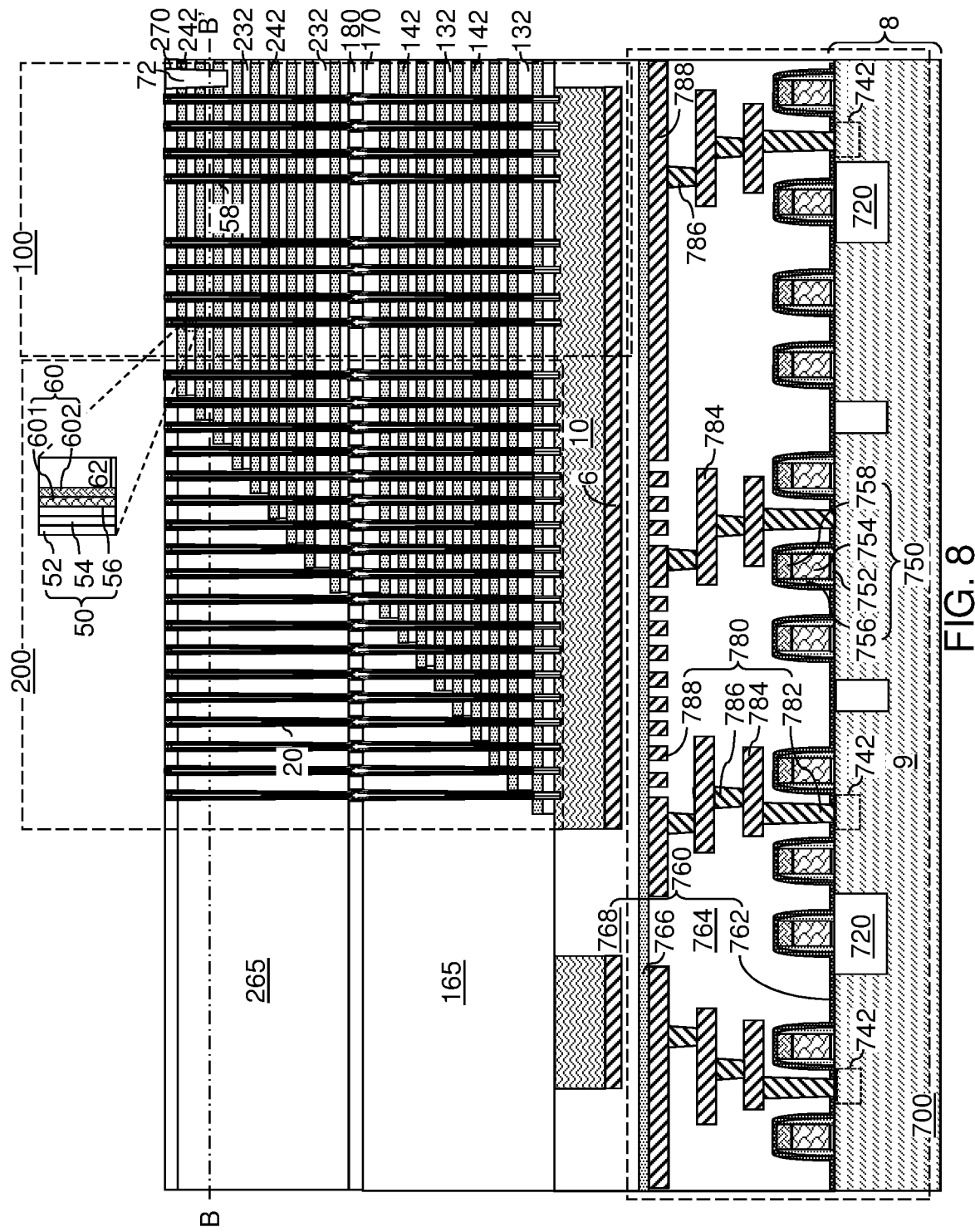
FIG. 8 is a vertical cross-sectional view of the first exemplary structure after formation of memory stack structures according to the first embodiment of the present disclosure.

Referring to FIG. 8, memory opening fill structures 58 are formed within each memory opening, and support pillar structures 20 are formed within each support opening. The memory opening fill structures 58 and the support pillar structures 20 can include a same set of components, and can be formed simultaneously.

FIGS. 9A-9H provide sequential cross-sectional views of a memory opening 49 or a support opening (119, 219) during formation of a memory opening fill structure 58 or a support pillar structure 20. While a structural change in a memory opening 49 is illustrated in FIGS. 9A-9H, it is understood that the same structural change occurs in each memory openings 49 and in each of the support openings (119, 219) during the same set of processing steps.

Figure 9A:
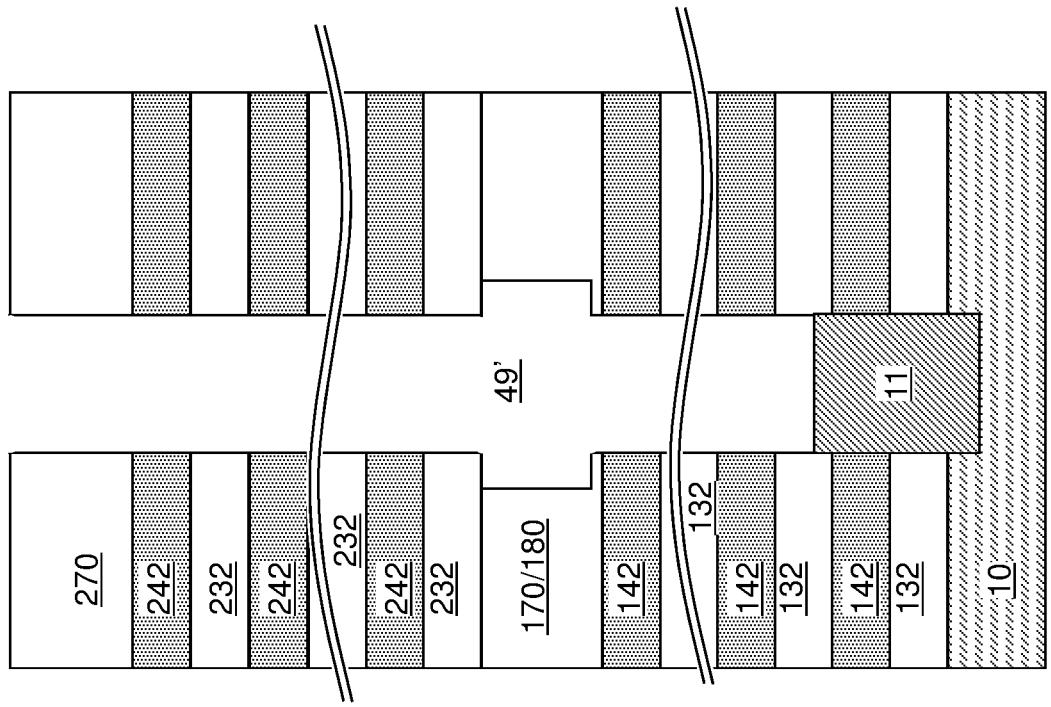

Referring to FIG. 9A, a memory opening 49 in the exemplary device structure of FIG. 14 is illustrated. The memory opening 49 extends through the first-tier structure and the second-tier structure. Likewise, each support opening (119, 219) extends through the first-tier structure and the second-tier structure.

Figure 9B:
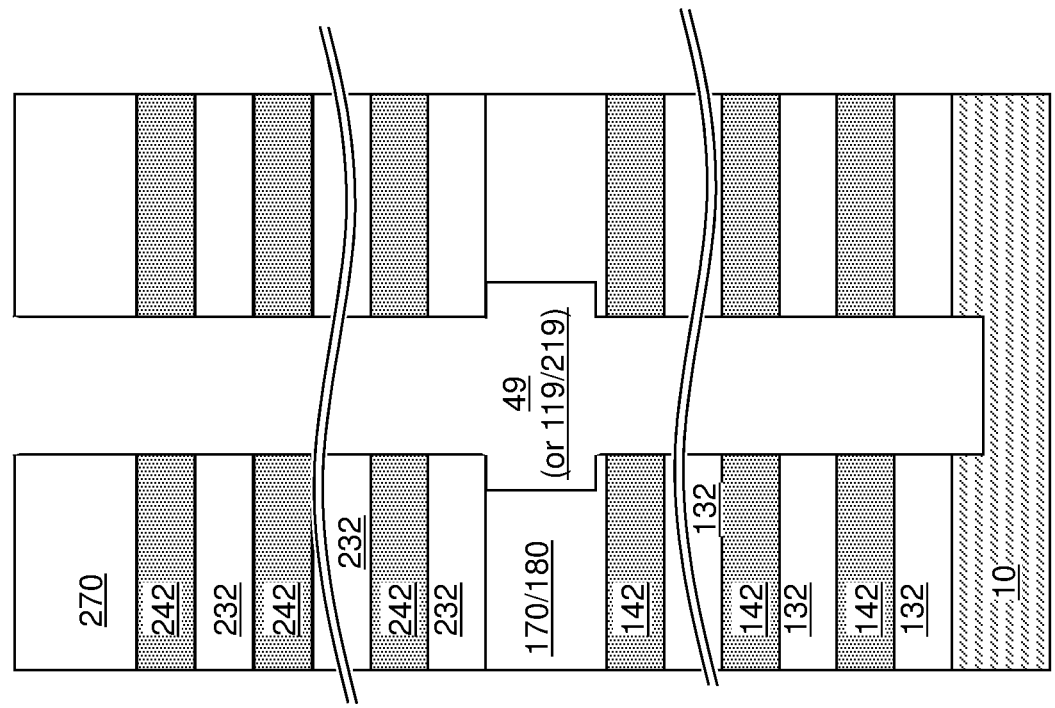

Referring to FIG. 9B, an optional pedestal channel portion (e.g., an epitaxial pedestal) 11 can be formed at the bottom portion of each memory opening 49 and each support openings (119, 219), for example, by a selective semiconductor deposition process. In one embodiment, the pedestal channel portion 11 can be doped with electrical dopants of the same conductivity type as the planar semiconductor material layer 10. In one embodiment, at least one source select gate electrode can be subsequently formed by replacing each sacrificial material layer 42 located below the horizontal plane including the top surfaces of the pedestal channel portions 11 with a respective conductive material layer. A cavity 49' is present in the unfilled portion of the memory opening 49 (or of the support opening) above the pedestal channel portion 11. In one embodiment, the pedestal channel portion 11 can comprise single crystalline silicon. In one embodiment, the pedestal channel portion 11 can have a doping of the same as the conductivity type of the planar semiconductor material layer 10.

Referring to FIG. 9C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof.

The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof.

The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 9D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the second insulating cap layer 270 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers (142, 242) constitutes a charge storage region.

A surface of the pedestal channel portion 11 (or a surface of the planar semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 9F:
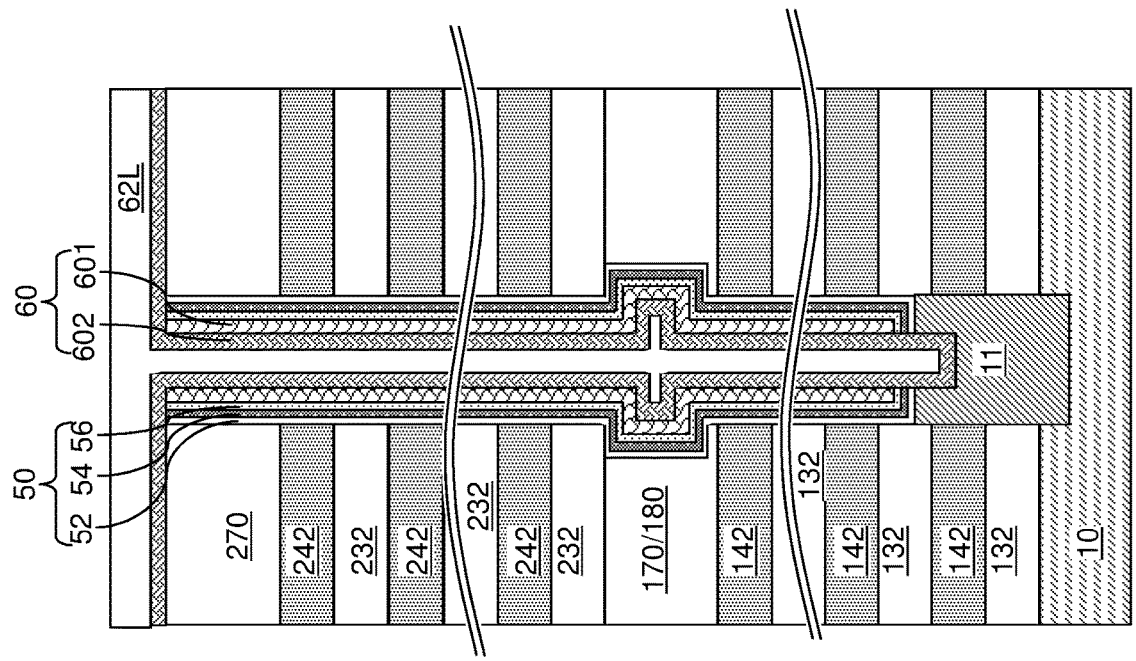
Figure 9E:
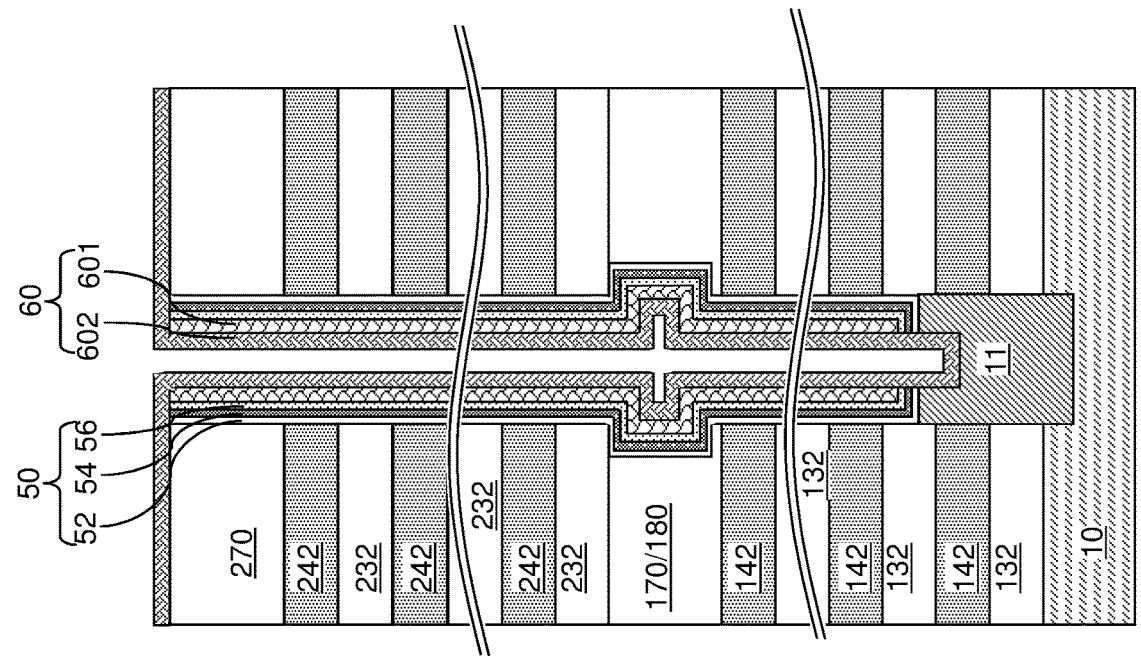

Referring to FIG. 9E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 9F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 9G:
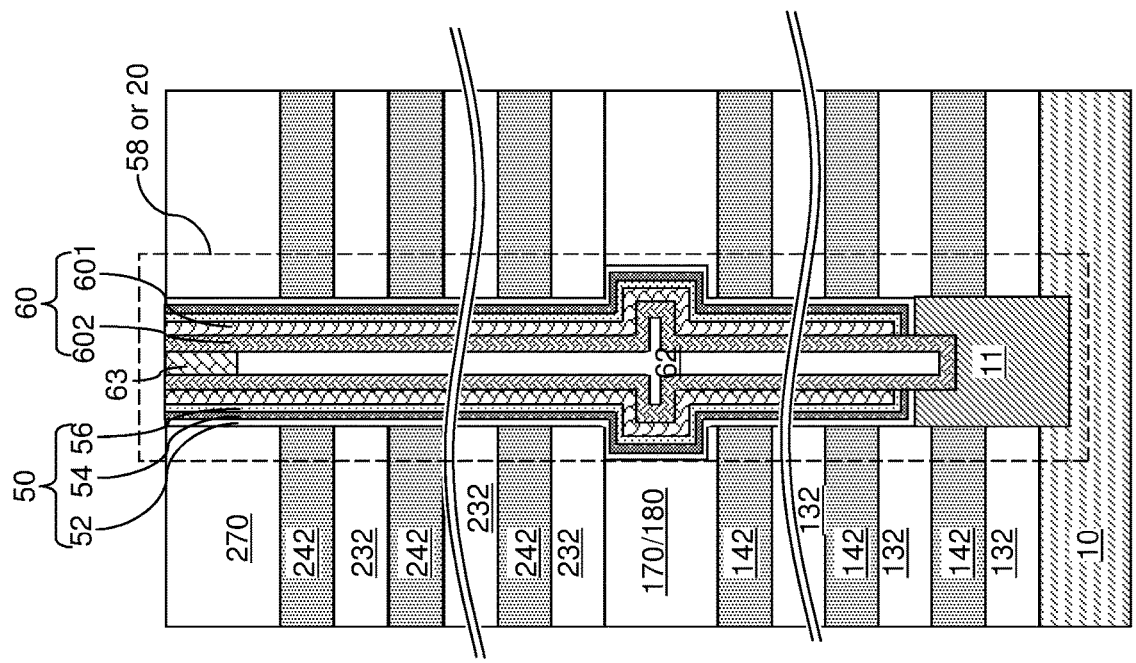

Referring to FIG. 9G, the horizontal portion of the dielectric core layer 62L can be removed, for example, by a recess etch from above the top surface of the second insulating cap layer 270. Each remaining portion of the dielectric core layer 62L constitutes a dielectric core 62. Further, the horizontal portion of the second semiconductor channel layer 602 located above the top surface of the second insulating cap layer 270 can be removed by a planarization process, which can employ a recess etch or chemical mechanical planarization (CMP). Each remaining portion of the second semiconductor channel layer 602 can be located entirety within a memory opening 49 or entirely within a support opening (119, 219).

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 9H:
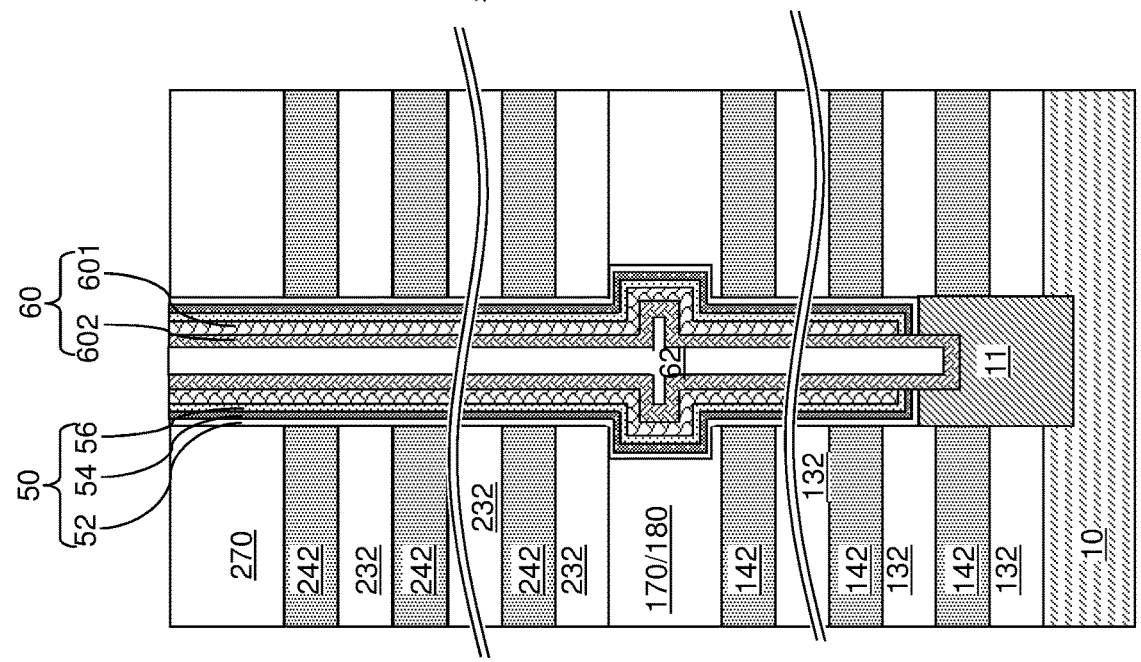

Referring to FIG. 9H, the top surface of each dielectric core 62 can be further recessed within each memory opening, for example, by a recess etch to a depth that is located between the top surface of the second insulating cap layer 270 and the bottom surface of the second insulating cap layer 270. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the second insulating cap layer 270, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 constitutes a memory opening fill structure 58. Each combination of a pedestal channel portion 11 (if present), a memory film 50, a vertical semiconductor channel 60, a dielectric core 62, and a drain region 63 within each support opening (119, 219) fills the respective support openings (119, 219), and constitutes a support pillar structure 20.

The first-tier structure (132, 142, 170, 165), the second-tier structure (232, 242, 270, 265), the inter-tier dielectric layer 180, the memory opening fill structures 58, and the support pillar structures 20 collectively constitute a memory-level assembly. The memory-level assembly is formed over the planar semiconductor material layer 10 such that the planar semiconductor material layer 10 includes horizontal semiconductor channels electrically connected to vertical semiconductor channels 60 within the memory stack structures 55.

Figure 10A:
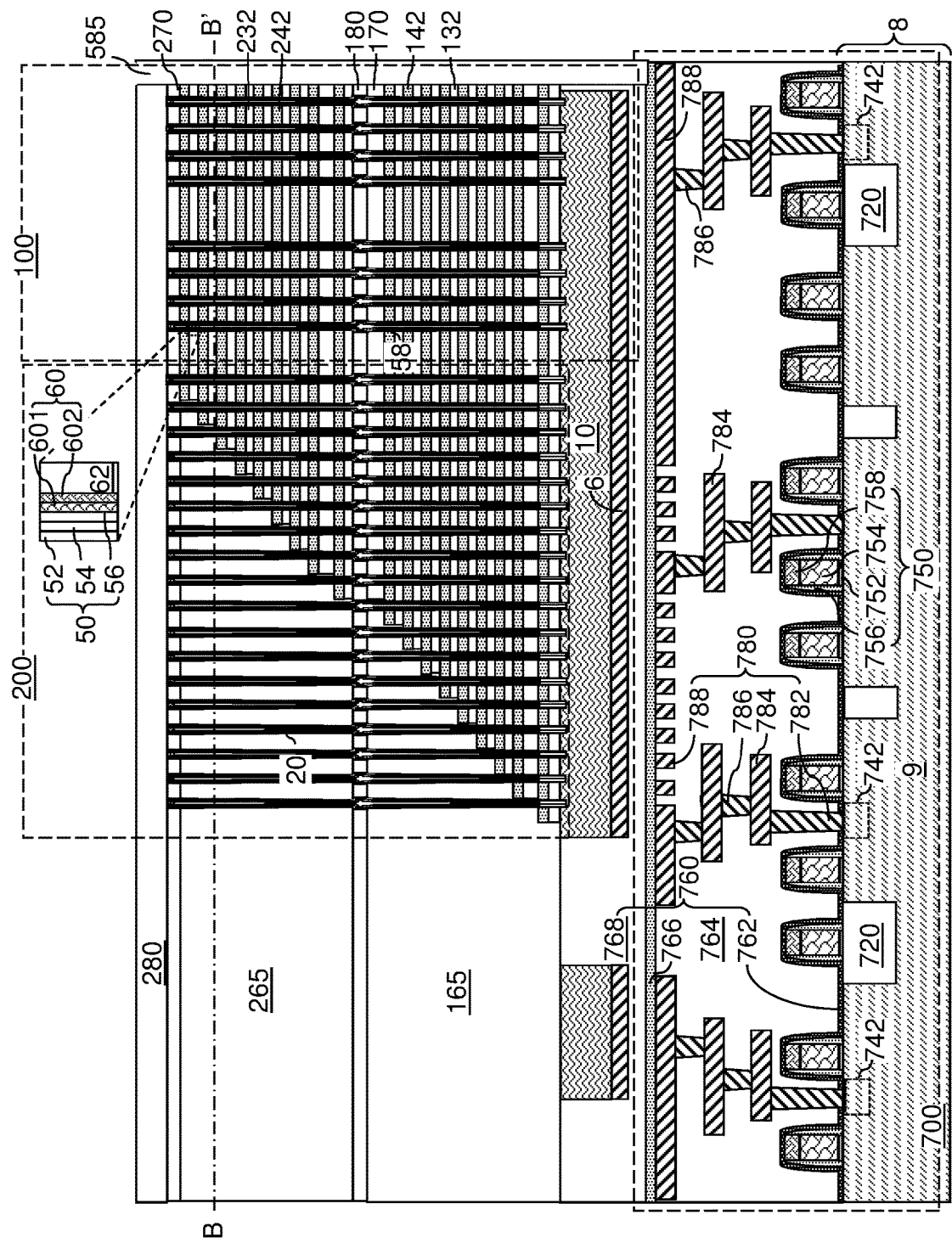
FIG. 10A is a vertical cross-sectional view of the first exemplary structure after formation of first through-memory-level via cavities according to the first embodiment of the present disclosure.
Figure 10B:
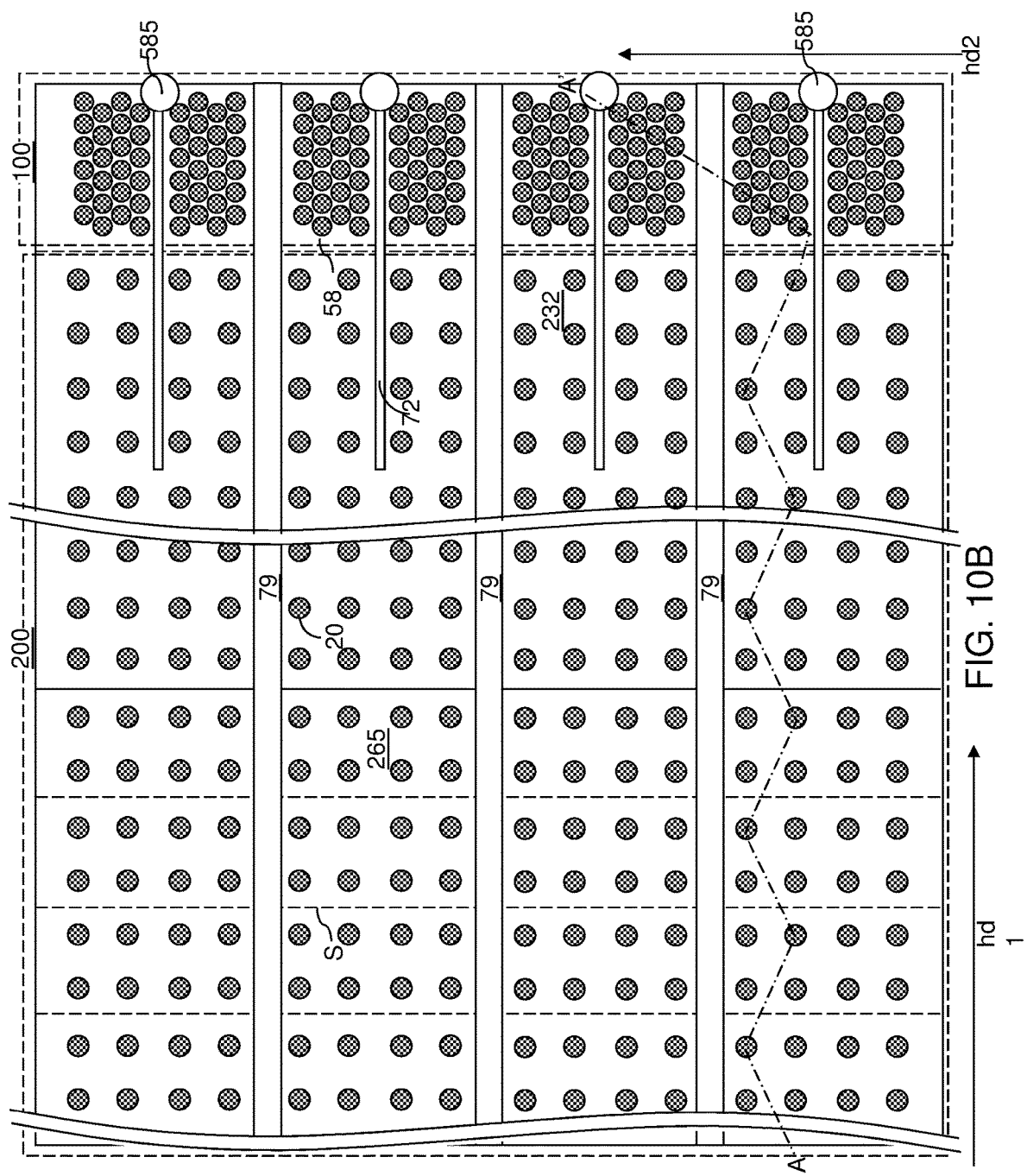
FIG. 10B is a horizontal cross-sectional view of the first exemplary structure along the horizontal plane B-B' in FIG. 10A. The zig-zag vertical plane A-A' corresponds to the plane of the vertical cross-sectional view of FIG. 10A.

Referring to FIGS. 10A and 10B, a first contact level dielectric layer 280 can be formed over the memory-level assembly. The first contact level dielectric layer 280 is formed at a contact level through which various contact via structures are subsequently formed to the drain regions 63 and the various electrically conductive layers that replaces the sacrificial material layers (142, 242) in subsequent processing steps.

Figure 11:
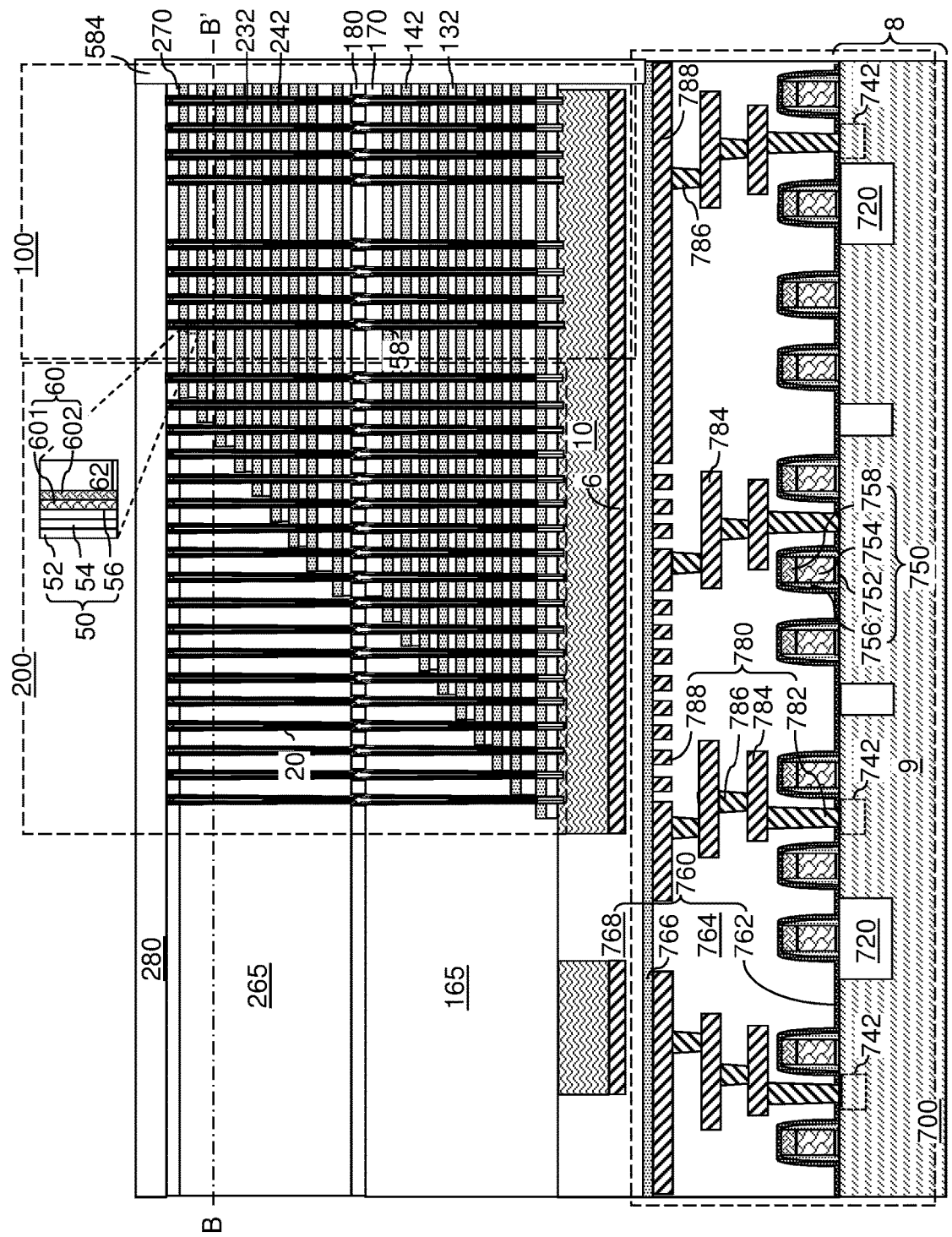
FIG. 11 is a vertical cross-sectional view of the first exemplary structure after formation of through-memory-level insulating material portion according to the first embodiment of the present disclosure.

Referring to FIG. 11, through-memory-level openings can be formed with the memory array region 100, for example, by applying and patterning of a photoresist layer to form openings therein, and by anisotropically etching the portions of the first contact level dielectric layer 280, the alternating stacks (132, 146, 232, 246), and the at least one second dielectric material layer 768 that underlie the openings in the photoresist layer. In one embodiment, each of the through-memory-level openings can be formed within a respective three-dimensional memory array so that each through-memory-level openings is laterally surrounded by memory opening fill structures 58. In one embodiment, one or more of the through-memory-level openings can be formed through the drain-select-level shallow trench isolation structures 72, as shown in FIG. 10B. However, other locations may also be selected. In one embodiment, the first-through-memory-level via cavities can be formed within areas of openings in the planar semiconductor material layer 10 and the optional planar conductive material layer 6. The bottom surface of each through-memory-level opening can be formed at, or above, the silicon nitride layer 766. In one embodiment, the silicon nitride layer 766 can be employed as an etch stop layer during the anisotropic etch process that forms the through-memory-level openings. In this case, the bottom surface of each through-memory-level opening can be formed at the silicon nitride layer 766, and the silicon nitride layer 766 can be physically exposed at the bottom of each through-memory-level opening.

A dielectric material can be deposited in the through-memory-level openings. The dielectric material can include a silicon-oxide based material such as undoped silicate glass, doped silicate glass, or a flowable oxide material. In one embodiment, the dielectric material can include phosphosilicate glass providing an etch rate in an anisotropic etch process that is comparable to the average etch rate of the first and second silicate glass materials of the retro-stepped dielectric material portions (165, 265). The dielectric material can be deposited by a conformal deposition method such as chemical vapor deposition or spin coating. A void may, or may not, be formed within an unfilled portion of each through-memory-level opening. Excess portion of the deposited dielectric material may be removed from above a horizontal plane including the top surface of the first contact level dielectric layer 280, for example, by chemical mechanical planarization or a recess etch. Each remaining dielectric material portion filling a respective one of the through-memory-level opening constitutes a through-memory-level insulating material portion 584. The through-memory-level insulating material portions 584 contact sidewalls of the alternating stacks (132, 146, 232, 246), and may contact the silicon nitride layer 766.

Figure 12A:
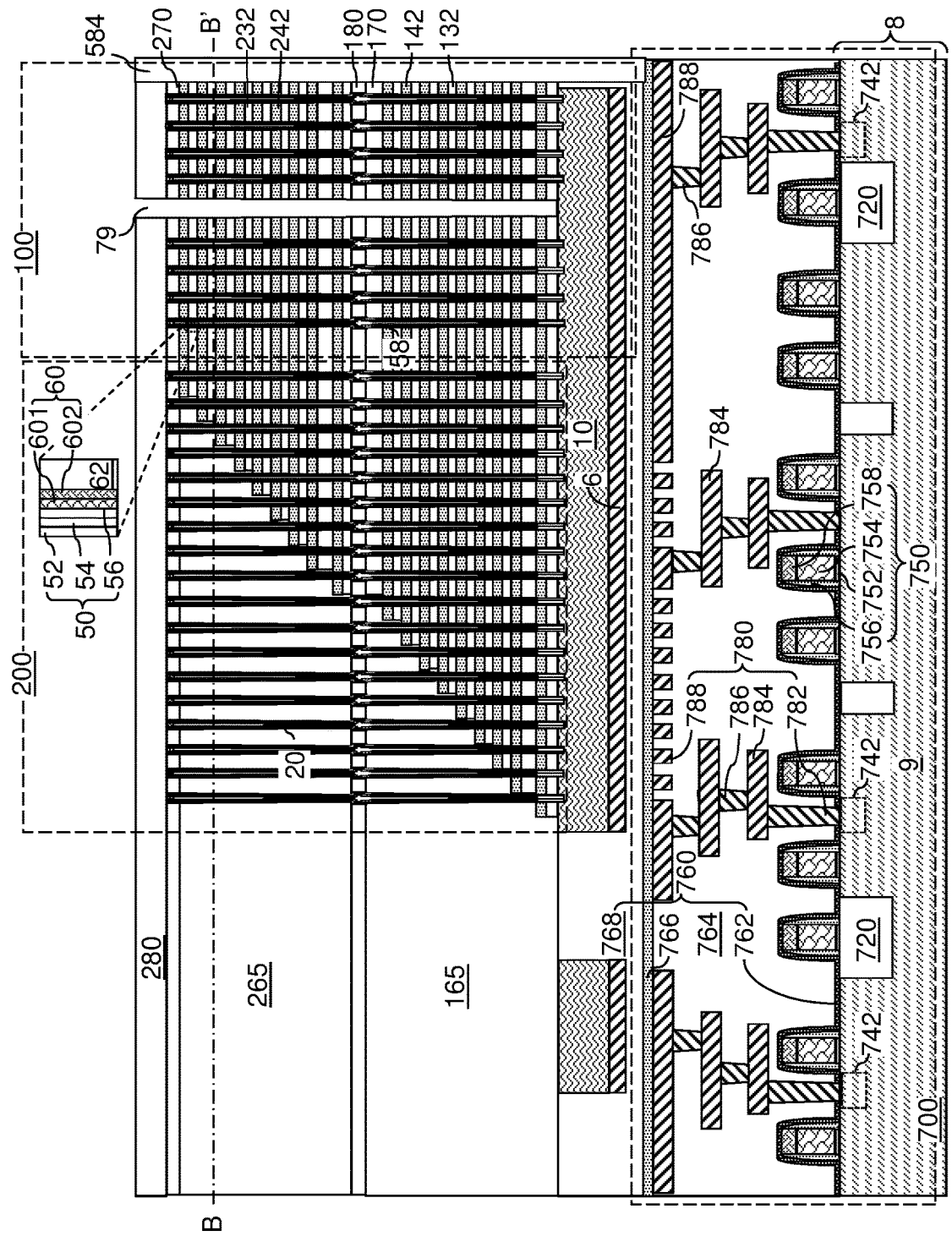
FIG. 12A is a vertical cross-sectional view of the first exemplary structure after formation of backside contact trenches according to the first embodiment of the present disclosure.
Figure 12B:
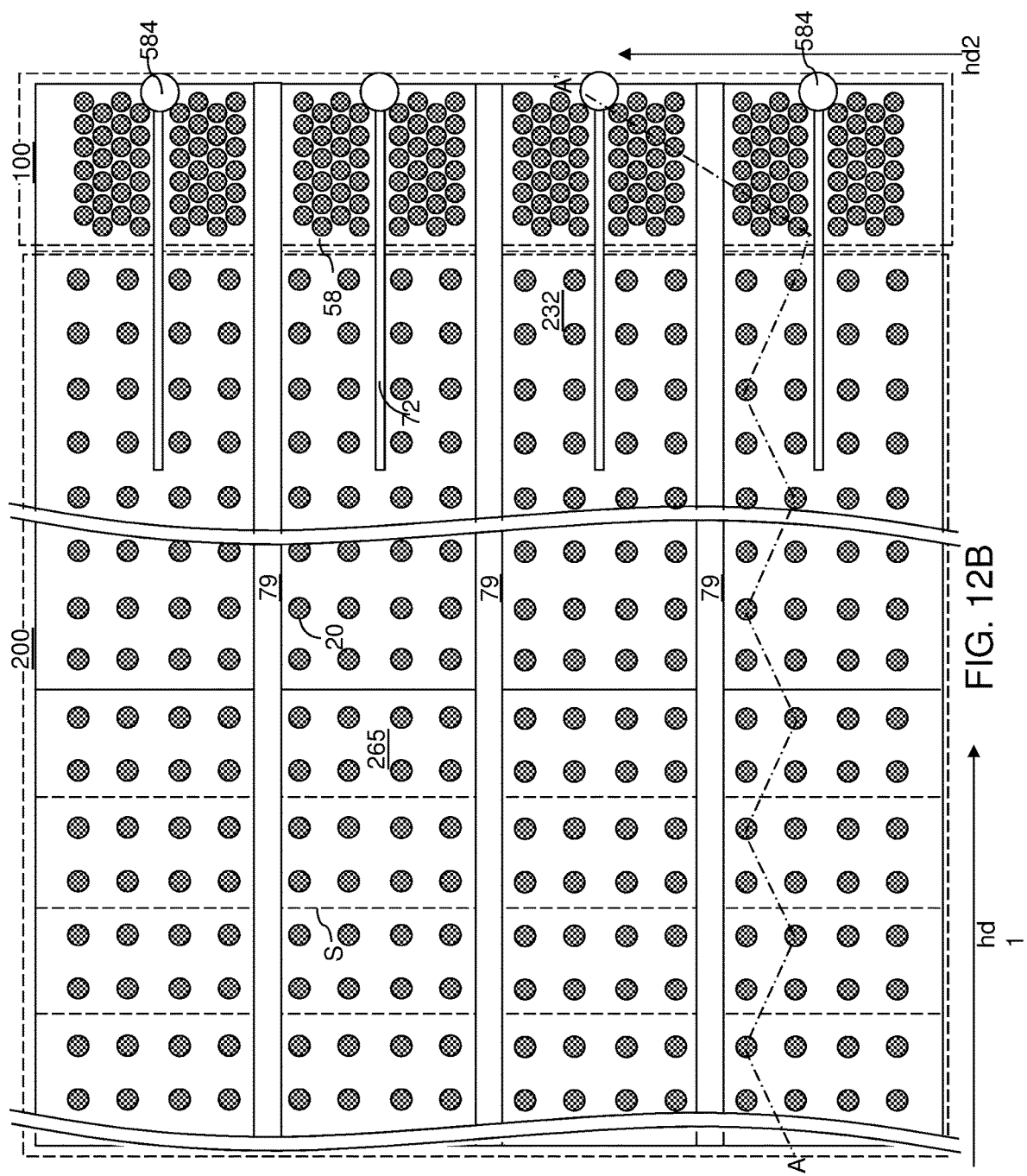
FIG. 12B is a horizontal cross-sectional view of the first exemplary structure along the horizontal plane B-B' in FIG. 12A. The zig-zag vertical plane A-A' corresponds to the plane of the vertical cross-sectional view of FIG. 12A.

Referring to FIGS. 12A and 12B, backside contact trenches 79 are subsequently formed through the first contact level dielectric layer 280 and the memory-level assembly. For example, a photoresist layer can be applied and lithographically patterned over the first contact level dielectric layer 280 to form elongated openings that extend along a first horizontal direction hd1. An anisotropic etch is performed to transfer the pattern in the patterned photoresist layer through the first contact level dielectric layer 280 and the memory-level assembly to a top surface of the planar semiconductor material layer 10. The photoresist layer can be subsequently removed, for example, by ashing.

The backside contact trenches 79 extend along the first horizontal direction hd1, and thus, are elongated along the first horizontal direction hd1. The backside contact trenches 79 can be laterally spaced among one another along a second horizontal direction hd2, which can be perpendicular to the first horizontal direction hd1. The backside contact trenches 79 can extend through the memory array region (e.g., a memory plane) 100 and the word line contact via region 200. The first subset of the backside contact trenches 79 laterally divides the memory-level assembly (e.g., into memory blocks).

Figure 13A:
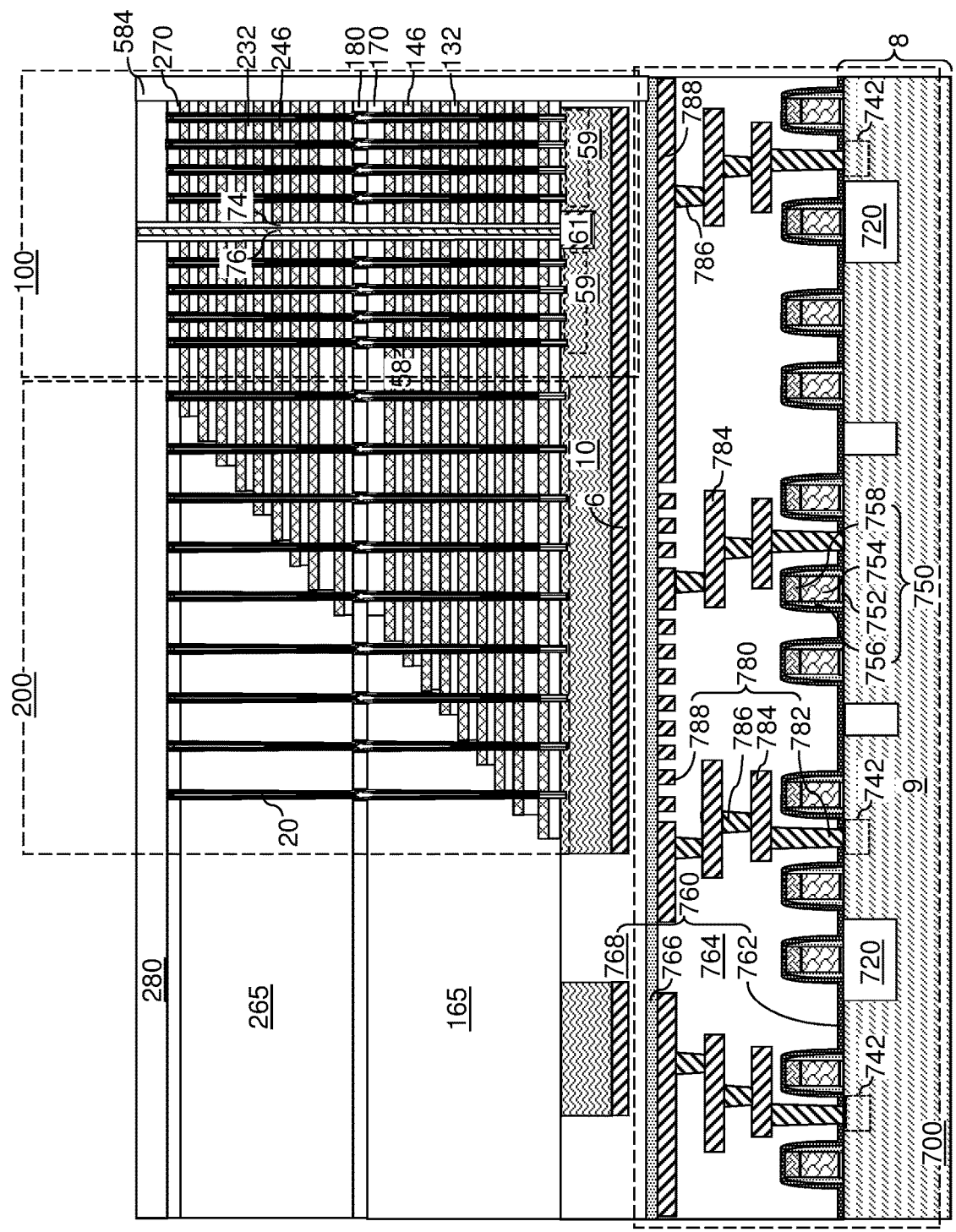
FIG. 13A is a vertical cross-sectional view of the first exemplary structure after replacement of sacrificial material layers with electrically conductive layers and formation of insulating spacers and backside contact via structures according to the first embodiment of the present disclosure.
Figure 13B:
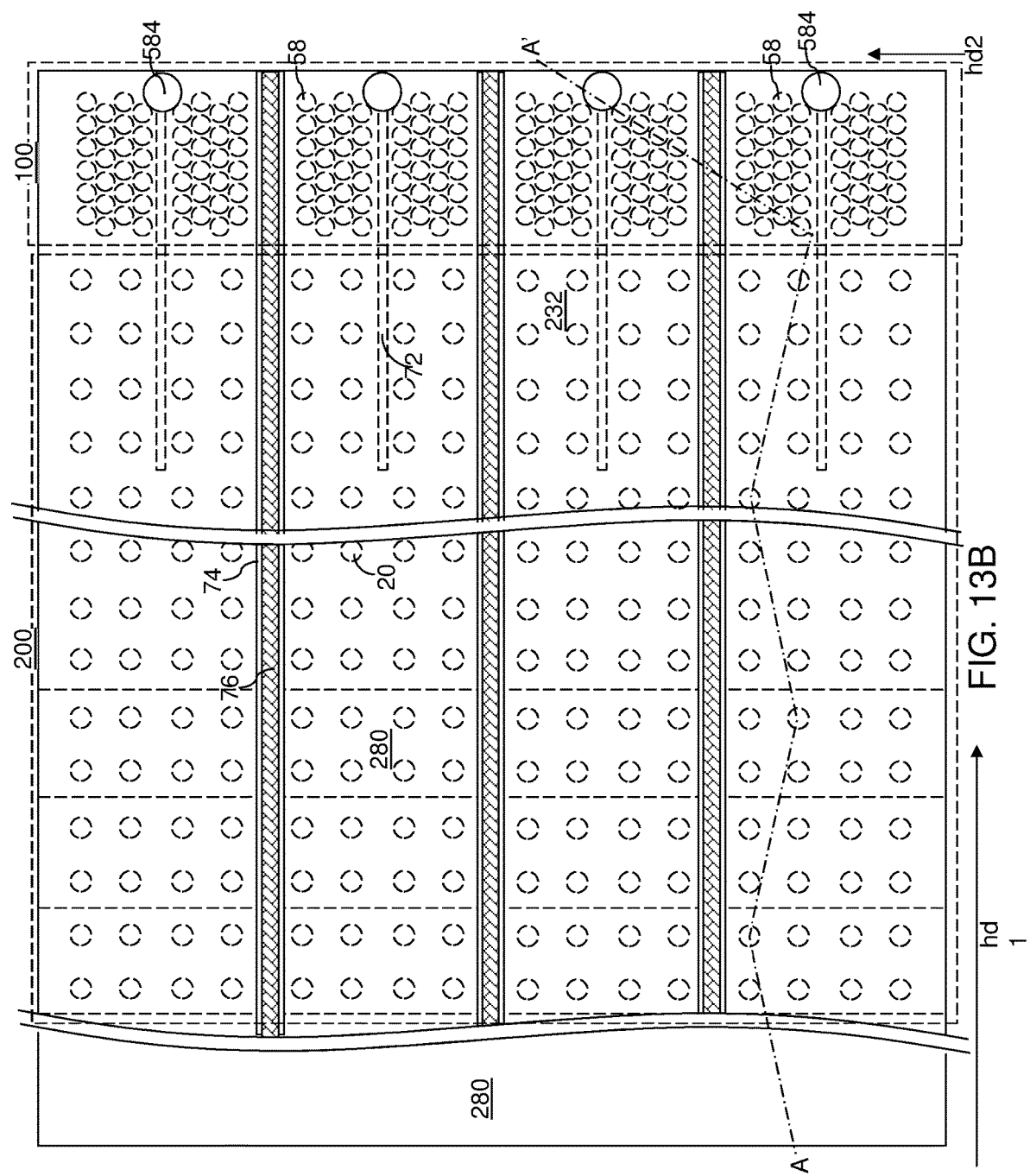
FIG. 13B is a horizontal cross-sectional view of the first exemplary structure along the horizontal plane B-B' in FIG. 13A. The zig-zag vertical plane A-A' corresponds to the plane of the vertical cross-sectional view of FIG. 13A.

Referring to FIGS. 13A and 13B, an etchant that selectively etches the materials of the first and second sacrificial material layers (142, 242) with respect to the materials of the first and second insulating layers (132, 232), the first and second insulating cap layers (170, 270), and the material of the outermost layer of the memory films 50 can be introduced into the backside contact trenches 79, for example, employing an isotropic etch process. First backside recesses are formed in volumes from which the first sacrificial material layers 142 are removed. Second backside recesses are formed in volumes from which the second sacrificial material layers 242 are removed. In one embodiment, the first and second sacrificial material layers (142, 242) can include silicon nitride, and the materials of the first and second insulating layers (132, 232), can be silicon oxide. In another embodiment, the first and second sacrificial material layers (142, 242) can include a semiconductor material such as germanium or a silicon-germanium alloy, and the materials of the first and second insulating layers (132, 232) can be selected from silicon oxide and silicon nitride.

The isotropic etch process can be a wet etch process employing a wet etch solution, or can be a gas phase (dry) etch process in which the etchant is introduced in a vapor phase into the backside contact trench 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HCl) may be employed.

Each of the first and second backside recesses can be a laterally extending cavity having a lateral dimension that is greater than the vertical extent of the cavity. In other words, the lateral dimension of each of the first and second backside recesses can be greater than the height of the respective backside recess. A plurality of first backside recesses can be formed in the volumes from which the material of the first sacrificial material layers 142 is removed. A plurality of second backside recesses can be formed in the volumes from which the material of the second sacrificial material layers 242 is removed. Each of the first and second backside recesses can extend substantially parallel to the top surface of the substrate 9. A backside recess can be vertically bounded by a top surface of an underlying insulating layer (132 or 232) and a bottom surface of an overlying insulating layer (132 or 232). In one embodiment, each of the first and second backside recesses can have a uniform height throughout.

In one embodiment, a sidewall surface of each pedestal channel portion 11 can be physically exposed at each bottommost first backside recess after removal of the first and second sacrificial material layers (142, 242). Further, a top surface of the planar semiconductor material layer 10 can be physically exposed at the bottom of each backside contact trench 79. An annular dielectric spacer (not shown) can be formed around each pedestal channel portion 11 by oxidation of a physically exposed peripheral portion of the pedestal channel portions 11. Further, a semiconductor oxide portion (not shown) can be formed from each physically exposed surface portion of the planar semiconductor material layer 10 concurrently with formation of the annular dielectric spacers.

A backside blocking dielectric layer (not shown) can be optionally deposited in the backside recesses and the backside contact trenches 79 and over the first contact level dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses, on the sidewalls of the backside contact trench 79, and over the first contact level dielectric layer 280. The at least one conductive material can include at least one metallic material, i.e., an electrically conductive material that includes at least one metallic element.

A plurality of first electrically conductive layers 146 can be formed in the plurality of first backside recesses, a plurality of second electrically conductive layers 246 can be formed in the plurality of second backside recesses, and a continuous metallic material layer (not shown) can be formed on the sidewalls of each backside contact trench 79 and over the first contact level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside contact trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

Residual conductive material can be removed from inside the backside contact trenches 79. Specifically, the deposited metallic material of the continuous metallic material layer can be etched back from the sidewalls of each backside contact trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level shallow trench isolation structures 72 constitutes drain select gate electrodes. A subset of the first electrically conductive layers 146 located at each level of the annular dielectric spacers (not shown) constitutes source select gate electrodes. A subset of the electrically conductive layer (146, 246) located between the drain select gate electrodes and the source select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Dopants of a second conductivity type, which is the opposite of the first conductivity type of the planar semiconductor material layer 10, can be implanted into a surface portion of the planar semiconductor material layer 10 to form a source region 61 underneath the bottom surface of each backside contact trench 79. An insulating spacer 74 including a dielectric material can be formed at the periphery of each backside contact trench 79, for example, by deposition of a conformal insulating material (such as silicon oxide) and a subsequent anisotropic etch. The first contact level dielectric layer 280 may be thinned due to a collateral etch during the anisotropic etch that removes the vertical portions of horizontal portions of the deposited conformal insulating material.

A conformal insulating material layer can be deposited in the backside contact trenches 79, and can be anisotropically etched to form insulating spacers 74. The insulating spacers 74 include an insulating material such as silicon oxide, silicon nitride, and/or a dielectric metal oxide. A cavity laterally extending along the first horizontal direction hd1 is present within each insulating spacer 74.

A backside contact via structure can be formed in the remaining volume of each backside contact trench 79, for example, by deposition of at least one conductive material and removal of excess portions of the deposited at least one conductive material from above a horizontal plane including the top surface of the first contact level dielectric layer 280 by a planarization process such as chemical mechanical planarization or a recess etch. The backside contact via structures are electrically insulated in all lateral directions, and are laterally elongated along the first horizontal direction hd1. As such, the backside contact via structures are herein referred to as laterally-elongated contact via structures 76. As used herein, a structure is "laterally elongated" if the maximum lateral dimension of the structure along a first horizontal direction is greater than the maximum lateral dimension of the structure along a second horizontal direction that is perpendicular to the first horizontal direction at least by a factor of 5.

Optionally, each laterally-elongated contact via structure 76 may include multiple backside contact via portions such as a lower backside contact via portion and an upper backside contact via portion. In an illustrative example, the lower backside contact via portion can include a doped semiconductor material (such as doped polysilicon), and can be formed by depositing the doped semiconductor material layer to fill the backside contact trenches 79 and removing the deposited doped semiconductor material from upper portions of the backside contact trenches 79. The upper backside contact via portion can include at least one metallic material (such as a combination of a TiN liner and a W fill material), and can be formed by depositing the at least one metallic material above the lower backside contact via portions, and removing an excess portion of the at least one metallic material from above the horizontal plane including the top surface of the first contact level dielectric layer 280. The first contact level dielectric layer 280 can be thinned and removed during a latter part of the planarization process, which may employ chemical mechanical planarization (CMP), a recess etch, or a combination thereof. Each laterally-elongated contact via structure 76 can be formed through the memory-level assembly and on a respective source region 61. The top surface of each laterally-elongated contact via structure 76 can located above a horizontal plane including the top surfaces of the memory stack structures 55.

Figure 14A:
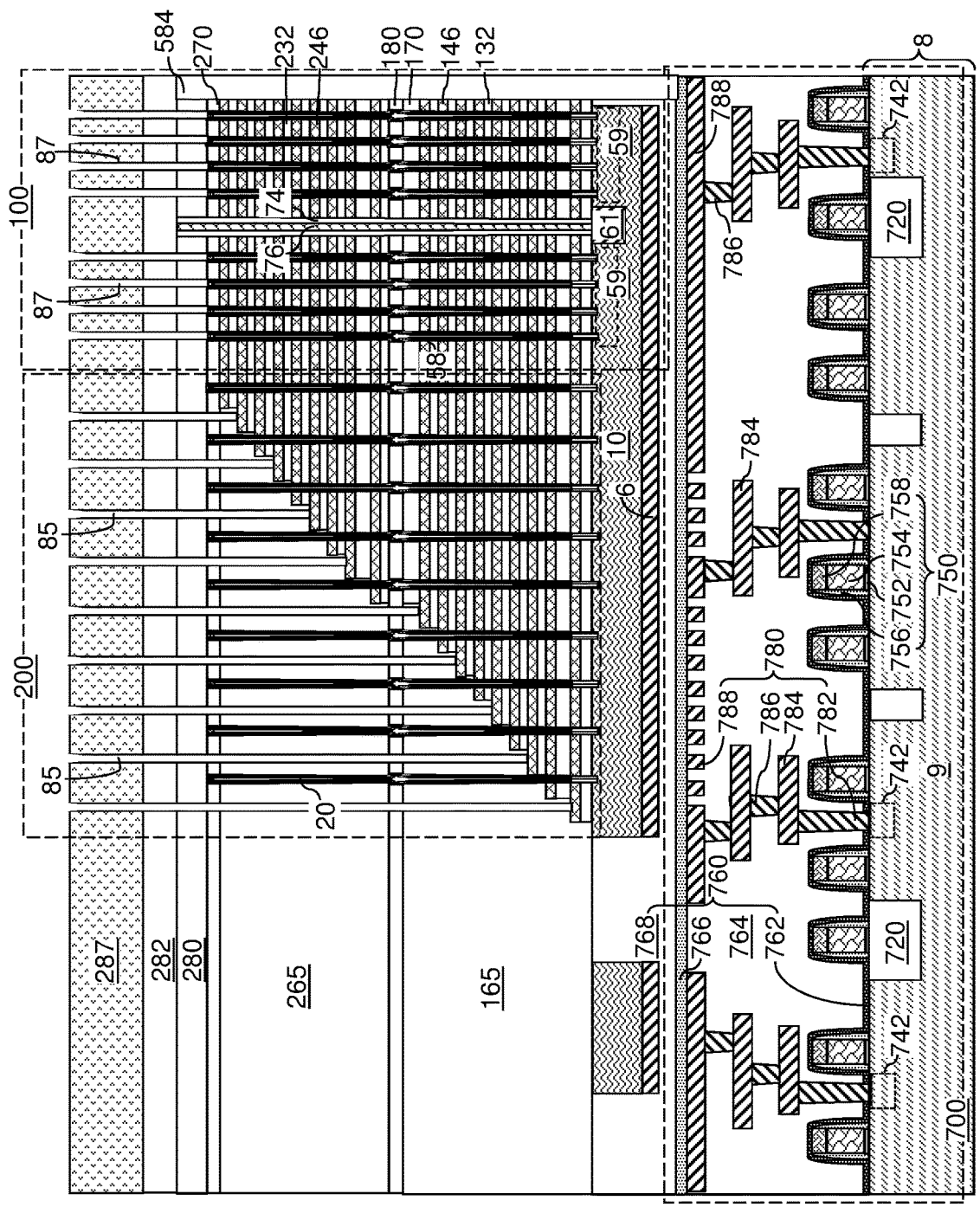
FIG. 14A is a vertical cross-sectional view of the first exemplary structure after formation of drain contact via cavities and word line contact via cavities according to the first embodiment of the present disclosure.
Figure 14B:
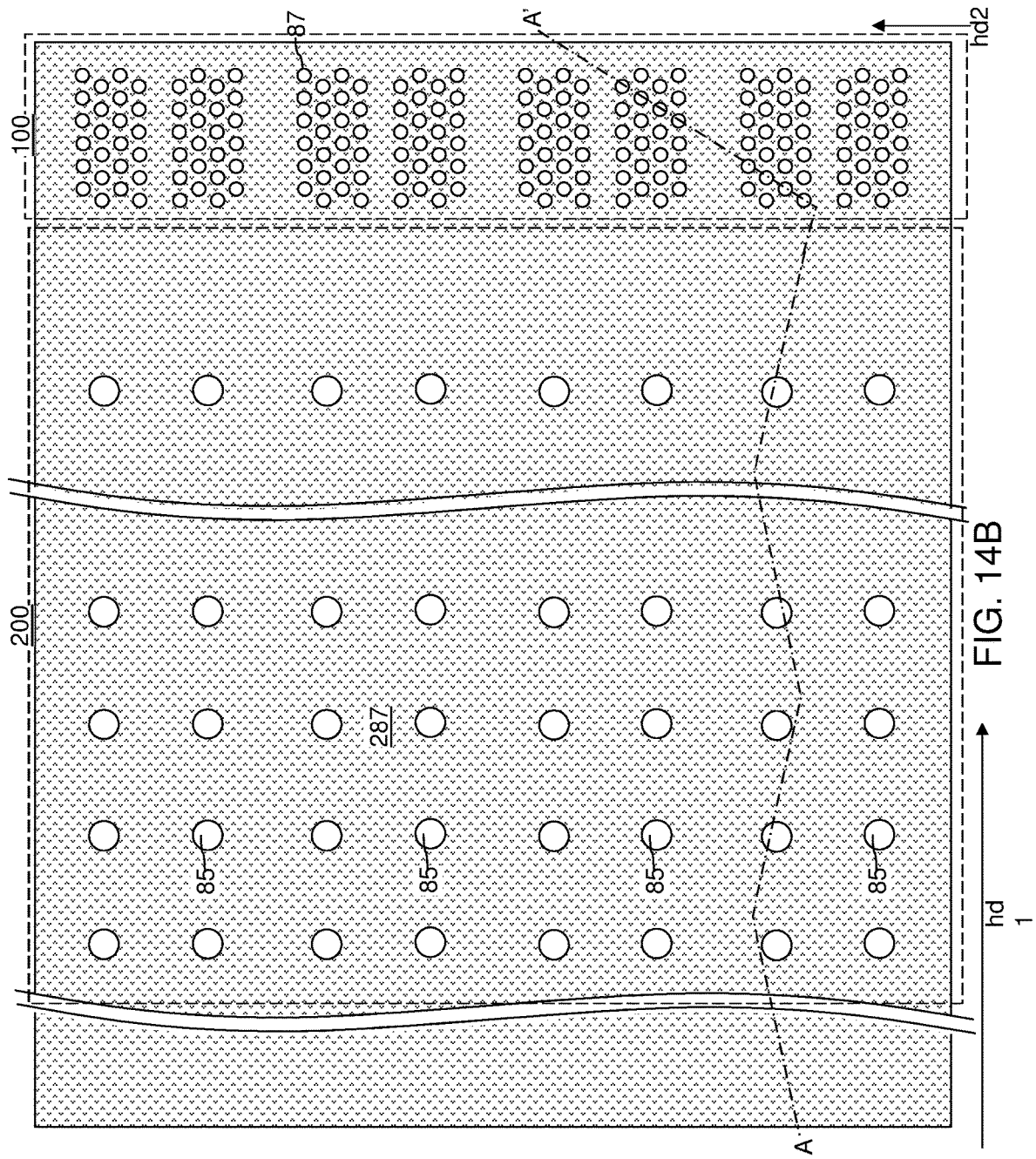
FIG. 14B is a horizontal cross-sectional view of the first exemplary structure along the horizontal plane B-B' in FIG. 14A. The zig-zag vertical plane A-A' corresponds to the plane of the vertical cross-sectional view of FIG. 14A.

Referring to FIGS. 14A and 14B, a second contact level dielectric layer 282 can be optionally formed over the first contact level dielectric layer 280. The second contact level dielectric layer 282 includes a dielectric material such as silicon oxide or silicon nitride. The thickness of the second contact level dielectric layer 282 can be in a range from 30 nm to 300 nm, although lesser and greater thicknesses can also be employed.

A photoresist layer 287 can be applied over the second contact level dielectric layer 282, and can be lithographically patterned to form openings at locations at which various contact via structures are to be subsequently formed. The openings in the photoresist layer 287 include word line contact openings that overlie horizontal surfaces of the first and second stepped surfaces in the contact region 200. Further, the openings in the photoresist layer 287 include drain contact openings that overlie top surfaces of the memory stack structures 55.

A reactive ion etch process is performed to transfer the pattern of the openings in the photoresist layer 287 through underlying dielectric material layers. Contact via cavities (85, 87) are formed through underlying dielectric material portions (182, 180, 270, 265, 165). The contact via cavities (85, 87) include drain contact via cavities 87 that are formed through the second contact level dielectric layer 282, the first contact level dielectric layer 280, and the second insulating cap layer 270 above top surfaces of the drain regions 63 within the memory stack structures 55. Top surfaces of the drain regions 63 are physically exposed at the bottom of the drain contact via cavities 87. The contact via cavities (85, 87) further include word line contact via cavities 85 that are formed through the second contact level dielectric layer 282, the first contact level dielectric layer 280, the second insulating cap layer 270, and the second and first retro-stepped dielectric material portions (165, 265) by the anisotropic etch process. Top surfaces of the first and second electrically conductive layers (146, 246) are physically exposed at bottom regions of the word line contact via cavities 85.

The reactive ion etch process can employ an etch chemistry that provides a higher average etch rate through the first retro-stepped dielectric material portion 165 than through the second retro-stepped dielectric material portion 265. Specifically, the etch chemistry is selected such that the etch rate increases with the molar concentration of $P_2O_5$ in the first and second retro-stepped dielectric material portion (165, 265). For example, the reactive ion etch process can employ an etch chemistry selected from $CHF_3/O_2$, $CF_4/H_2$, or $CF_4/O_2$. In this case, the etch rate of the silicate glass materials of the first and second retro-stepped dielectric material portion (165, 265) is high at location in which the local molar concentration of $P_2O_5$ is high, and is low at locations in which the local molar concentration of $P_2O_5$ is low.

As discussed above, the average $P_2O_5$ concentration in the first retro-stepped dielectric material portion 165 is higher than the average $P_2O_5$ concentration in the second retro-stepped dielectric material portion 265. Thus, the duration of the anisotropic etch process for extending the word line contact via cavities 85 through portion 165 is less than the duration of the anisotropic etch process for extending the word line cavities 85 through portion 265. The shorter etch time through the lower tier than through the upper tier reduces the over etch time for word line contact via cavities 85 that extend to the second electrically conductive layers 246, and especially for the second electrically conductive layers 246 that are near the topmost region of the second alternating stack (232, 246). By reducing the overetch time for the word line contact via cavities 85 that extend to the second electrically conductive layers 246, the likelihood of etching through any second electrically conductive layer 246, reaching an underlying second electrically conductive layer 246 and inducing electrical shorts is decreased. Likewise, the increased etch rate through the second retro-stepped dielectric material portion 265 in the lower tier also decreases the likelihood of the word line contact via cavities 85 not reaching the respective first electrically conductive layers 146 and creating an open circuit. The photoresist layer 287 can be subsequently removed, for example, by ashing.

Figure 15A:
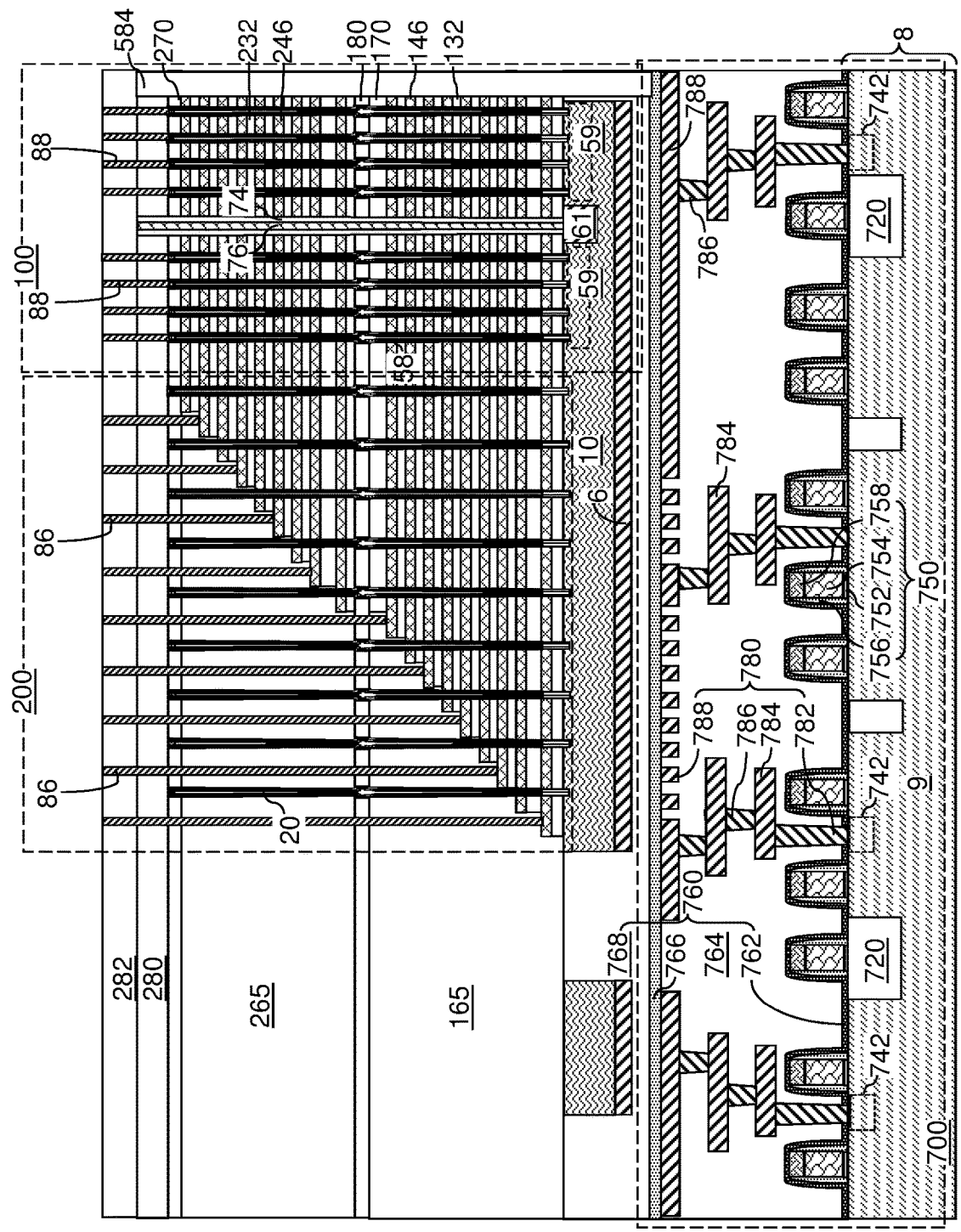
FIG. 15A is a vertical cross-sectional view of the first exemplary structure after formation of drain contact via structures and word line contact via structures according to the first embodiment of the present disclosure.
Figure 15B:
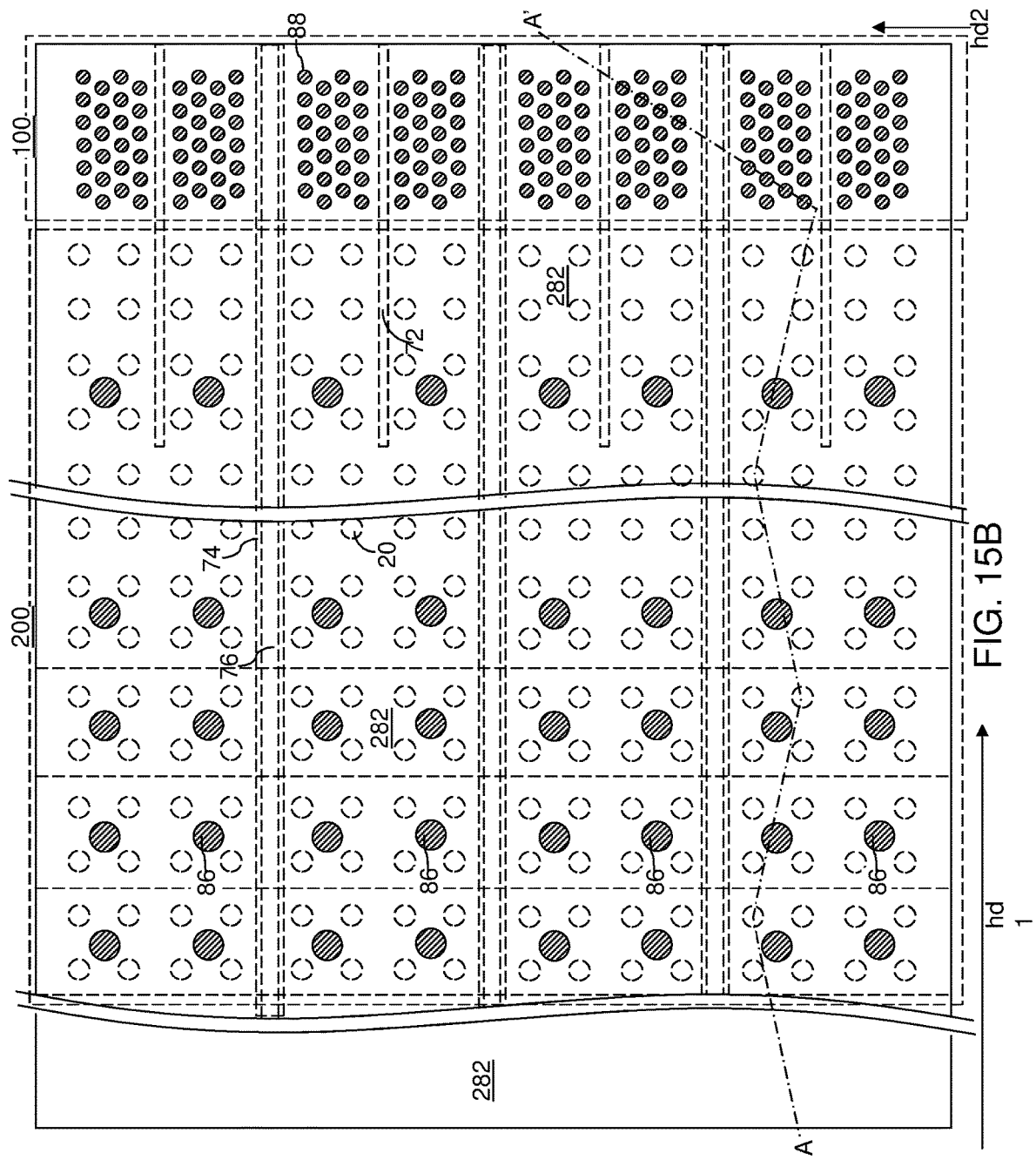
FIG. 15B is a horizontal cross-sectional view of the first exemplary structure along the horizontal plane B-B' in FIG. 15A. The zig-zag vertical plane A-A' corresponds to the plane of the vertical cross-sectional view of FIG. 15A.

Referring to FIGS. 15A and 15B, at least one conductive material can be deposited in the contact via cavities (85, 87). Excess portions of the at least one conductive material can be removed from above a horizontal plane including the top surface of the second contact level dielectric layer 282 by a planarization process such as a recess etch process or a chemical mechanical planarization (CMP) process. Each remaining portion of the at least one conductive material in the word line contact via cavities 85 constitutes a word line contact via structure 86, and each remaining portion of the at least one conductive material in the drain contact via cavities 87 constitutes a drain contact via structure 88.

First contact via structures 86 within a first subset of the word line contact via structures 86 vertically extend through the second retro-stepped dielectric material portion 265 and the first retro-stepped dielectric material portion 165 and contact a top surface of a respective one of the first electrically conductive layers 146. Second contact via structures 86 within a second subset of the word line contact via structures 86 vertically extend through the second retro-stepped dielectric material portion 265 and contact a top surface of a respective one of the second electrically conductive layers 246.

Figure 16:
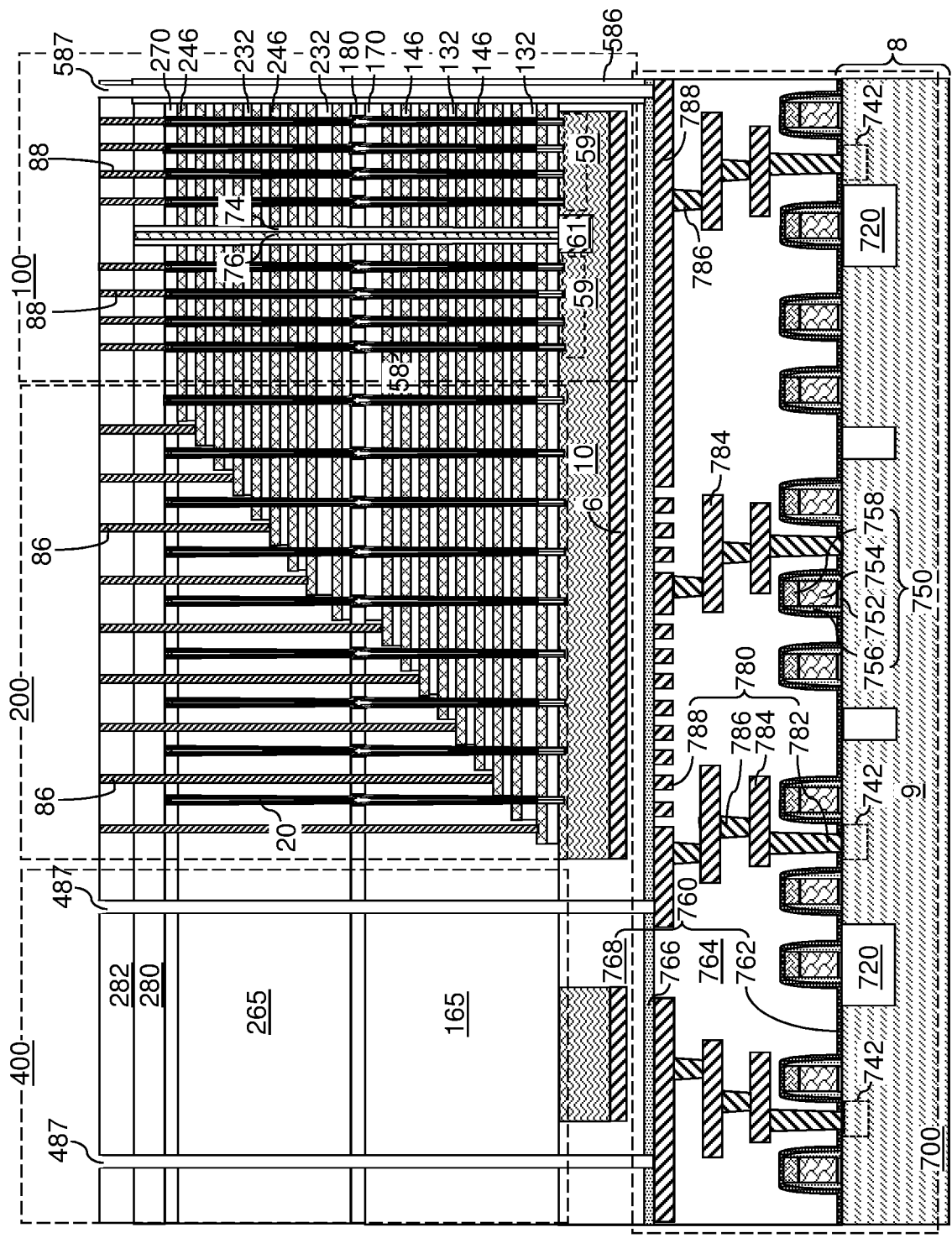
FIG. 16 is a vertical cross-sectional view of the first exemplary structure after formation of through-memory-level via cavities and through-memory-level via cavities according to the first embodiment of the present disclosure.

Referring to FIG. 16, a photoresist layer (not shown) can be applied over the second contact level dielectric layer 282, and can be lithographically patterned to form openings that overlie the through-memory-level insulating material portions 584 in the memory array region 100 and additional openings in regions in which layers of the alternating stacks (132, 146, 232, 246) are absent. For example, the additional openings can be formed in a peripheral region 400 located outside the memory array region 100 and the contact region 200. For example, the peripheral region 400 may surround memory array region 100 and/or the contact region 200, and/or may be located on one or more sides of the memory array region 100 and/or the contact region 200. In one embodiment, the areas of the openings in the memory array region 100 may be entirely within the areas of the through-memory-level insulating material portions 584. In one embodiment, the areas of the openings outside the areas of the memory array region 100 and the contact region 200 (e.g., the areas of the openings in the peripheral region 400) may be within areas of openings in the planar semiconductor material layer 10 and the optional planar conductive material layer 6.

Through-memory-level via cavities (487, 587) are formed by an anisotropic etch process that transfers the pattern of the openings in the photoresist layer to the top surfaces of the topmost lower metal line structures 788. Specifically, first through-memory-level via cavities 487 can be formed in the peripheral region 400 through the contact level dielectric layers (280, 282), the retro-stepped dielectric material portions (165, 265), the at least one second dielectric material layer 768, and the silicon nitride layer 766 to a top surface of a respective one of the topmost lower metal liner structures 788. In one embodiment, the first through-memory-level via cavities 487 can pass through openings in the planar semiconductor material layer 10 and the optional planar conductive material layer 6.

Further, second through-memory-level via cavities 587 are formed through the through-memory-level insulating material portions 584 such that a remaining portion of each through-memory-level insulating material portion 584 after formation of the second through-memory-level via cavities 587 constitutes a through-memory-level insulating spacer 586. In one embodiment, the second through-memory-level via cavities 587 can be formed employing an anisotropic etch process that includes a first etch step that etches the dielectric material of the through-memory-level insulating material portions 584 selective to silicon nitride, and a second etch step that etches a physically exposed portion of the silicon nitride layer 766. The first etch step employs the silicon nitride layer 766 as an etch stop layer. Thus, the second through-memory-level via cavities 587 are etched through the insulating material (e.g., silicon oxide) of the through-memory-level insulating material portions 584, rather than through the electrically conductive layers (e.g., tungsten and/or titanium nitride layers) (146, 246). Etching silicon oxide of portions 584 is easier than etching refractory metal and/or refractory metal nitride layers (146, 246). Furthermore, etching the opening through the alternating stack of insulating layers (132, 232) such as silicon oxide, and sacrificial material layers (142, 242) such as silicon nitride before forming the electrically conductive layers (146, 246) easier than etching the opening through the electrically conductive layers (146, 246). Thus, by forming and filling the openings with an insulating material (e.g., with portions 584) before replacing the sacrificial material layers with the electrically conductive layers makes it easier to subsequently form the second through-memory-level via cavities 587 through the insulating material after replacing the sacrificial material layers with the electrically conductive layers, instead of etching the second through-memory-level via cavities 587 through the electrically conductive layers.

Each through-memory-level insulating spacer 586 can have a substantially cylindrical shape. Depending on the lithographic alignment of the pattern of the openings in the photoresist layer and the through-memory-level insulating material portions 584, the second through-memory-level via cavities 587 may, or may not, have a lateral offset from the geometrical center of a respective one of the through-memory-level insulating material portion 584. Thus, the through-memory-level insulating spacers 586 may, or may not, have a uniform thickness around the vertical axis passing through the geometrical center thereof as a function of an azimuthal angle. In other words, the through-memory-level insulating spacers 586 may have the same thickness irrespective of the azimuthal angle in the case of perfect lithographic alignment, or may have an azimuthally-varying thickness that is measured between the inner sidewall and the outer sidewall of a respective through-memory-level insulating spacer 586. The second through-memory-level via cavities 587 are formed through the silicon nitride layer 766. A top surface of a lower metal line structure (such as a topmost lower metal liner structure 788) can be physically exposed at the bottom of each second through-memory-level via cavity 587.

The first through-memory-level via cavities 487 can be formed concurrently with formation of the second through-memory-level via cavities 587 employing a same photolithography and anisotropic etch processes. The photoresist layer can be removed, for example, by ashing.

Figure 17A:
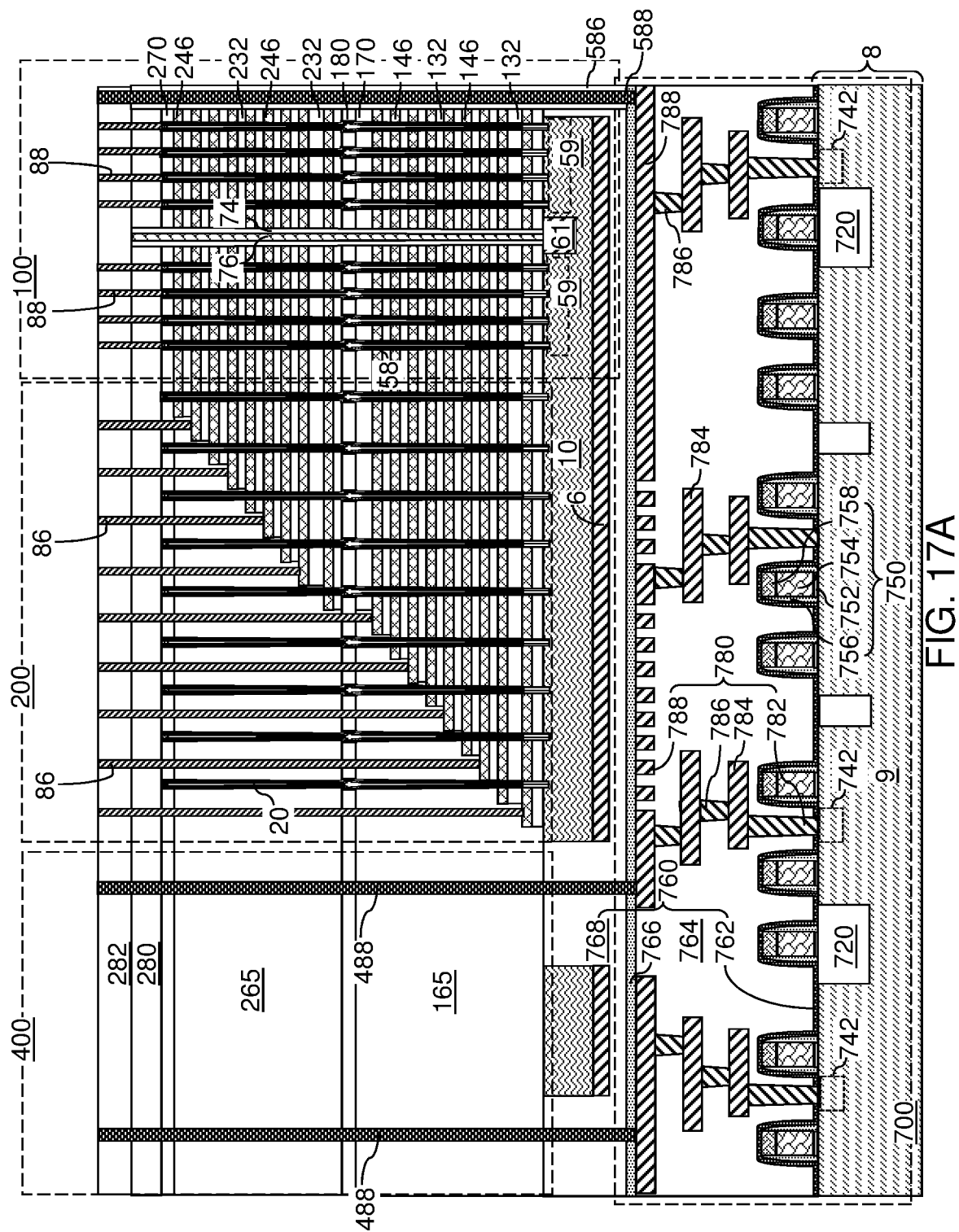
FIG. 17A is a vertical cross-sectional view of the first exemplary structure after formation of through-memory-level contact via structures and through-memory-level contact via structures according to the first embodiment of the present disclosure.
Figure 17B:
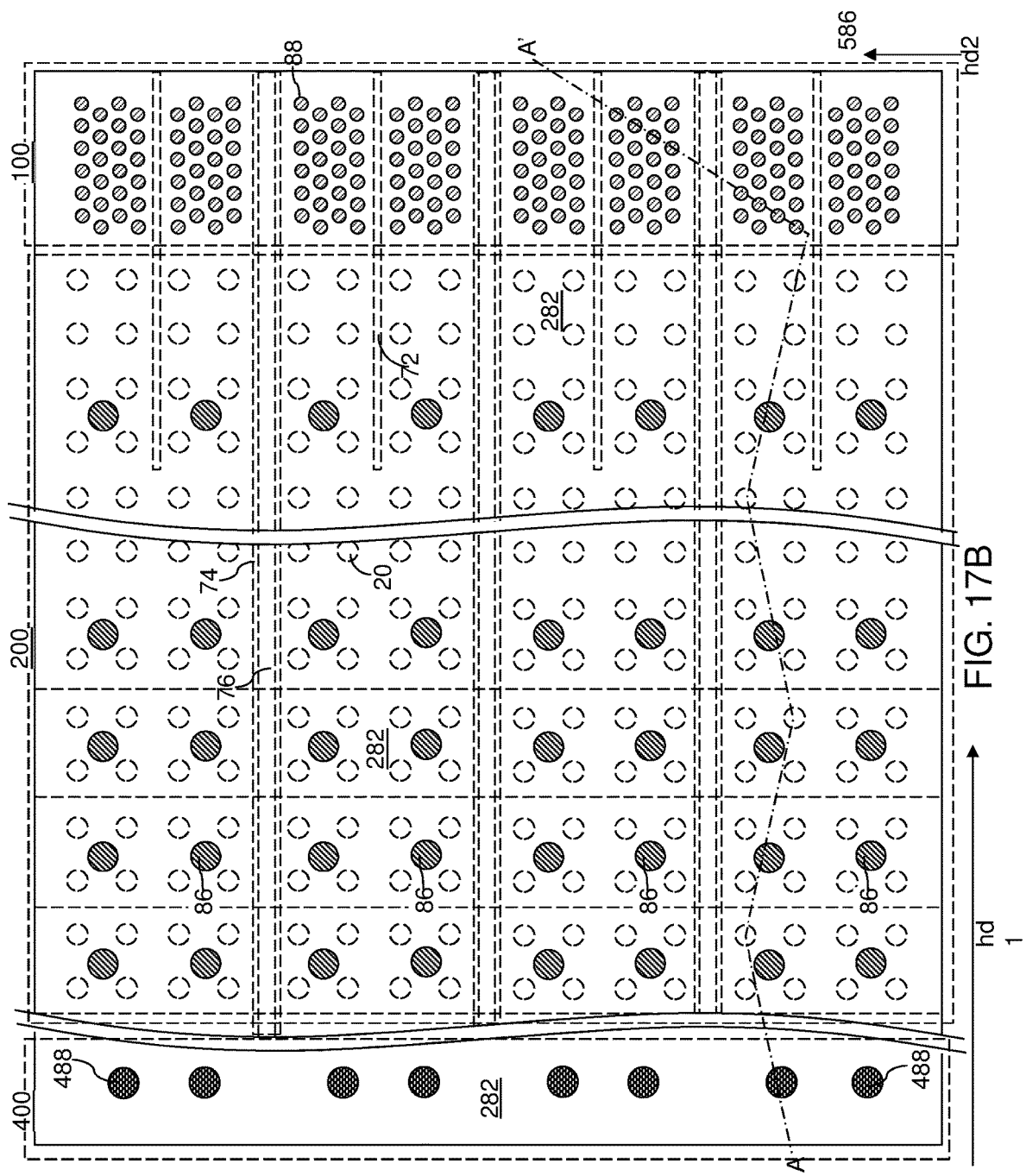
FIG. 17B is a horizontal cross-sectional view of the first exemplary structure along the horizontal plane B-B' in FIG. 17A. The zig-zag vertical plane A-A' corresponds to the plane of the vertical cross-sectional view of FIG. 17A.

Referring to FIGS. 17A and 17B, at least one conductive material can be simultaneously deposited in the second through-memory-level via cavities 587 and the first through-memory-level via cavities 487. The at least one conductive material can include, for example, a metallic nitride liner (such as a TiN liner) and a metal fill material (such as W, Cu, Al, Ru, or Co). Excess portions of the at least one conductive material can be removed from outside the second through-memory-level via cavities 587 and the first through-memory-level via cavities 487. For example, excess portions of the at least one conductive material can be removed from above the top surface of the second contact level dielectric layer 282 by a planarization process such as chemical mechanical planarization and/or a recess etch. Each remaining portion of the at least one conductive material in the first through-memory-level via cavities 487 that contacts a top surface of a respective one of the topmost lower metal line structure 788 constitutes a first through-memory-level contact via structure 488. Each remaining portion of the at least one conductive material in the second through-memory-level via cavities 587 constitutes a second through-memory-level contact via structure 588 that contacts a top surface of a respective one of the topmost lower metal line structure 788. Each second through-memory-level contact via structure 588 can be formed within a respective second through-memory-level via cavity 587 and inside a respective through-memory-level insulating spacer 586. Thus, second through-memory-level contact via structures 588 are formed through the alternating stacks (132, 146, 232, 246), the at least one second dielectric material layer 768, and the silicon nitride layer 766, and directly on a top surface of a lower metal line structure (such as a topmost lower metal line structure 788). In this embodiment, each second through-memory-level contact via structure 588 extends through the second contact level dielectric layer 282 and the silicon nitride layer (i.e., the hydrogen barrier layer) 766, while the respective through-memory-level insulating spacer 586 does not extend through the second contact level dielectric layer 282 and the silicon nitride layer (i.e., the hydrogen barrier layer) 766.

Figure 18:
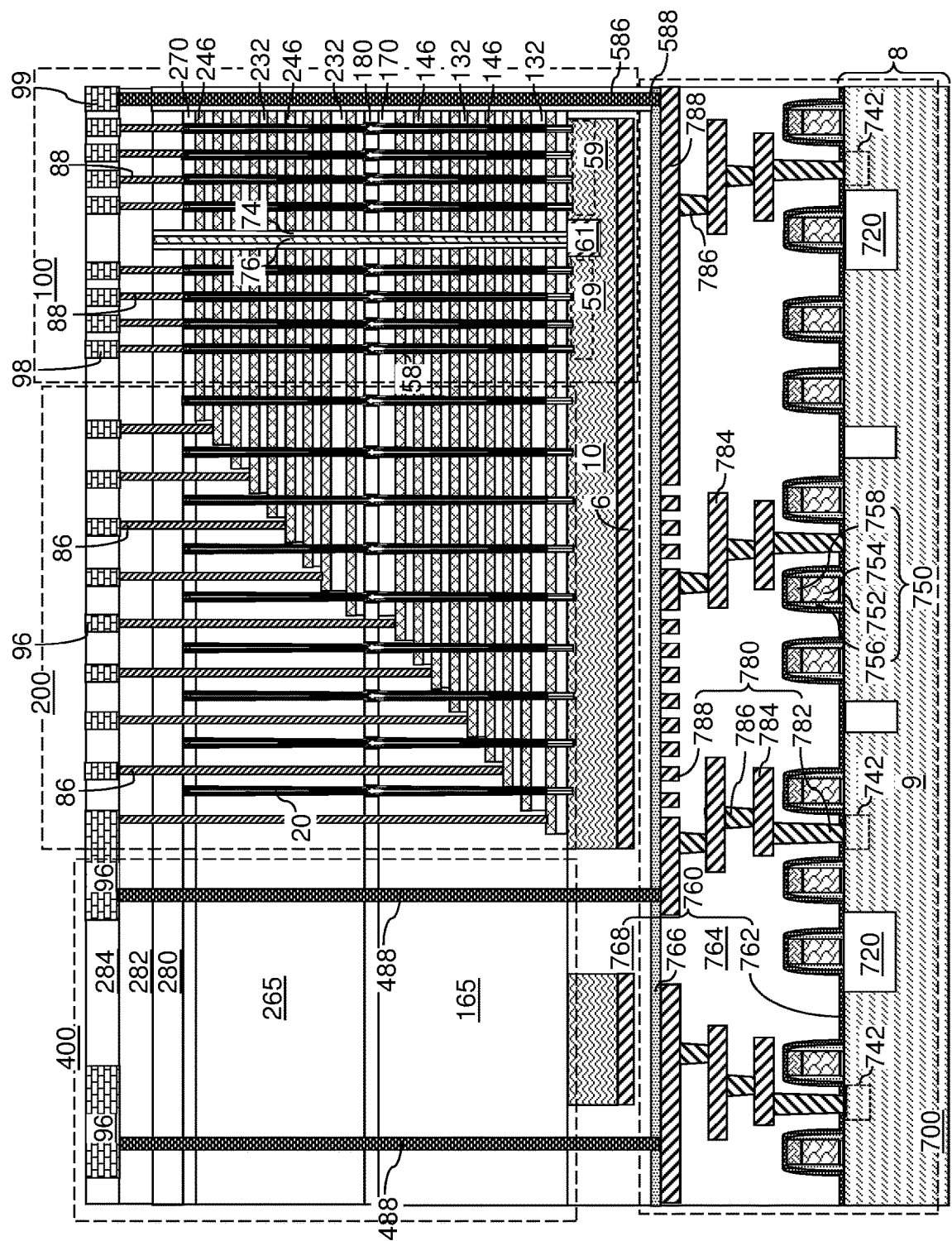
FIG. 18 is a vertical cross-sectional view of the first exemplary structure after formation of upper metal line structures according to the first embodiment of the present disclosure.

Referring to FIG. 18, at least one upper interconnect level dielectric layer 284 can be formed over the contact level dielectric layers (280, 282). Various upper interconnect level metal structures can be formed in the at least one upper interconnect level dielectric layer 284. For example, the various upper interconnect level metal structures can include line level metal interconnect structures (96, 98, 99). The line level metal interconnect structures (96, 98, 99) can include first upper metal line structures 99 that contact a top surfaces of a respective one of the second through-memory-level contact via structures 588, second upper metal line structures 96 that contact a top surface of a respective one of the first through-memory-level contact via structures 488, and bit lines 98 that contact a respective one of the drain contact via structures 88 and extend along the second horizontal direction (e.g., bit line direction) hd2 and perpendicular to the first horizontal direction (e.g., word line direction) hd1. In one embodiment, a subset of the first upper metal line structures 99 may be employed to provide electrical connections through the source connection via structures 91 described above to the laterally-elongated contact via structures 76 and to the source regions 61. In one embodiment, a subset of the second upper metal line structures 96 may contact, or are electrically coupled to, a respective pair of a word line contact via structure 86 and a through-memory-level contact via structure 488.

At least a subset of the upper metal interconnect structures (which include the line level metal interconnect structures (96, 98, 99)) is formed over the three-dimensional memory array. The upper metal interconnect structures comprise an upper metal line structure (such as a first upper metal line structure 99) that is formed directly on a through-memory-level contact via structure 588. A set of conductive structures including the second through-memory-level contact via structure 588 and a lower metal line structure (such as a topmost lower metal line structure 788) provides an electrically conductive path between the at least one semiconductor device 710 on the substrate semiconductor layer and the upper metal line structure. A through-memory-level contact via structure 488 can be provided through the retro-stepped dielectric material portions (165, 265), the at least one second dielectric material layer 768, and the silicon nitride layer 766 and directly on a top surface of another lower metal line structure (e.g., another topmost lower metal line structure 788) of the lower metal interconnect structures 780.

In one embodiment, the semiconductor structure further comprises: a terrace region including stepped surfaces of layers of the alternating stack (132, 232, 146, 246); a retro-stepped dielectric material portion (165 or 265) overlying the stepped surfaces and located at levels of the alternating stack (132, 232, 146, 246) and above the at least one second dielectric material layer 768; and a through-memory-level contact via structure 488 vertically extending through the retro-stepped dielectric material portion (165 or 265), the at least one second dielectric material layer 768, and the silicon nitride layer 766 and contacting a top surface of another lower metal line structure 788 of the lower metal interconnect structures 780. The first through-memory-level contact via structure 488 directly contacts the retro-stepped dielectric material portion (165 or 265) and the at least one second dielectric material layer 768.

Figure 19A:
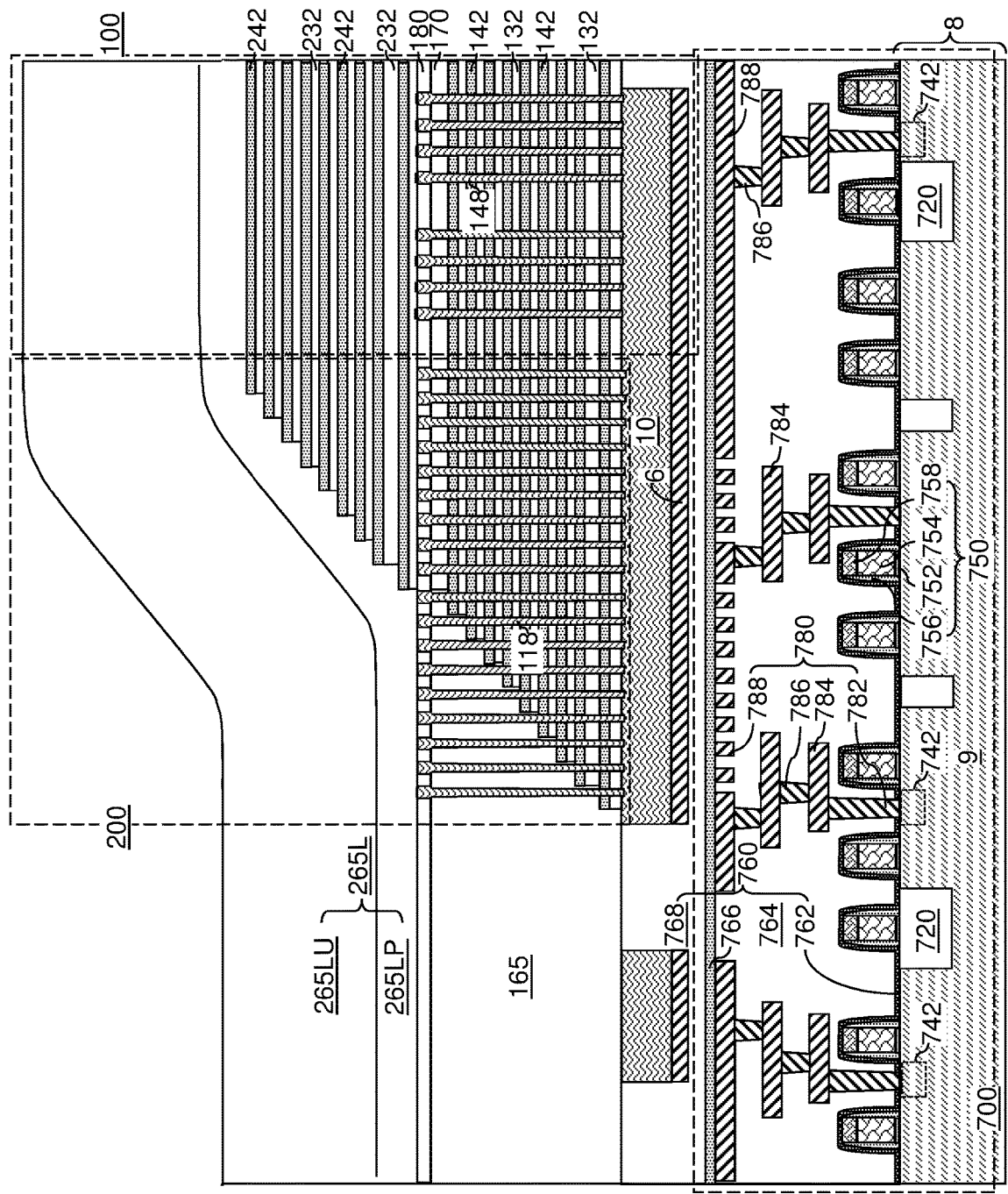
FIGS. 19A and 19B are sequential vertical cross-sectional views of a second exemplary structure during formation of a second-tier retro-stepped dielectric material portion according to a second embodiment of the present disclosure.

Referring to FIG. 19A, a second exemplary structure can be derived from the first exemplary structure of FIG. 6A by depositing an phosphosilicate glass material layer 265LP on the second stepped surfaces of the second alternating stack (232, 242), and subsequently depositing an undoped silicate glass material layer 265LU in the phosphosilicate glass material layer 265LP.

The undoped silicate glass material layer 265LU consists of an undoped silicate glass, and as such, is free of phosphorus, i.e., free of $P_2O_5$. The phosphosilicate glass material layer 265LP can include $P_2O_5$ at a second average $P_2O_5$ molar concentration that is less than the first average $P_2O_5$ molar concentration. In this case, the ratio of the second average $P_2O_5$ molar concentration to the first average $P_2O_5$ molar concentration is less than 0.1. For example, the second average $P_2O_5$ molar concentration can be in a range from 0.001 to 2.0%, such as from 0.01 to 1.0%. The thickness of the undoped silicate glass material layer 265LU can be in a range from 25% to 70% of the thickness of the second alternating stack (232, 242), and the thickness of the phosphosilicate glass material layer 265LP can be in a range from 75% to 25% of the thickness of the second alternating stack (232, 242). The undoped silicate glass material layer 265LU and the phosphosilicate glass material layer 265LP collectively constitute a second silicate glass layer 265L. The materials of the second silicate glass layer 265L are collectively referred to as a second silicate glass material. The second silicate glass layer 265L can contact the second stepped surfaces, and surface regions of the second silicate glass material that contact the second stepped surfaces of the second alternating stack (232, 242) can include $P_2O_5$ at a lower concentration than in the first retro-stepped dielectric material portion 165.

Figure 19B:
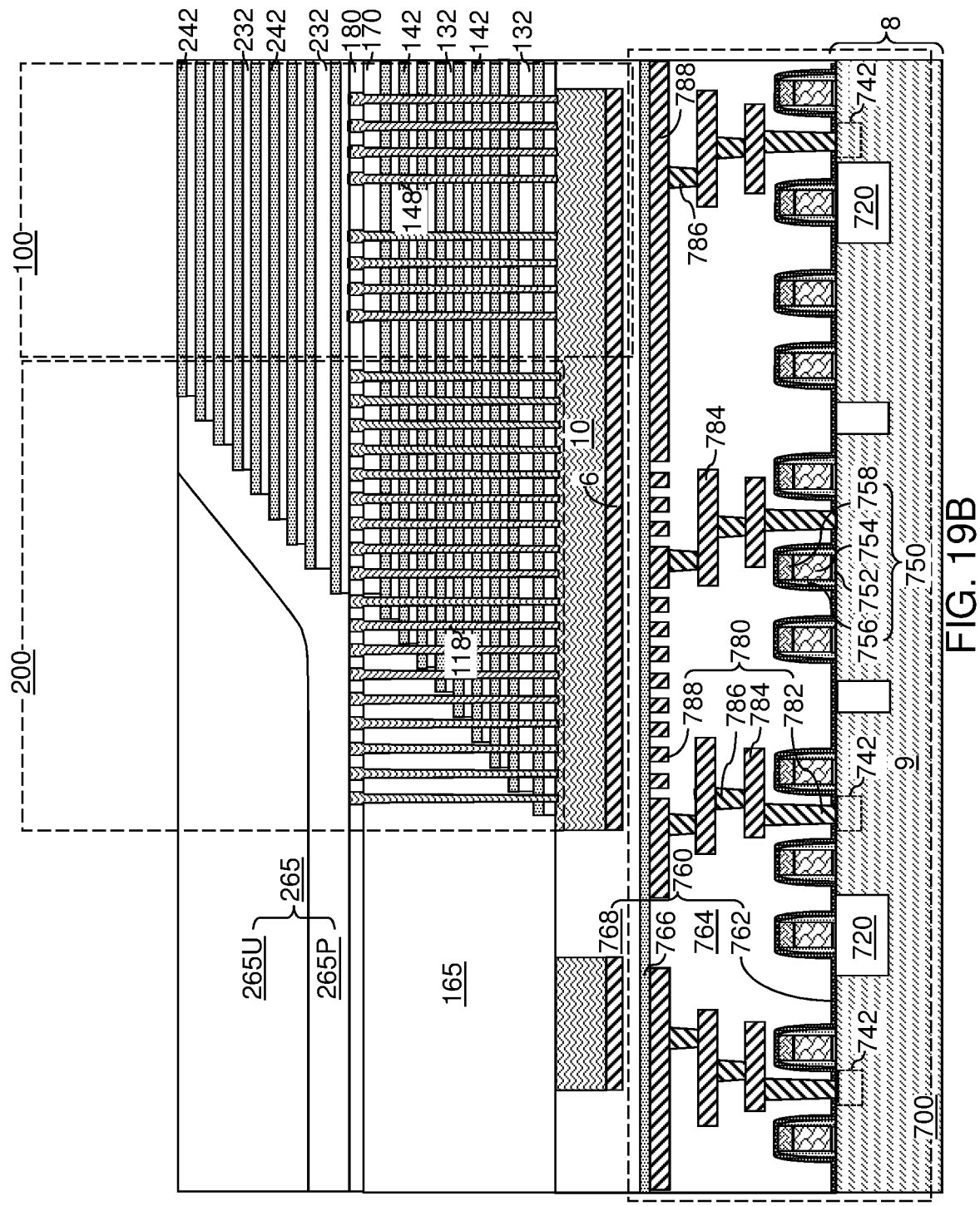

Referring to FIG. 19B, portions of the second silicate glass layer 265L that overlie the second alternating stack (232, 242) can be removed by a planarization process such as a chemical mechanical planarization (CMP) process. Specifically, upper portions of the phosphosilicate glass material layer 265LP and the undoped silicate glass material layer 265LU can be removed from above a horizontal plane located on, or over, a top surface of the second alternating stack (232, 242). A continuous remaining portion of the second silicate glass layer 265L overlying the second stepped surfaces and filling the second stepped cavity is herein referred to as a second retro-stepped dielectric material portion 265, which comprises a vertical stack of the phosphosilicate glass portion 265P and the undoped silicate glass portion 265U. The undoped silicate glass portion 265U is a remaining portion of the undoped silicate glass material layer 265LU, and the phosphosilicate glass portion 265P is a remaining portion of the phosphosilicate glass material layer 265LP.

The second alternating stack (232, 242) and the second retro-stepped dielectric material portion 265 collectively constitute a second-tier structure, which is an in-process structure that is subsequently modified. The second stepped surfaces continuously extend from a bottommost layer within the second alternating stack (232, 242) to a topmost layer within the second alternating stack (232, 242) and contacts vertical surfaces and horizontal bottom surfaces of the second retro-stepped dielectric material portion 265. The second silicate glass material of the second retro-stepped dielectric material portion 265 includes an undoped silicate glass material that is free of phosphorus, and a phosphosilicate glass material including $P_2O_5$ at the second average $P_2O_5$ molar concentration that is less than the first average $P_2O_5$ molar concentration.

In one embodiment, surface regions of the second retro-stepped dielectric material portion 265 that contact the second stepped surfaces of the second alternating stack (232, 242) are regions of the phosphosilicate glass portion 265P. The second retro-stepped dielectric material portion 265 comprises a phosphosilicate glass portion 265P that underlies the undoped silicate glass portion 265U, which has a tapered bottom surface.

The phosphosilicate glass portion 265P may have a uniform phosphorus concentration as a function of its thickness. In another embodiment, the phosphosilicate glass portion 265P can have a graded phosphorus concentration that increases from its top surface to its bottom surface.

Figure 20:
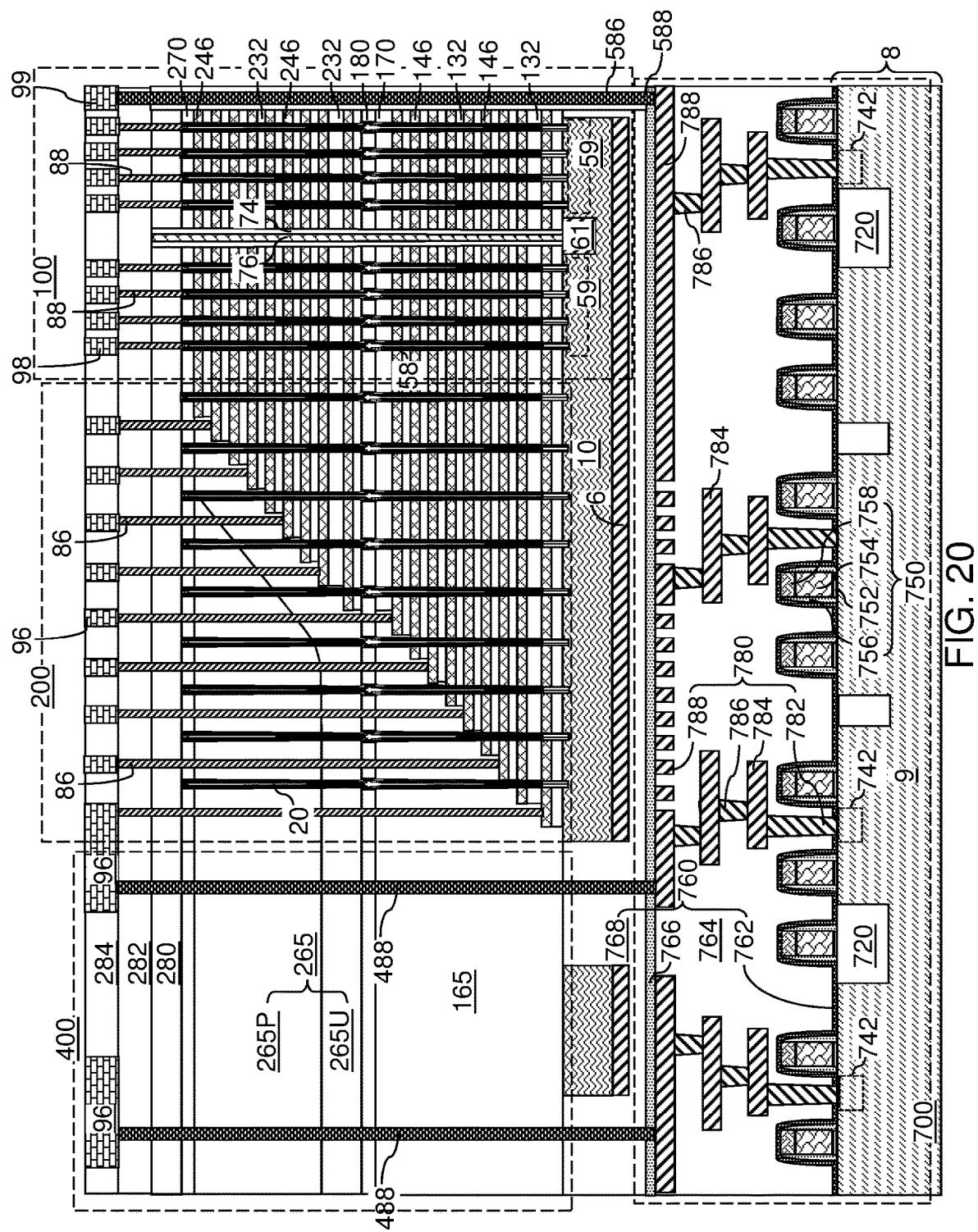
FIG. 20 is a vertical cross-sectional view of the second exemplary structure after formation of upper metal line structures according to the second embodiment of the present disclosure.

Referring to FIG. 20, subsequent processing steps of the first embodiment can be performed to provide the second exemplary structure illustrated in FIG. 20.

According to an aspect of the present disclosure, a three-dimensional memory device is provided, which comprises a first-tier structure located over a substrate 8 and comprising a first alternating stack (132, 146) of first insulating layers 132 and first electrically conductive layers 146 that has first stepped surfaces, and a first retro-stepped dielectric material portion 165 contacting the first stepped surfaces of the first alternating stack, and a second-tier structure located over the first-tier structure and comprising a second alternating stack (232, 246) of second insulating layers 232 and second electrically conductive layers 246 that has second stepped surfaces, and a second retro-stepped dielectric material portion 265 contacting the second stepped surfaces of the second alternating stack. The first retro-stepped dielectric material portion 165 has a higher etch rate than the second retro-stepped dielectric material portion 265. Memory stack structures 55 vertically extend through the first alternating stack and the second alternating stack, wherein each of the memory stack structures comprises a memory film 50 and a vertical semiconductor channel 60.

In one embodiment, the first stepped surfaces continuously extend from a bottommost layer within the first alternating stack (132, 146) to a topmost layer within the first alternating stack (132, 146) and contacts vertical surfaces and horizontal bottom surfaces of the first retro-stepped dielectric material portion 165; and the second stepped surfaces continuously extend from a bottommost layer within the second alternating stack (232, 246) to a topmost layer within the second alternating stack (232, 246) and contacts vertical surfaces and horizontal bottom surfaces of the second retro-stepped dielectric material portion 265.

In one embodiment, the first retro-stepped dielectric material portion 165 comprises a different material than the second retro-stepped dielectric material portion 265. In one embodiment, the first retro-stepped dielectric material portion 165 comprises a first silicate glass material, and the second retro-stepped dielectric material portion 265 comprises a second silicate glass material having a lower phosphorus concentration than the first retro-stepped dielectric material portion.

In one embodiment, the first retro-stepped dielectric material portion 165 comprises a first silicate glass material that includes $SiO_2$ at a first average $SiO_2$ molar concentration in a range from 80% to 99% and $P_2O_5$ at an first average $P_2O_5$ molar concentration in a range from 1% to 20%, and the second retro-stepped dielectric material portion 265 comprises a second silicate glass material that is at least one of free of phosphorus or includes $P_2O_5$ at a second average $P_2O_5$ molar concentration that is less than the first average $P_2O_5$ molar concentration.

In one embodiment, the second silicate glass material comprises an undoped silicate glass material that is free of phosphorus. In another embodiment, the second silicate glass material includes the $P_2O_5$ at the second average $P_2O_5$ molar concentration that is less than the first average $P_2O_5$ molar concentration. The second silicate glass material may include the $P_2O_5$ at a graded molar concentration that decreases with a distance from the second stepped surfaces of the second alternating stack (232, 246). For example, the first average $P_2O_5$ molar concentration may be in a range from 5% to 20% and the second average $P_2O_5$ molar concentration may be in a range from 0.001% to 2%.

In one embodiment, the first retro-stepped dielectric material portion 165 includes $P_2O_5$ at a graded molar concentration that decreases with a distance from the first stepped surfaces of the first alternating stack (132, 146).

In yet another embodiment illustrated in FIG. 20, the second retro-stepped dielectric material portion 265 comprises a first portion 265U that is free of phosphorus and a second portion 265P that includes $P_2O_5$ at the second average $P_2O_5$ molar concentration that is less than the first average $P_2O_5$ molar concentration.

The three-dimensional memory device can further comprise first contact via structures 86 vertically extending through the second retro-stepped dielectric material portion 265 and the first retro-stepped dielectric material portion 165 and contacting a top surface of a respective one of the first electrically conductive layers 146, and second contact via structures 86 vertically extending through the second retro-stepped dielectric material portion 265 and contacting a top surface of a respective one of the second electrically conductive layers 246.

In one embodiment, the memory stack structures 55 can comprise memory elements of a vertical NAND device. The electrically conductive layers (146, 246) can comprise, or can be electrically connected to, a respective word line of the vertical NAND device. The substrate 8 can comprises a silicon substrate. The vertical NAND device can comprise an array of monolithic three-dimensional NAND strings over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising a driver circuit for the memory device located thereon, such as the word line driver circuit and a bit line driver circuit for the memory device. The array of monolithic three-dimensional NAND strings can comprise a plurality of semiconductor channels, wherein at least one end portion (such as a vertical semiconductor channel 60) of each of the plurality of semiconductor channels (59, 11, 60) extends substantially perpendicular to a top surface of the semiconductor substrate 8, a plurality of charge storage elements (as embodied as portions of the memory material layer 54 located at each word line level), each charge storage element located adjacent to a respective one of the plurality of semiconductor channels (59, 11, 60), and a plurality of control gate electrodes (as embodied as a subset of the electrically conductive layers (146, 246) having a strip shape extending substantially parallel to the top surface of the substrate 8 (e.g., along the first horizontal direction hd1), the plurality of control gate electrodes comprise at least a first control gate electrode located in the first device level and a second control gate electrode located in the second device level.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   a first-tier structure located over a substrate and comprising a first alternating stack of first insulating layers and first electrically conductive layers that has first stepped surfaces, and a first retro-stepped dielectric material portion contacting the first stepped surfaces of the first alternating stack;
   a second-tier structure located over the first-tier structure and comprising a second alternating stack of second insulating layers and second electrically conductive layers that has second stepped surfaces, and a second retro-stepped dielectric material portion contacting the second stepped surfaces of the second alternating stack, wherein the first retro-stepped dielectric material portion comprises phosphorus doped first silicate glass material which contains $P_2O_5$ at a first average molar concentration and which has a higher etch rate than the second retro-stepped dielectric material portion, and wherein the second retro-stepped dielectric material portion comprises a second silicate glass material that is at least one of free of phosphorus or includes $P_2O_5$ at a second average $P_2O_5$ molar concentration that is less than the first average $P_2O_5$ molar concentration; and
   memory stack structures vertically extending through the first alternating stack and the second alternating stack, wherein each of the memory stack structures comprises a memory film and a vertical semiconductor channel.

2. The three-dimensional memory device of claim 1, wherein:
the first stepped surfaces continuously extend from a bottommost layer within the first alternating stack to a topmost layer within the first alternating stack and contacts vertical surfaces and horizontal bottom surfaces of the first retro-stepped dielectric material portion; and
the second stepped surfaces continuously extend from a bottommost layer within the second alternating stack to a topmost layer within the second alternating stack and contacts vertical surfaces and horizontal bottom surfaces of the second retro-stepped dielectric material portion.

3. The three-dimensional memory device of claim 1, wherein the first retro-stepped dielectric material portion comprises a different material than the second retro-stepped dielectric material portion.

4. The three-dimensional memory device of claim 1, wherein the first retro-stepped dielectric material portion comprises a first silicate glass material, and the second retro-stepped dielectric material portion comprises a second silicate glass material having a lower phosphorus concentration than the first retro-stepped dielectric material portion.

5. The three-dimensional memory device of claim 1, wherein:
the first silicate glass material includes $SiO_2$ at a first average $SiO_2$ molar concentration in a range from 80% to 99% and $P_2O_5$ at the first average $P_2O_5$ molar concentration in a range from 1% to 20%.

6. The three-dimensional memory device of claim 5, wherein the second silicate glass material comprises an undoped silicate glass material that is free of phosphorus.

7. The three-dimensional memory device of claim 5, wherein the second silicate glass material includes the $P_2O_5$ at the second average $P_2O_5$ molar concentration.

8. The three-dimensional memory device of claim 7, wherein the second silicate glass material includes the $P_2O_5$ at a graded molar concentration that decreases with a distance from the second stepped surfaces of the second alternating stack.

9. The three-dimensional memory device of claim 7, wherein the first average $P_2O_5$ molar concentration is in a range from 5% to 20% and the second average $P_2O_5$ molar concentration is in a range from 0.001% to 2%.

10. The three-dimensional memory device of claim 5, wherein the first silicate glass material includes $P_2O_5$ at the first average $P_2O_5$ molar concentration throughout the first retro-stepped dielectric material portion.

11. The three-dimensional memory device of claim 5, wherein the first retro-stepped dielectric material portion includes $P_2O_5$ at a graded molar concentration that decreases with a distance from the first stepped surfaces of the first alternating stack.

12. The three-dimensional memory device of claim 5, wherein the second retro-stepped dielectric material portion comprises a first portion that is free of phosphorus and a second portion that includes the $P_2O_5$ at the second average $P_2O_5$ molar concentration that is less than the first average $P_2O_5$ molar concentration.

13. The three-dimensional memory device of claim 1, further comprising:
first contact via structures vertically extending through the second retro-stepped dielectric material portion and the first retro-stepped dielectric material portion and contacting a top surface of a respective one of the first electrically conductive layers; and
second contact via structures vertically extending through the second retro-stepped dielectric material portion and contacting a top surface of a respective one of the second electrically conductive layers.

14. The three-dimensional memory device of claim 1, wherein:
the three-dimensional memory device comprises a monolithic three-dimensional NAND memory device;
the first and second electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the first and second electrically conductive layers comprise a plurality of control gate electrodes having a strip shape extending substantially parallel to the top surface of the substrate; and
the array of monolithic three-dimensional NAND strings comprises:
a plurality of semiconductor channels, wherein at least one end portion of each of the plurality of semiconductor channels extends substantially perpendicular to a top surface of the substrate, and
a plurality of charge storage elements embodied as portions of the memory films, each charge storage element located adjacent to a respective one of the plurality of semiconductor channels.

15. The three-dimensional memory device of claim 1, wherein the second retro-stepped dielectric material portion and the first retro-stepped dielectric material portion include via cavities vertically extending therethrough and terminating on top surfaces of the electrically conductive layers.

16. The three-dimensional memory device of claim 15, further comprising contact via structures located within the contact via cavities and contacting the top surfaces of the electrically conductive layers.

* * * * *